(12) United States Patent
Denno

(10) Patent No.: US 6,987,815 B2
(45) Date of Patent: Jan. 17, 2006

(54) RECEIVE METHOD AND RECEIVER IN COMMUNICATION SYSTEM

(75) Inventor: Satoshi Denno, Yokosuka (JP)

(73) Assignee: NTT DoCoMo, Inc., Tokyo (JP)

(*) Notice: Subject to any disclaimer, the term of this patent is extended or adjusted under 35 U.S.C. 154(b) by 722 days.

(21) Appl. No.: 09/886,255

(22) Filed: Jun. 22, 2001

(65) Prior Publication Data

US 2002/0057752 A1    May 16, 2002

(30) Foreign Application Priority Data

| Jun. 23, 2000 | (JP) | ............................. 2000-190183 |
| Jul. 19, 2000 | (JP) | ............................. 2000-219880 |
| Oct. 18, 2000 | (JP) | ............................. 2000-318552 |
| Mar. 2, 2001 | (JP) | ............................. 2001-059288 |

(51) Int. Cl.
  H04L 27/32    (2006.01)
  H04B 1/12     (2006.01)

(52) U.S. Cl. ........................................ 375/316; 455/295
(58) Field of Classification Search ................ 375/235, 375/343, 349, 345, 344, 324, 284, 285, 346; 329/304, 318, 341, 306; 455/324, 305, 239.1, 455/337, 245.1, 303, 314, 296, 295; 348/21, 348/607; 342/174, 194
See application file for complete search history.

(56) References Cited

U.S. PATENT DOCUMENTS

| 5,105,195 | A | * | 4/1992 | Conrad .................... 342/174 |
| 5,230,099 | A | * | 7/1993 | Loper ...................... 455/324 |
| 5,249,203 | A | * | 9/1993 | Loper ...................... 375/344 |
| 5,263,196 | A | * | 11/1993 | Jasper .................... 455/324 |
| 5,705,949 | A | * | 1/1998 | Alelyunas et al. .......... 329/304 |
| 5,778,032 | A | | 7/1998 | Tanaka et al. |
| 5,799,047 | A | | 8/1998 | Dobrica |
| 5,878,089 | A | | 3/1999 | Dapper et al. |
| 6,044,112 | A | * | 3/2000 | Koslov ..................... 375/235 |
| 6,219,088 | B1 | * | 4/2001 | Liu et al. .................. 348/21 |
| 6,289,048 | B1 | * | 9/2001 | Richards et al. .......... 375/235 |
| 6,310,925 | B1 | | 10/2001 | Kitta |
| 6,330,290 | B1 | * | 12/2001 | Glas ....................... 375/324 |
| 6,377,620 | B1 | * | 4/2002 | Ozluturk et al. .......... 375/235 |

FOREIGN PATENT DOCUMENTS

| EP | 0 314 208 | 5/1989 |
| JP | 6-90265 | 3/1994 |
| JP | 8-223237 | 8/1996 |
| JP | 8-237309 | 9/1996 |
| JP | 9-83595 | 3/1997 |
| JP | 9-93301 | 4/1997 |
| JP | 11-220507 | 8/1999 |
| WO | WO 99/63655 | 12/1999 |

* cited by examiner

OTHER PUBLICATIONS

Felix Aschwanden, IEEE Transactions on Consumer Electronics, vol. 42, No. 3, pp. 729-738, "Direct Conversion-How To Make It Work In TV Tuners", Aug. 1, 1996.

Primary Examiner—Jay K. Patel
Assistant Examiner—Jacob Meek
(74) Attorney, Agent, or Firm—Oblon, Spivak, McClelland, Maier & Neustadt, P.C.

(57) ABSTRACT

A receive method in a communication system is provided. The method includes the steps of: generating a quadrature signal from the receive signal; compensating orthogonality error and gain imbalance for the receive signal and the quadrature signal; and converting the receive signal and the quadrature signal into first complex frequency band signal by first analytic sine wave.

20 Claims, 36 Drawing Sheets

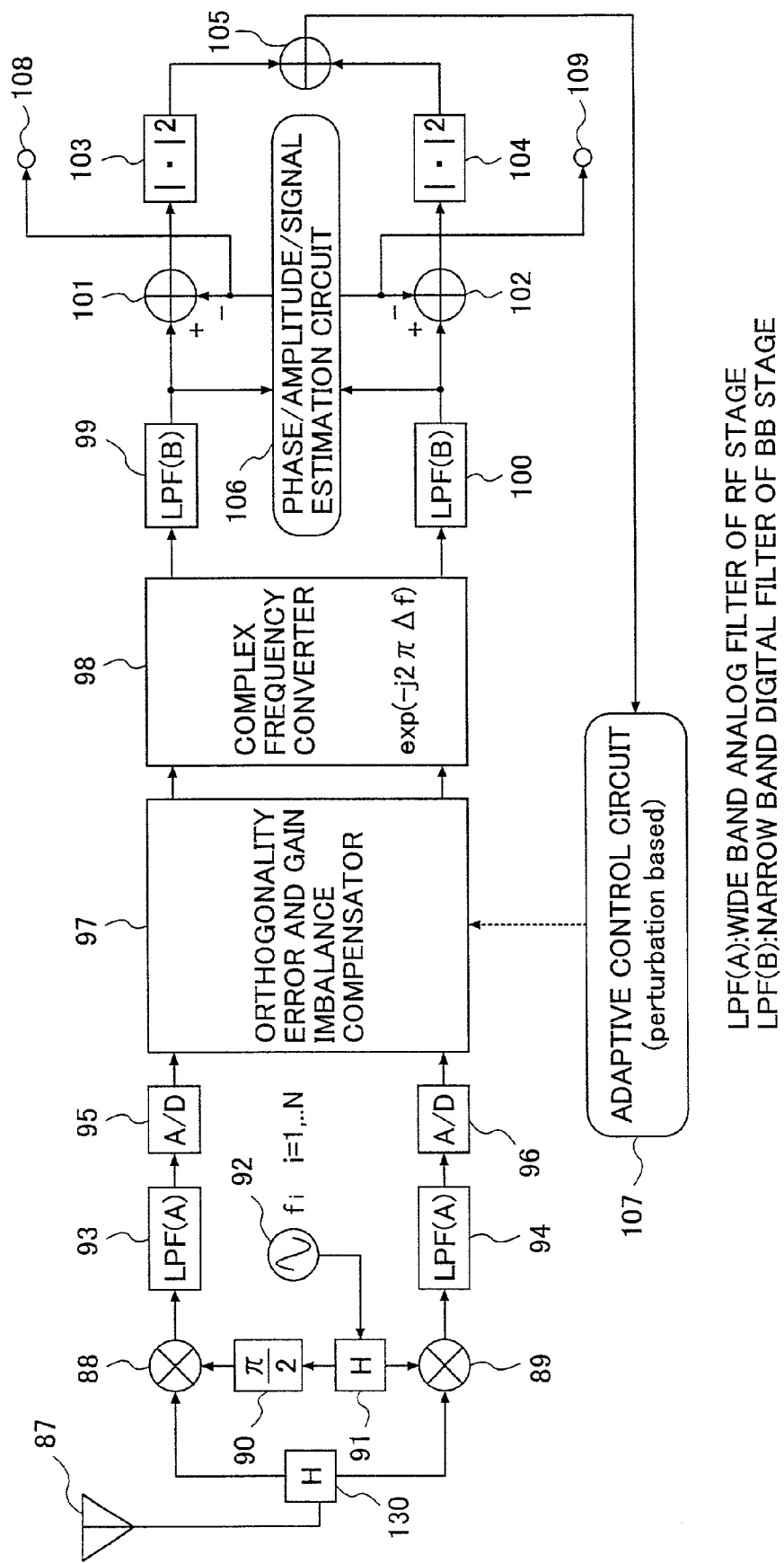

RECEIVE METHOD AND RECEIVER IN COMMUNICATION SYSTEM

BACKGROUND OF THE INVENTION

1. Field of the Invention

The present invention relates to a receive method and a receiver in a communication system. More particularly, the present invention relates to a receive method and a receiver in a communication system which converts a signal into a carrier band for transmission in which desired signal components are extracted in baseband.

2. Description of the Related Art

If it becomes possible that signals of various systems and various frequencies are received by one receiver, various information can be obtained by one terminal. However, as for a wireless communication system, an information signal is converted into a carrier having a frequency ranging from several hundreds MHz to several GHz for transmission. In this case, different frequencies are assigned to wireless communication systems such that the frequencies for each wireless communication system do not overlap one another since communication is performed in a medium, that is, one free space. Then, the information is transmitted by the carrier having an assigned frequency. Therefore, a frequency band includes a lot of systems so that the systems are placed densely on the frequency axis. Thus, a filter which is adapted to a channel band of the receiver and has high selectivity becomes necessary in order to extract a desired frequency signal.

FIG. 1 shows a configuration of a receiver in a conventional wireless communication system. More particularly, FIG. 1 shows several parts of a double super heterodyne receiver which is used in an analog car telephone system of NTT. The receiver shown in FIG. 1 includes an antenna 1, a band-pass filter (BPF) 2 of an RF (Radio Frequency) band which is a carrier band of a first stage, a local oscillator 3 for converting a signal to a first IF (Intermediate Frequency) band, a multiplier 4, a band-pass filter for removing higher harmonic components included in the output from the multiplier 4, a local oscillator 6 for converting a signal to a second IF (Intermediate Frequency) band, a multiplier 7, a narrow band-pass filter 8 for removing higher harmonic components included in an output from the multiplier 6 and for selecting a self channel, an amplifier 9 for absorbing receive power variation associated with movement of a terminal, a band-pass filter 10 for separating a digital signal which is sent as a control signal and a voice signal, a demodulator 11 and an output terminal 12.

According to the configuration shown in FIG. 1, the band-pass filter 8 has high selectivity and extracts only a signal of the self channel. However, in the configuration, in order to demodulate signals of various systems, it is necessary to change band of the band-pass filters 2, 5, especially 8 according to the signal of the system. However, generally, it is difficult to change frequency band characteristics of an analog filter of RF/IF bands. That is, for conforming to systems which have various frequency bands, it is impossible to select a desired band signal by the RF band-pass filter or the IF band-pass filter.

Generally, signal bands differs according to systems. Therefore, in order to receive signals of various systems, it is necessary to provide an RF/IF filter which has a conceivable maximum signal band for systems to be received. In this case, it becomes possible to receive signals of various systems by using a base-band filter which easily realizes changeability of frequency band characteristics and high selectivity for selecting desired signal, where the base-band filter may be a filter realized by digital signal processing.

When frequency conversion is performed, a frequency synthesizer is necessary. When assuming that systems including a very narrow bandwidth system are used, the frequency synthesizer needs to be highly accurate and stable over a wide frequency range. In addition, for the frequency synthesizer to select a frequency band freely, the circuit of the frequency synthesizer becomes complex. Thus, there occurs a problem in that the frequency synthesizer can not be used for a system like a mobile communication system which requires low power consumption for devices. Therefore, a signal is covered into an appropriate IF frequency band and is converted into a digital signal by an analog/digital converter temporarily. After that, the ranges of systems with which communication can be performed can be expanded by predicting the carrier frequency accurately and demodulating by using a high capability digital signal processing technique. In addition, according to this configuration, since the frequency is converted only to the IF frequency band, it becomes possible to avoid characteristic degradation due to DC (Direct Current) components in the receiver which occurs when the frequency is converted to the baseband.

However, when the receiver is configured such that it includes (α) an analog wideband band-pass filter and a channel filter operated by digital signal processing and (β) analog/digital conversion in IF frequency bands, there is a problem in that SNR (Signal to Noise Ratio) degrades since image frequency band components are mixed in signal components due to relationship between IF frequency band and band of the analog band-pass filter.

FIGS. 2A and 2B show relationship between the image frequency band components and the bandwidth of the band-pass filter. In principle, the digital wireless communication system converts only real frequency band components to a carrier band $f+\Delta f$ when performing communication. At this time, in the receiver, when the signal is converted by the local oscillation frequency $f$ so that signal of IF frequency band $\Delta f$ is generated, the signal of carrier band $f-\Delta f$ is also converted to the IF frequency band $\Delta f$ as an interference wave at the same time in principle. This is a cause of degradation of SNR. For example, when phase modulation is used for both of the desired signal and the interference signal, the interference signal appears in the IF frequency band as shown in the following equation (1), $$LPF_1[\{A\cos((\omega_c + \Delta\omega)t + a_k) + B\cos((\omega_c - \Delta\omega)t + b_k)\} * \cos(\omega_c t)] = \quad (1)$$
$$\frac{A}{2}\cos(\Delta\omega_k + a_k) + \frac{B}{2}\cos(\Delta\omega t - b_k)$$

wherein ω indicates each frequency, $\omega=2\pi f$, t indicates time variable, $LPF_1$ indicates a function for eliminating high-frequency band components, $a_k$ and $b_k$ indicate information components of the desired signal and the interference signal, A and B indicate levels of the desired signal and the interference signal. Conventionally, to avoid this problem, as shown in FIG. 2A, a band-pass filter for suppressing the signal of the carrier band $f-\Delta f$ is placed before the frequency converter. However, when bandwidth of the band-pass filter is widened in order to receive various frequency bands of various systems, the signal of the carrier band $f-\Delta f$ is converted to the IF frequency band.

To overcome this problem, an image frequency canceler is proposed in which the image frequency band components are removed after orthogonal quasi-coherent detection is performed on the signal of RF band. A configuration of the image frequency canceler is shown in FIG. 3. The image frequency canceler includes an antenna 13, a first stage band-pass filter 14, branch circuits 15 and 19, multipliers 16 and 17, a π/2 phase shifter 18, low-pass filters 21, 22, 27 and 28, analog/digital converters 23 and 24, a complex frequency converter 25 performing multiplication of analytic sine wave exp(-jΔωkT) of IF frequency band, output terminals 29 and 30, wherein T indicates a sampling frequency. In the example shown in FIG. 3, orthogonal quasi-coherent detection is performed on the real frequency signal of the carrier band. That is, the following quadrature component is generated in addition to the interference signal shown in (1).

$$LPF_1[\{A\cos((\omega_c + \Delta\omega)t + a_k) + B\cos((\omega_c - \Delta\omega)t + b_k)\} * \sin(\omega_c t)] = \quad (2)$$

$$\frac{A}{2}\sin(\Delta\omega_k + a_k) + \frac{B}{2}\sin(\Delta\omega t - b_k)$$

When the above-mentioned complex multiplication is performed for the equation (1) and (2) and high-frequency band components appearing in ±2Δω is removed, the following desired signal can be obtained, $$LPF_2\left[\left\{\frac{A}{2}\cos(\Delta\omega t + a_k) + \frac{B}{2}\cos(-\Delta\omega t + b_k)\right\}\cos(\Delta\omega t)\right] - \quad (3.1)$$

$$LPF_2\left[\left\{-\frac{A}{2}\sin(\Delta\omega t + a_k) + \frac{B}{2}\sin(\Delta\omega t - b_k)\right\}\sin(\Delta\omega t)\right] =$$

$$\left\{\frac{A}{4}\cos(a_k) + \frac{B}{4}\cos(b_k)\right\} - \left\{-\frac{A}{4}\cos(a_k) + \frac{B}{4}\cos(b_k)\right\} = \frac{A}{2}\cos(a_k)$$

$$LPF_2\left[\left\{\frac{A}{2}\cos(\Delta\omega t + a_k) + \frac{B}{2}\cos(-\Delta\omega t + b_k)\right\}\sin(\Delta\omega t)\right] + \quad (3.2)$$

$$LPF_2\left[\left\{-\frac{A}{2}\sin(\Delta\omega t + a_k) + \frac{B}{2}\sin(\Delta\omega t - b_k)\right\}\cos(\Delta\omega t)\right] =$$

$$\left\{-\frac{A}{4}\sin(a_k) + \frac{B}{4}\sin(b_k)\right\} + \left\{-\frac{A}{4}\sin(a_k) - \frac{B}{4}\sin(b_k)\right\} = -\frac{A}{2}\sin(a_k)$$

wherein LPF$_2$ is a function for removing the high-frequency band components appearing in ±2Δω. If the equations (3.1) and (3.2) can be realized perfectly, the image frequency band components can be canceled theoretically. However, in actuality, there is orthogonality error and gain imbalance in the analog quasi-coherent detector. As a result, signal of the carrier band f−Δf is mixed in the equations (3.1) and (3.2) so that SNR is degraded. According to a current analog technique, it is very difficult to realize orthogonality and gain balance in high accuracy in the analog orthogonal quasi-coherent detection for the equations (1) and (2). In reality, adjustment is performed by hand. However, only 20~30 dB is obtained, which is far from requirement (80~90 dB in PDC system for example) of the wireless communication system.

In addition, in order to receive signals for various systems, it is necessary to keep orthogonality for signals of various frequencies. However, it is impossible to keep characteristics of the analog π/2 phase shifter over wide band in principle. Therefore, according to the configuration shown in FIG. 3, there is a problem in that enough image frequency remove performance can not be obtained due to orthogonality error and gain imbalance of the analog quasi-coherent detector.

Another method is proposed for avoiding mixing of the image frequency band components in which Δω is set to be far larger than the band of the band-pass filter. In this case, it is necessary to input this high IF signal to the analog/digital converter directly and convert to digital signal. In this case, even if the operation speed of the analog/digital converter is much lower than the IF frequency, signal demodulation is possible when the operation speed is more than four times of the Nyquist rate at the minimum.

Therefore, by utilizing this band-pass flittering technique, the above-mentioned condition (α) and (β) can be satisfied without receiving interference from the image frequency band.

However, in this case, characteristic is seriously degraded due to jitter of sampling clock of the analog/digital converter. Since the amount of degradation is proportional to the IF frequency, it is difficult to use this method for systems having high IF frequency band. As a result, this method can not be used.

Therefore, when the band of the band-pass filter of carrier band is widened in order to receive signals of various systems, interference due to orthogonality disorder becomes serious problem. Therefor, when receiving signals of various systems, there is a method in which RF/IF circuits for receiving each system are provided and are switched appropriately. However, according to this configuration, the number of RF/IF devices increases so that the size of circuits becomes large. As a result, the device size is increased so that the cost is increased. In a mobile communication system in which low cost and miniaturization are required, increase of device size and cost becomes large problem. In addition, when hardware is manufactured, it becomes impossible to remove unnecessary systems. Therefore, in order to introduce a new system, it is necessary to develop hardware from scratch. Therefore, there is a problem in that development cost remarkably increases.

As mentioned above, conventionally, there is a problem in that image frequency band components can not be fully suppressed in the configuration which includes the wide band band-pass filter, the analog orthogonal quasi-coherent detector for frequency conversion, and removes the image frequency band components by using digital complex frequency conversion and filtering. Even if a man performs adjustment for a frequency band by allowing SNR degradation to some extent, there is a problem in that it is impossible to change receive system dynamically when frequency band is changed.

In addition, when the receiver receives signals by using the same hardware for a plurality of systems each placed in its specific frequency, the receiver can not have a filter in which the bandwidth is smaller than the maximum bandwidth in the systems. On the other hand, when considering miniaturization of the receiver, it is effective to perform sampling by IF band and to configure the band-pass filter by a digital filter. At this time, there is a problem in that interference wave is mixed in the desired wave since the minus IF frequency band components are not fully decreased by the RF/IF band.

SUMMARY OF THE INVENTION

It is an object of the present invention to provide a receive method and a receiver which can remove the interference signal components generated from a frequency band when performing frequency conversion by using the local oscillator, where the frequency band and signal band are symmetric with respect to the frequency of the local oscillator.

The above object of the present invention can be achieved by a receive method in a communication system, comprising the steps of:

receiving a receive signal converted into a carrier band;

generating a quadrature signal from the receive signal;

compensating orthogonality error and gain imbalance for the receive signal and the quadrature signal; and converting the receive signal and the quadrature signal into first complex frequency band signal by first analytic sine wave, the first analytic sine wave being a complex signal including cosine wave as the real components and including sine wave as the imaginary components.

In the receive method, the step of compensating orthogonality error and gain imbalance may includes the steps of:

dividing the quadrature signal into divided quadrature signals;

assigning weight to each of the divided quadrature signals;

adding the receive signal to one of the divided quadrature signals.

In the receive method, the step of compensating orthogonality error and gain imbalance may includes the steps of:

assigning weight to each of the quadrature signal and the receive signal; and adding the quadrature signal and the receive signal.

The receive method may further includes the step of:

converting, after the step of compensating, the receive signal and the quadrature signal into second complex frequency band signal by second analytic sine wave, the second analytic sine wave being a complex signal including cosine wave as the real components and including sine wave as the imaginary components.

In the receive method, the weight may be determined according to the second complex frequency band signal converted by the second analytic sine wave.

The receive method may further includes the step of:

estimating a desired signal on the basis of the first complex frequency band signal converted by the first analytic sine wave.

In the receive method, the weight may be determined according to the desired signal and the first complex frequency band signal.

The receive method may further includes the steps of:

detecting a difference signal on the basis of the first complex frequency band signal, a predetermined signal and the desired signal;

determining the weight according to a complex frequency band signal and the difference signal.

The receive method may further includes the steps of:

sampling the first complex frequency band signal at symbol rate;

detecting a difference signal according to a predetermined signal, a sampled signal and the desired signal; and determining the weight according to a complex frequency band signal and the difference signal, and controlling the sampled signal to be a predetermined sampling phase.

According to the invention, it becomes possible to remove the interference signal components by compensating the orthogonality error and gain imbalance in which the weight used for the compensation is determined according to the output of the receiver.

The above object can be also achieved by a receive method in a communication system, comprising the steps of:

receiving a receive signal converted into a carrier band;

performing analog quasi-coherent detection on the receive signal and outputting in-phase and quadrature signals;

performing analog-to-digital conversion on the in-phase and quadrature signals;

dividing the in-phase and quadrature signals into first in-phase and quadrature signal and second in-phase and quadrature signal;

converting the first in-phase and quadrature signal into a complex baseband signal by a first analytic signal, and converting the second in-phase and quadrature signal into a complex baseband signal by a second analytic signal;

applying the first in-phase and quadrature signal to a first low-pass filter, and applying the second in-phase and quadrature signal to a second low-pass filter;

applying the first in-phase and quadrature signal passed through the first low-pass filter and the second in-phase and quadrature signal passed through the second low-pass filter to an adaptive interference canceler; and removing interference components included in the first in-phase and quadrature signal and the second in-phase and quadrature signal.

The above adaptive interference canceler may separate desired frequency band components and interference signal components, by using orthogonalization coefficients, from an input signal in which the desired frequency band components and the interference signal components are mixed.

In addition, the adaptive interference canceler may estimate the orthogonalization coefficients according to changes of orthogonality in the analog quasi-coherent detection.

According to the invention, high quality signals can be obtained by removing interference components from the input signal by using the estimated orthogonalization coefficients.

BRIEF DESCRIPTION OF THE DRAWINGS

Other objects, features and advantages of the present invention will become more apparent from the following detailed description when read in conjunction with the accompanying drawings, in which:

FIG. 8 shows a configuration of a receiver according to the embodiment 1-2 of the present invention;

DETAILED DESCRIPTION OF THE PREFERRED EMBODIMENTS

[First Embodiment]

Figure 1:
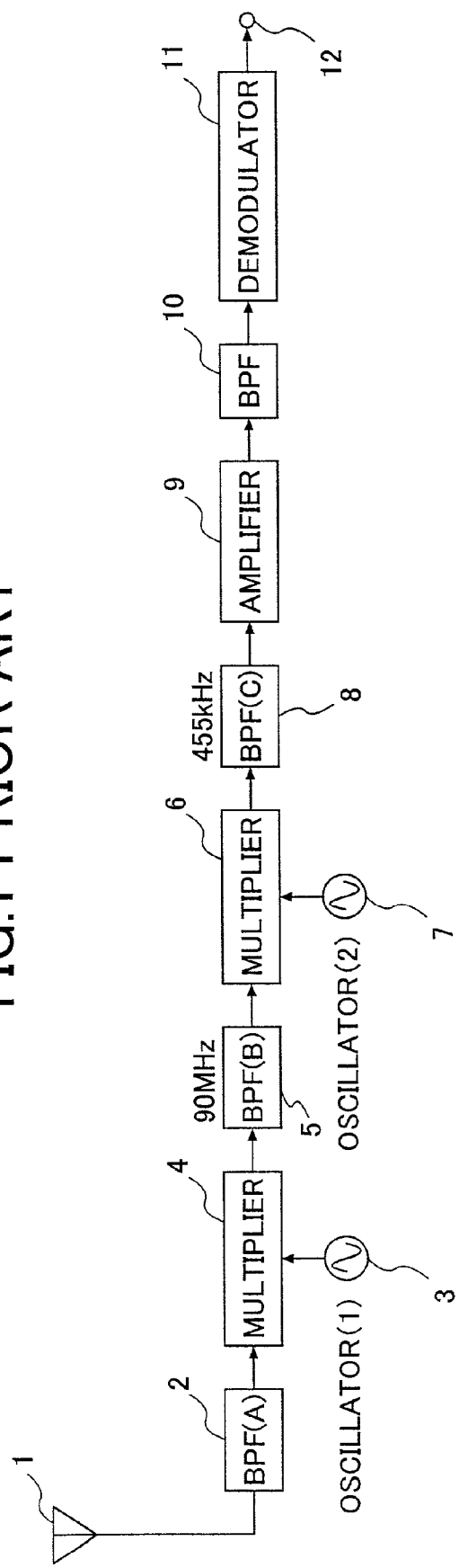
FIG. 1 shows a configuration of a conventional receiver.
Figure 2A:
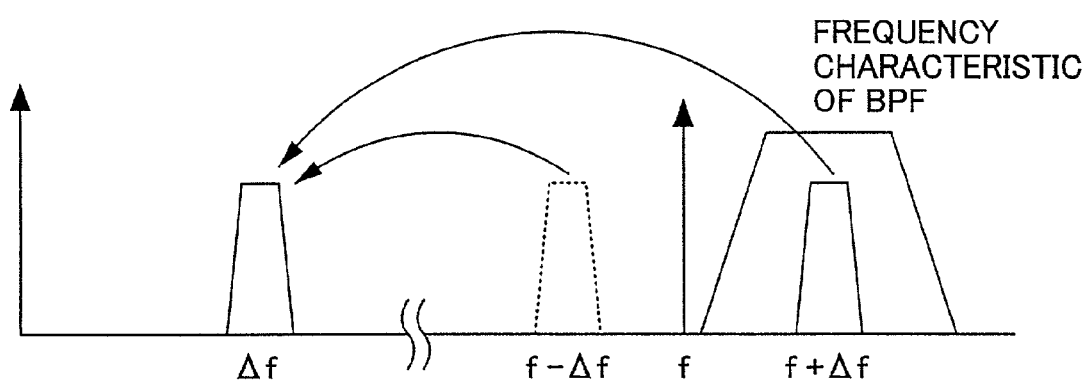
FIGS. 2A and 2B show relationships between image frequency band components and band of the band-pass filter.
Figure 2B:
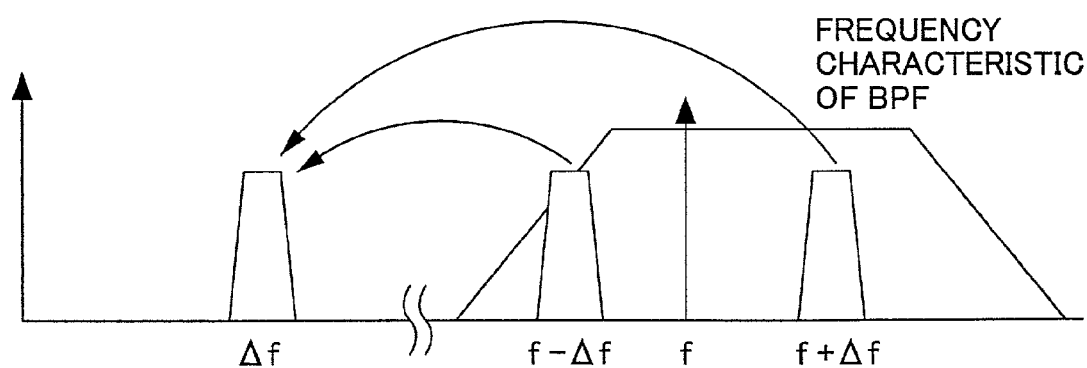
Figure 3:
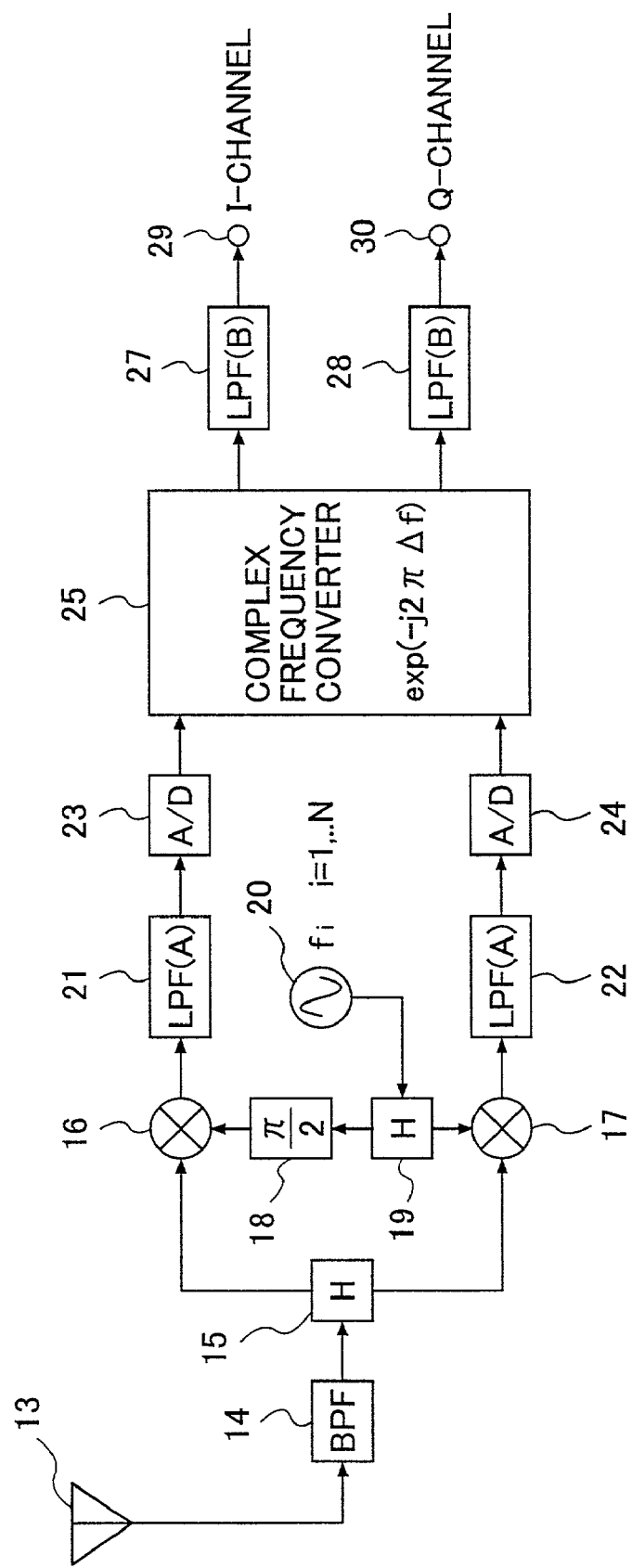
FIG. 3 shows a configuration of a conventional image frequency canceler.

There are several occurrence mechanisms of the orthogonality error and gain imbalance of the orthogonal quasi-coherent detector. Basically, the occurrence mechanism can be described by a following model. In the model, different gain is applied to the quadrature signal and the in-phase signal after the occurrence of the orthogonality error. Needless to say, the quadrature signal and the in-phase signal can be described by a pair of quadrature signals which are cosine wave and sine wave with respect to a phase. Therefore, it can be understood that the orthogonality error occurs for the reason that the cosine components are mixed into the quadrature signal (or that the sine components are mixed into the quadrature signal). Thus, the pair of quadrature signals can be reconstructed by subtracting the mixed components. That is, compensation for the orthogonality error can be realized by estimating the mixed cosine components and subtracting the components from the quadrature components.

On the other hand, the gain imbalance between the quadrature signal and the in-phase signal is caused by difference of gain of the amplifier for each signal of the quadrature signal and the in-phase signal, wherein the amplifiers are provided after the orthogonal quasi-coherent detector. Therefore, this problem can be solved by absorbing the gain difference by using an automatic gain control amplifier. As mentioned before, since the orthogonality error occurs first and the gain imbalance occurs next, compensation is performed in reverse order. That is, the compensation for the gain imbalance is performed first and for the orthogonality error next. In this compensation configuration, gain difference and the mixed component amount are estimated directly for the quadrature signal which is analog/digital converted in order to avoid performing multiplication two times for estimated coefficients of the mixed amount.

Therefore, the orthogonality error and the gain imbalance can be compensated by dividing the quadrature components, assigning appropriate weights (1), outputting signals as quadrature signals, and assigning appropriate weights to the divided quadrature signals (2). Weight coefficients used for these two kinds of weighing are estimated by after-mentioned adaptive control algorithm sequentially.

As mentioned before, if there are the orthogonality error and the gain imbalance, the interference wave from image frequency band f−Δf is mixed to the finally output signals. As the same phenomenon, when the signal of the image frequency band f−Δf is demodulated as the desired signal, signal of frequency band of f−Δf is mixed. Therefore, orthogonality error and the gain imbalance can be compensated adaptively by adaptively controlling the above-mentioned two coefficients such that the signal of frequency band of f−Δf which appears in the demodulator of the image frequency signal becomes minimum. Accordingly, interference from the image frequency band can be suppressed even if the frequency f changes.

For adaptively controlling the coefficient, gain or loss of interference power is measured when the coefficient is increased minutely first. If the interference power is increased, the coefficient is decreased minutely. On the other hand, if the interference power is decreased, the coefficient is increased minutely. The optimum coefficients can be estimated sequentially by repeating this process.

As another method, estimating the two coefficients is realized by detecting interference components from the image frequency band signal mixed when demodulating an f+Δf frequency band signal and by minimizing it.

That is, in the method, the sent digital signal in addition to amplitude and phase error of the desired signal included in output of the demodulator are estimated. Then, receive signal component (replica) having no noise effect is estimated by multiplying the digital signal by the estimated amplitude and the phase error. By subtracting the replica from the output of the demodulator, only mixed interference components are detected. Then, the above-mentioned adaptive control algorithm operates such that the interference signal becomes minimum. Accordingly, good interference compensation becomes possible even when strong interference signal exists.

In addition, when receiving signals of a plurality of systems each placed in specific frequency band by using the same hardware, minus frequency band signal cover the desired signal as the interference signal. This can be compensated by an image frequency adaptive interference compensator. However, although this interference compensator has advantage in that it can extract only the desired signal even under environment of CIR (Carrier to Interference Raito)=60 dB, the interference compensator can not fully exert its characteristics according to sampling timing. Thus, according to the present invention, an interference compensation method having low sensitivity to sampling timing change is proposed. In the method, oversampling is performed for output of a low-pass filter, the output signal is demodulated after ADF (Adaptive Digital Filter), and ADF and the interference compensator are controlled by using output of the ADF in the adaptive control part.

According to this method, even in such a bad environment of CIR=60 dB, high quality multi mode receiving becomes possible by blind operation independent of sample timing. That is, by preparing one kind of receiver, stable and high quality multi mode receiving, that is, receiving for various band systems becomes possible.

Figure 4:
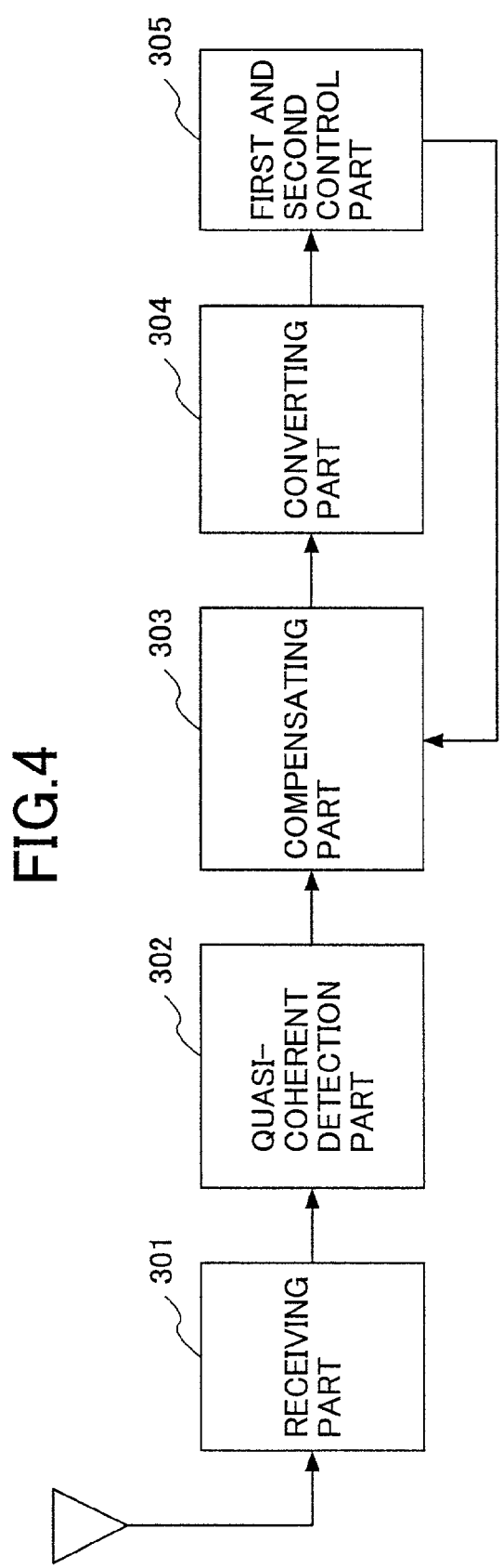
FIG. 4 shows a principle configuration of a first embodiment of the present invention.

FIG. 4 shows a principle configuration of a receiver of the first embodiment of the present invention. The receiver includes a receiving part 301 which receives a receive signal converted into a carrier band, a quasi-coherent detection part 302 which generates a quadrature signal from the receive signal, a compensating part 303 which compensates orthogonality error and gain imbalance for the receive signal and the quadrature signal, a converting part 304 which converts the receive signal and the quadrature signal into complex frequency band by analytic sine wave, the analytic sine wave being a complex signal including cosine wave as the real components and including sine wave as the imaginary components. In addition, it includes first and second control part 305.

In the following, the receiver will be described more concretely.

[Embodiment 1—1]

Figure 5:
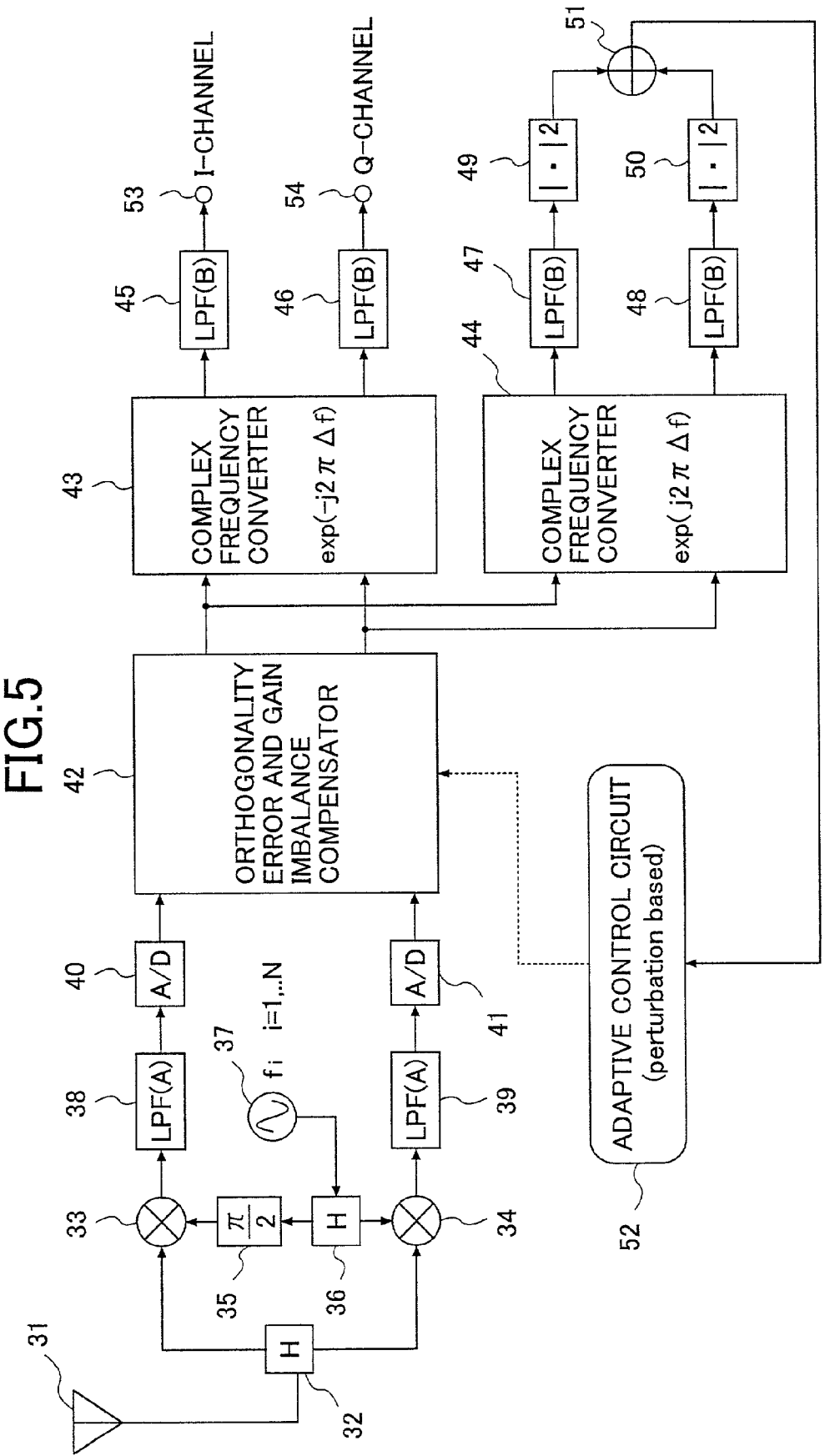
FIG. 5 shows a receiver according to an embodiment 1—1 of the present invention.

FIG. 5 shows a receiver according to an embodiment 1—1 of the present invention.

The receiver in the figure includes an antenna 31, analog multipliers 33, 34, branch circuits 32, 36, a π/2 phase shifter 35, an oscillator 37, low-pass filters 38, 39, 45~48, analog/digital converters 40, 41, orthogonality error and gain imbalance compensator 42, complex frequency converters 43, 44, square circuits 49, 50, an adder 51, an adaptive control circuit 52, output terminals 53, 54.

In the following, operations of the configuration will be described.

A signal received by the antenna 31 traverses the analog orthogonal quasi-coherent detector which includes the branch circuits 32, 36, the analog multipliers 33, 34, the π/2 phase shifter 35 and the oscillator 37. Then, the signals are converted into digital signals by the analog/digital converters 40, 41 after higher harmonic components are removed by the low-pass filters 38, 39. The outputs from the analog/digital converters 40, 41 are input into the complex frequency converters 43, 44 after orthogonality gain imbalance compensation of the analog quasi-coherent detector is performed by the orthogonality error and gain imbalance compensator 42.

In the complex frequency converters 43, 44, analytic sine wave having IF frequency band is complex-multiplied to the input signals. Since the input signals and the sine wave are represented analytically, minus frequency band signal and plus frequency band signal can be identified as different signals. Therefore, from the complex frequency converter 43 which multiplies by the analytic sine wave having minus IF frequency band with respect to the input signal, only f+Δf frequency band components are converted into baseband and output from the low-pass filters 45, 46 connected to the complex frequency converter 43.

On the basis of the same principle, from the complex frequency converter 44 which multiplies by the analytic sine wave having plus IF frequency band with respect to the input signal, only f−Δf frequency band components are converted into baseband and output from the low-pass filters 47, 48 connected to the complex frequency converter 44.

When the orthogonality error and gain imbalance are fully compensated, nothing should not output from the low-pass filters 47, 48. When any error is remained, signals are output. Thus, the adaptive control circuit 52 controls such that output of a power detector including the square circuits 49, 50 and the adder 51 becomes minimum.

Concretely, when assuming that outputs of the low-pass filters 47, 48 are $y_{k,i}(w_{k,i}, w_{k,q})$ and $y_{k,q}(w_{k,i}, w_{k,q})$, output $z_k(w_{k,i}, w_{k,q})$ of the adder 51 can be represented by the following equation.

$$Z_k = |y_{k,i}(w_{k,i}, w_{k,q})|^2 + |y_{k,q}(w_{k,i}, w_{k,q})|^2 \qquad (4)$$

In order to minimize $z_k(w_{k,i}, w_{k,q})$, calculate a power plane of $z_k(w_{k,i}, w_{k,q})$ for $w_{k,i}, w_{k,q}$, then search for a minimum point. That is, gradient vector of the power plane $z_k(w_{k,i}, w_{k,q})$ with respect to $w_{k,i}, w_{k,q}$ is calculated, and the optimum point is searched by moving the values of $w_{k,i}, w_{k,q}$ to the direction of minimum value little by little.

More particularly, the gradient vector can be calculated by the following equation $$\frac{\partial z_k}{\partial w_{k,i}} = z_k(w_{k,i} + \Delta w \; w_{k,q}) - z_k(w_{k,i} \; w_{k,q}) \qquad (5.1)$$

$$\frac{\partial z_k}{\partial w_{k,q}} = z_k(w_{k,i} \; w_{k,q} + \Delta w) - z_k(w_{k,i} \; w_{k,q}) \qquad (5.2)$$

wherein Δw represents a minute value. According to the principle of the adaptive control, the value can be moved close to the minimum value by moving it to a reverse direction of the direction indicated by the gradient vector.

$$w_{k,i} = w_{k-1,i} - \mu \frac{\partial z_k}{\partial w_{k,i}} \qquad (6.1)$$

$$w_{k,q} = w_{k-1,q} - \mu \frac{\partial z_k}{\partial w_{k,q}} \qquad (6.2)$$

In the above equations, $\mu$ is a coefficient called a step size parameter. That is, in the adaptive control circuit 52, the operation of the equations (5.1), (5.2), (6.1), (6.2) are performed every time the signal is input.

Figure 6:
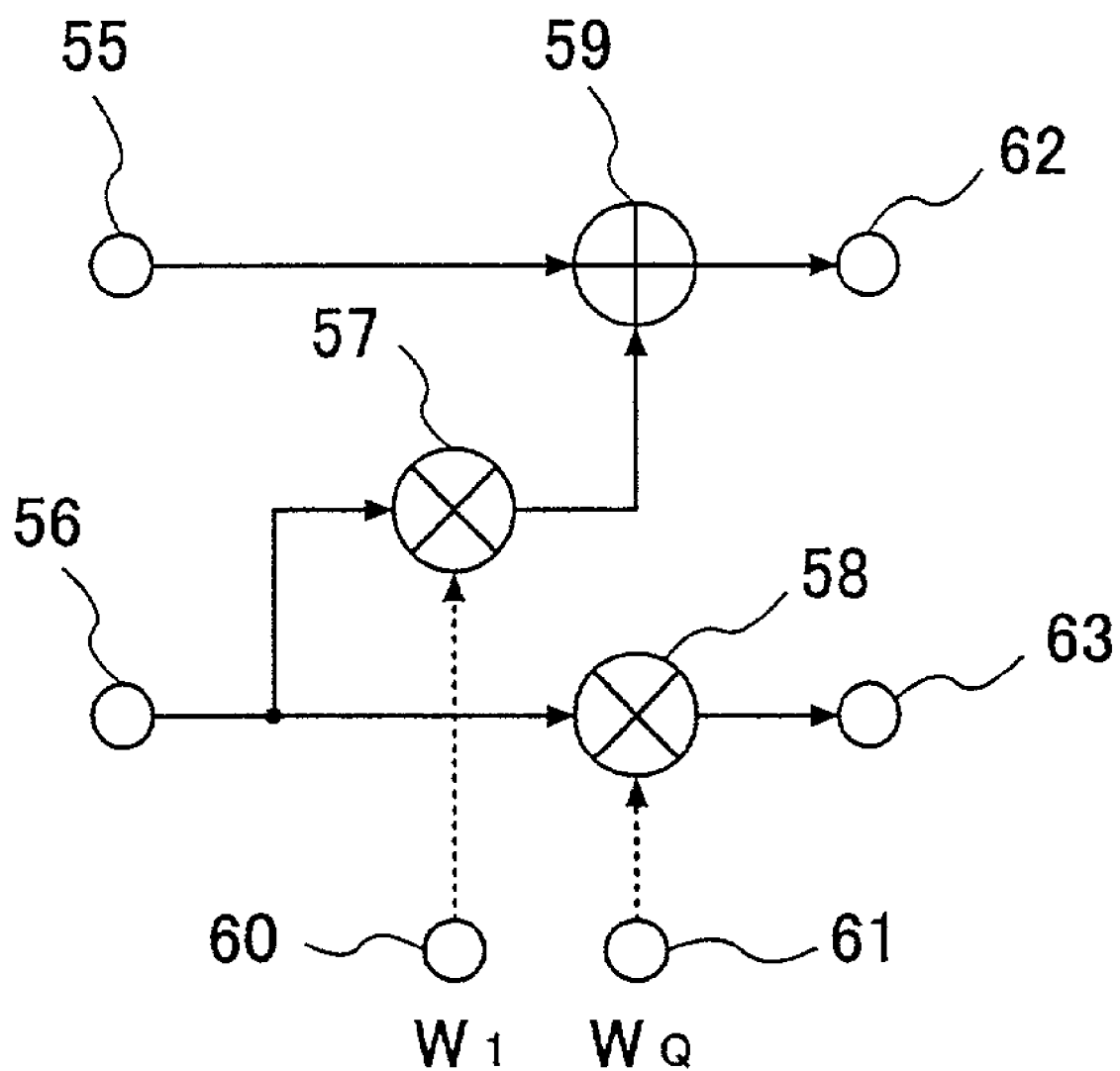
FIG. 6 shows a configuration of an orthogonality error and gain imbalance compensator of the embodiment 1—1 of the present invention.

FIG. 6 shows a configuration of an orthogonality error and gain imbalance compensator of the embodiment 1—1 of the present invention. The orthogonality error and gain imbalance compensator 42 shown in FIG. 6 includes input terminals 55, 56, multiplier 57, 58, an adder 59, coefficient input terminals 62, 63.

Figure 7A:
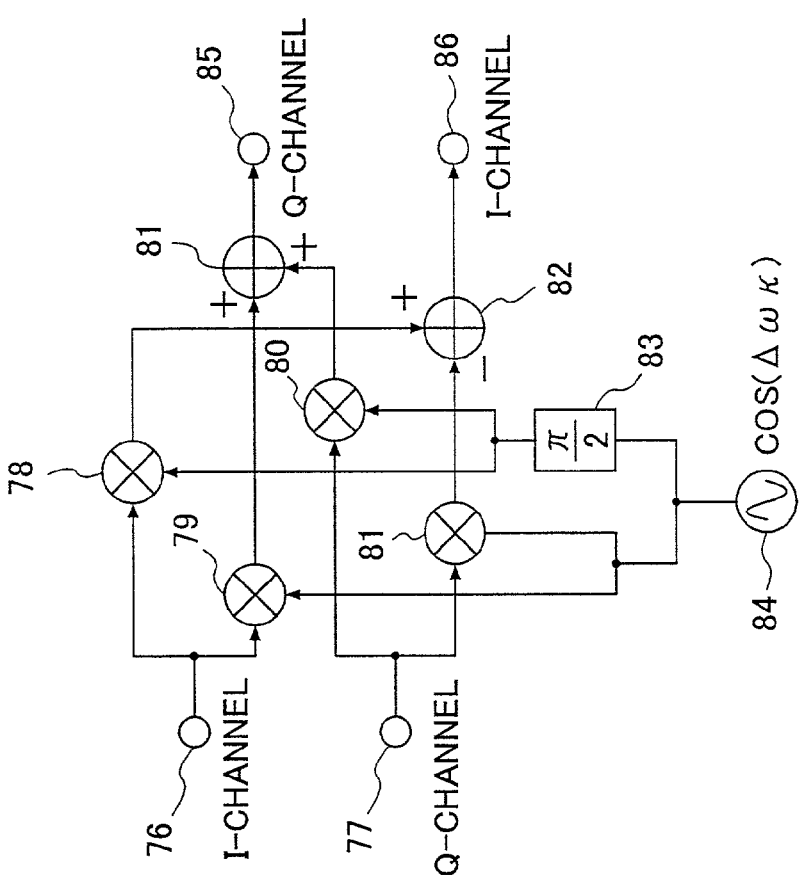
FIGS. 7A and 7B show configurations of the complex frequency converter according to the embodiment 1—1 of the present invention.
Figure 7B:
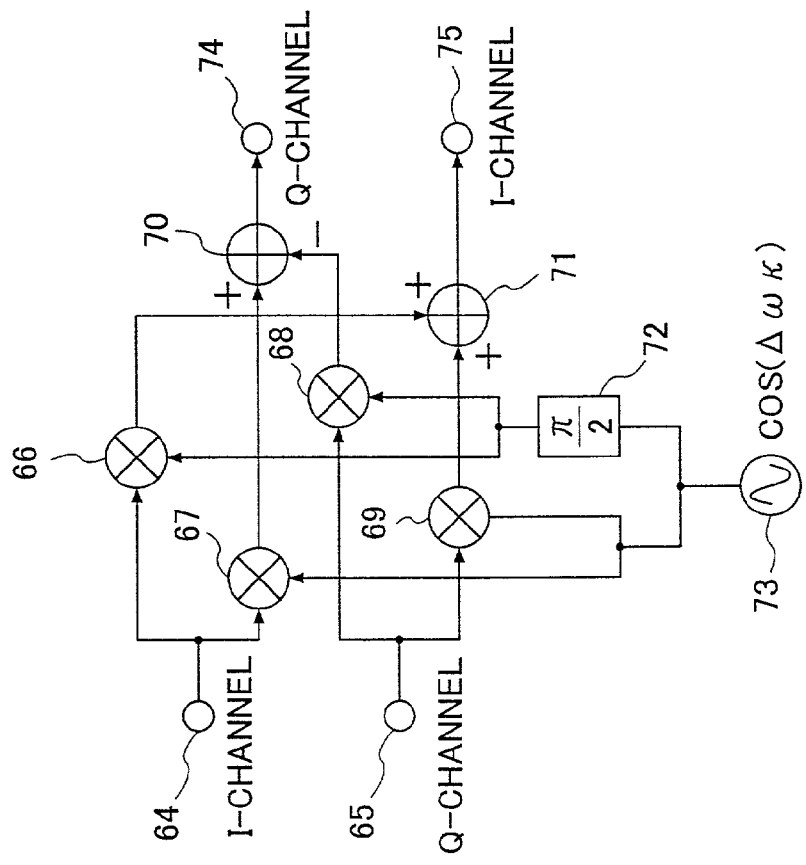

FIGS. 7A and 7B shows configurations of the complex frequency converter according to the embodiment 1—1 of the present invention. In actuality, an NCO (Numerically Controlled Oscillator) and a digital π/2 phase shifter are provided in addition to the digital complex multiplier. FIG. 7A shows a configuration of the complex frequency converter for multiplying by an analytic carrier wave having minus IF frequency band, and FIG. 7B shows a configuration of the complex frequency converter for multiplying by an analytic carrier wave having plus IF frequency band.

The complex frequency converter shown in the figures includes input terminals 64, 65, 76, 77, multipliers 66~69, 78~81, adders 71, 81, digital π/2 phase shifters 72, 83, NCOs 73, 84 and output terminals 74, 75, 85, 86.

As mentioned above, orthogonality error and gain imbalance compensation is performed by the orthogonality error and gain imbalance compensator 42 after performing quasi-coherent detection by the analog orthogonal quasi-coherent detector. Then, the signal is converted to baseband by the complex frequency converter 44, and the desired signal is obtained by removing, by the low-pass filters, high-frequency band components which are generated concurrently. According to the present invention, the orthogonality error and gain imbalance compensator is controlled such that SNR of the signal which has passed through the low-pass filters becomes maximum. In the control method, the coefficient of the orthogonality error and gain imbalance compensator is changed minutely and variation of the SNR at this time is detected. Then, variation direction of the coefficient for maximizing the SNR is estimated. As a result, the coefficient is brought near to optimum value gradually by moving the coefficient to the direction.

[Embodiment 1-2]

FIG. 8 shows a configuration of a receiver according to the embodiment 1-2 of the present invention.

The receiver shown in the figure, includes an antenna 87, analog multipliers 88, 89, branch circuits 130, 91, a π/2 phase shifter 90, an oscillator 92, low-pass filters 93, 94, 99, 100 analog/digital converters 95, 96, orthogonality error and gain imbalance compensator 97, complex frequency converter 98, square circuits 103, 104, an adder 105, subtracters 101, 102, an adaptive control circuit 107, phase/amplitude/signal estimation circuit 106, and output terminals 108, 109.

As for the receiver shown in FIG. 8, the configuration before the orthogonality error and gain imbalance compensator 97 is the same as that shown in FIG. 5. The outputs of the orthogonality error and gain imbalance compensator 97 are input into the complex frequency converter 98. In the complex frequency converter 98, the analytic sine wave having minus IF frequency band is multiplied to the input signals. Thus, f+Δf frequency band components are converted to baseband by the complex frequency converter 98, and the f+Δf frequency band components are output from the low-pass filters 99, 100 connected to the complex frequency converter 98. The output signals are divided and one of the divided signals is input to the phase/amplitude/signal estimation circuit 106. The phase/amplitude/signal estimation circuit 106 estimates amplitude and phase difference of signals sent by desired frequency band which are output from the low-pass filters 99, 100, and the sent digital signal itself. Then, the phase/amplitude/signal estimation circuit 106 multiplies the estimated digital signal by the phase difference and the amplitude so that it outputs an estimated value of a received signal which is called replica.

Then, the interference signals from f−Δf frequency band components are output by subtracting the replica signal output from the phase/amplitude/signal estimation circuit 106 from the output signals of the low-pass filter 99, 100 by using the subtracter 101 and 102. When the orthogonality error and gain imbalance compensator 97 is incomplete, f−Δf frequency band components are output from the low-pass filters 99, 100. The coefficient of the orthogonality error and gain imbalance compensator 97 is controlled by the adaptive control circuit 107 such that the signal components become minimum. That is, this control can be realized by performing operations of the equations (5.1)~(6.2) by the control circuit 107 when assuming that an output from a power measurement circuit including the square circuits 103, 104 and the adder 105 is $z_k$. That is, operations of the equations (5.1)~(6.2) are performed wherein $y_{k,i}$ ($w_{k,i}$, $w_{k,q}$) and $y_{k,q}$ ($w_{k,i}$, $w_{k,q}$) in the equation (4) are output from the subtracters 101, 102 shown in FIG. 8.

Figure 9:
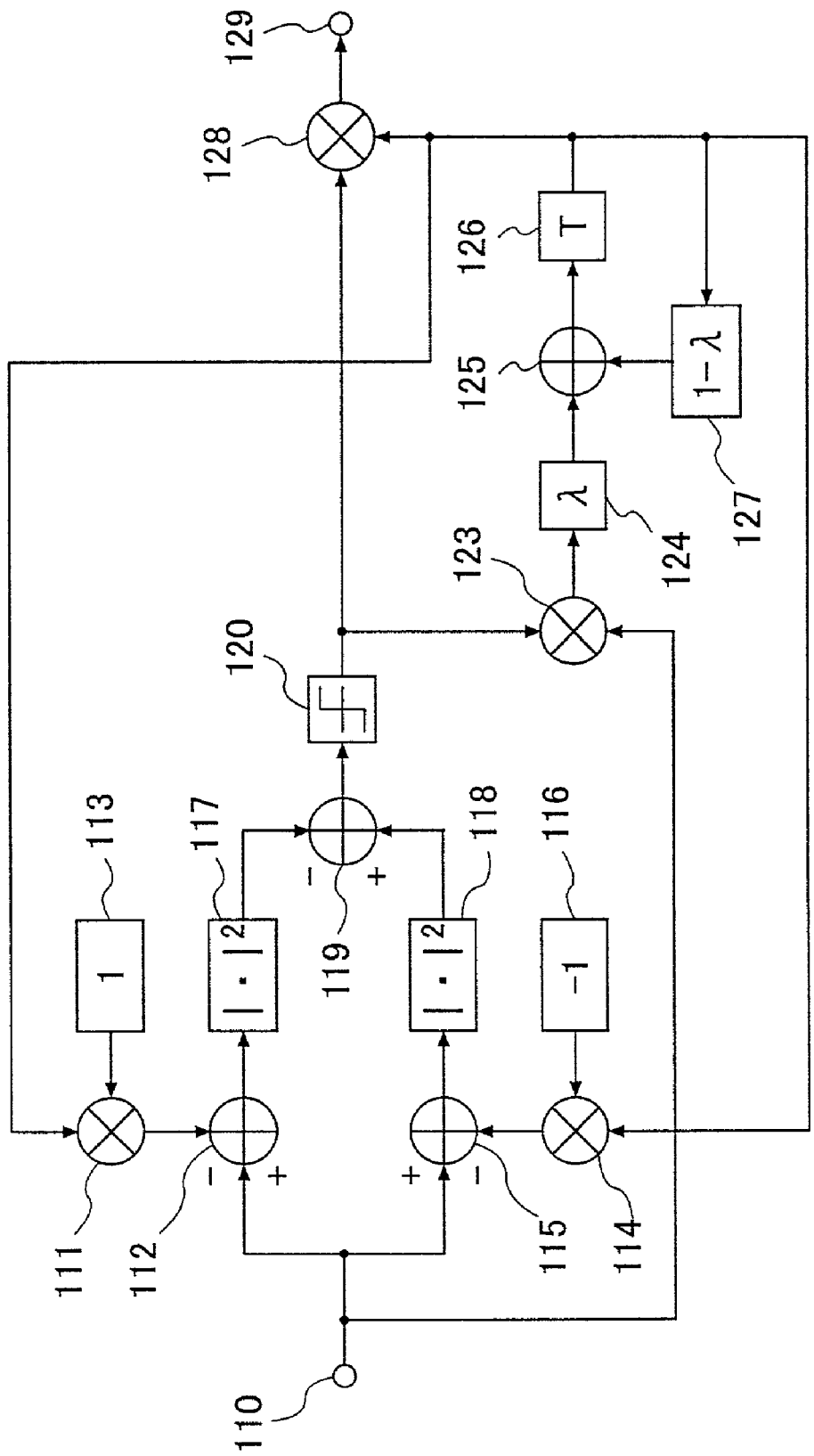
FIG. 9 shows a configuration of the phase/amplitude/signal estimation circuit 106 according to the embodiment 1-2 of the present invention.

FIG. 9 shows a configuration of the phase/amplitude/signal estimation circuit 106 according to the embodiment 1-2 of the present invention. The phase/amplitude/signal estimation circuit 106 shown in the figure is an example in which BPSK (Binary Phase Shift Keying) is used as a modulation method. In addition, complex numbers are used in the figure. That is, the input signal $S_k$ is represented as $s_k = y_{k,i}(w_{k,i}, w_{k,q}) + jy_{k,q}(w_{k,i}, w_{k,q})$, wherein j is the imaginary unit, and $y_{k,i}$ ($w_{k,i}$, $w_{k,q}$) and $y_{k,q}$ ($w_{k,i}$, $w_{k,q}$) are signals output from the low-pass filters 99, 100.

The phase/amplitude/signal estimation circuit 106 includes an input terminal 110, complex multipliers 111, 113, 123, 128, complex subtracters 112, 115, a scalar subtracter 119, a complex adder 125, a circuit 113 outputting a real number "1", a circuit 116 outputting a real number "−1", circuits 117, 118 calculating square of an absolute value of a complex number, a circuit 120 extracting only sign bit of an input signal and outputting it after multiplying by an absolute value "1", a coefficient multiplier 123 multiplying by a real coefficients λ, a circuit 127 multiplying by a real coefficient 1−λ, a sample delay circuit 126 and an output terminal 129.

In this configuration, two kinds of tentative decision values of input signal are generated by complex-multiplying an output "1" of the circuit 113 or an output "−1" of the circuit 116 which are send signal of BPSK modulation by amplitude phase information of the signal by using the complex multipliers 111, 114. Each of differences between the input signal and the two tentative decision values is calculated in the complex subtracters 112 and 115 respectively. Squares of the absolute values of the outputs, that is, power values are calculated in the circuits 117, 118 respectively. Then, the calculation results are compared. That is, the subtracter 119 subtracts the output of the circuit 117 from the output of the circuit 118. Then, the sign of the output signal is detected and a real number "1" is multiplied to it. As a result, a send signal by which the tentative decision value closer to the input signal is generated can be obtained.

Complex correlation between the estimated send signal and the input signal is calculated by the complex multiplier 123, then the calculated value is input to the coefficient multiplier 124. Then, noise components and high-frequency band components included in the correlation value output from the complex multiplier 123 are removed, and accurate phase and amplitude of the input signal are estimated by a first order low pass type lag filter. Then, the accurate phase and amplitude of the input signal are input to the complex multipliers 111, 114. The first order low pass type lag filter includes the coefficient multiplier 123, the complex adder 125, the one sample delay circuit 126. On the other hand, the replica of the input signal is output from the terminal 129 by supplying the phase and the amplitude of the input signal to the estimated send signal by the complex multiplier 128.

[Embodiment 1-3]

In this embodiment, a configuration of a receiver will be described. According to the receiver, an RF (Radio Frequency) signal is converted into an IF (Intermediate Frequency) signal by the orthogonal quasi-coherent detector, and the image frequency interference wave is removed by complex frequency conversion and baseband filtering. In addition, according to this receiver, orthogonality error compensation of the orthogonal quasi-coherent detector is performed in IF band by digital signal processing.

Figure 10:
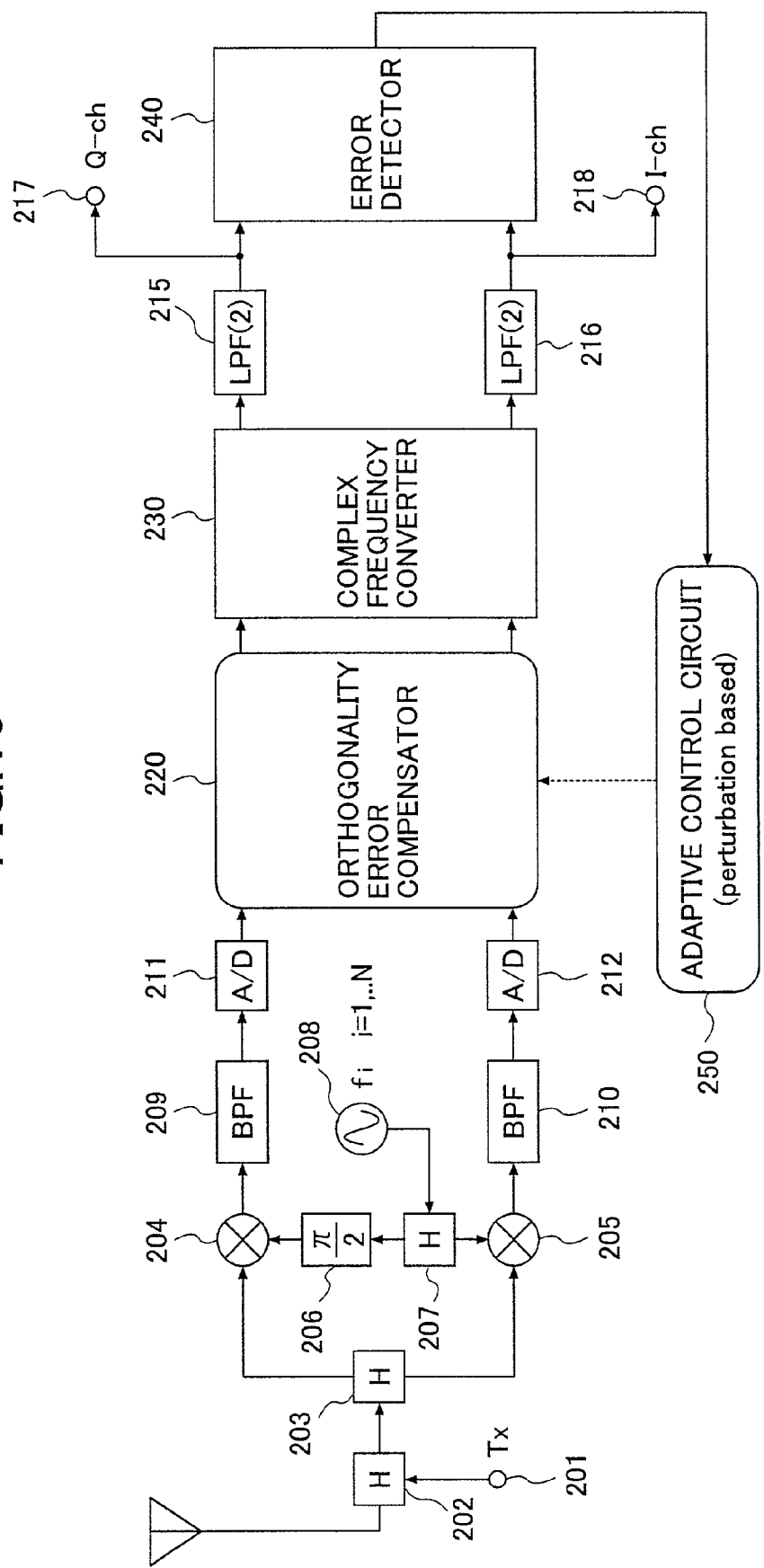
FIG. 10 shows a configuration of the receiver according to the embodiment 1-3 of the present invention.

FIG. 10 shows a configuration of the receiver according to the embodiment 1-3 of the present invention.

The receiver shown in the figure includes an input terminal 201, branch circuits 202, 203, 207, analog multipliers 204, 205, a π/2 phase shifter 206, an oscillator 208, band-pass filters (BPF) 209, 210, analog/digital converters 211, 212, orthogonality error compensator 220, complex frequency converter 230, low-pass filters 215, 216, a Q channel output terminal 217, an I channel output terminal 218, an error detector 240 and an adaptive control circuit 250.

In the receiver, orthogonalization and gain control of I channel and Q channel signals are performed by the orthogonality error compensator 220 for IF signals, wherein the IF signals are sampled by the input terminal 201, the branch circuits 202, 203, 207, the analog multipliers 204, 205, the π/2 phase shifter 206, the oscillator 208, the band-pass filters (BPF) 209, 210 and the analog/digital converters 211, 212. Then, complex frequency conversion is performed by the complex frequency converter 230, and, then, desired signals are obtained via the low-pass filters 215, 216. At this time, interference components included in the low-pass filters 215 and 216 is adaptively compensated by performing orthogonalization and gain control by the orthogonality error compensator 220 such that envelope level of the desired signal becomes constant.

Figure 11:
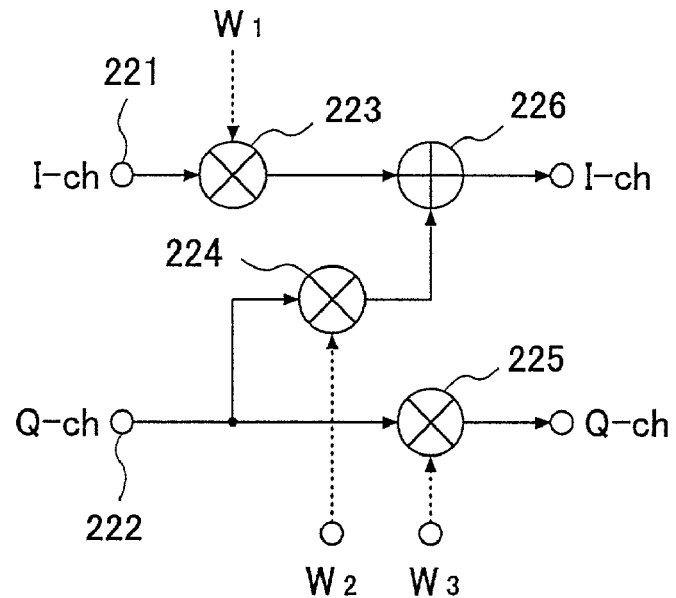
FIG. 11 shows a configuration of an orthogonality error compensator of the embodiment 1-3.

FIG. 11 shows a configuration of the orthogonality error compensator 220 of the embodiment 1-3. The orthogonality error compensator 220 includes an I channel input terminal, a Q channel input terminal 222, multipliers 223, 224, 225, an adder 226, an I channel output terminal 227, a Q channel output terminal 228.

Figure 12:
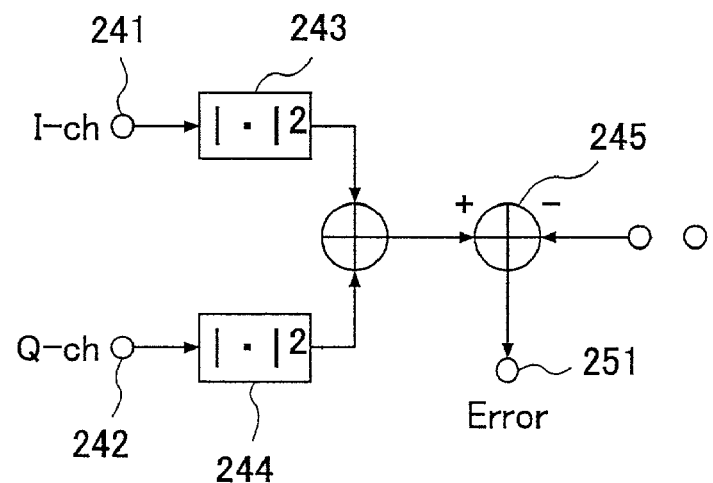
FIG. 12 shows a configuration of an error detector of the embodiment 1-3 (1)
Figure 13:
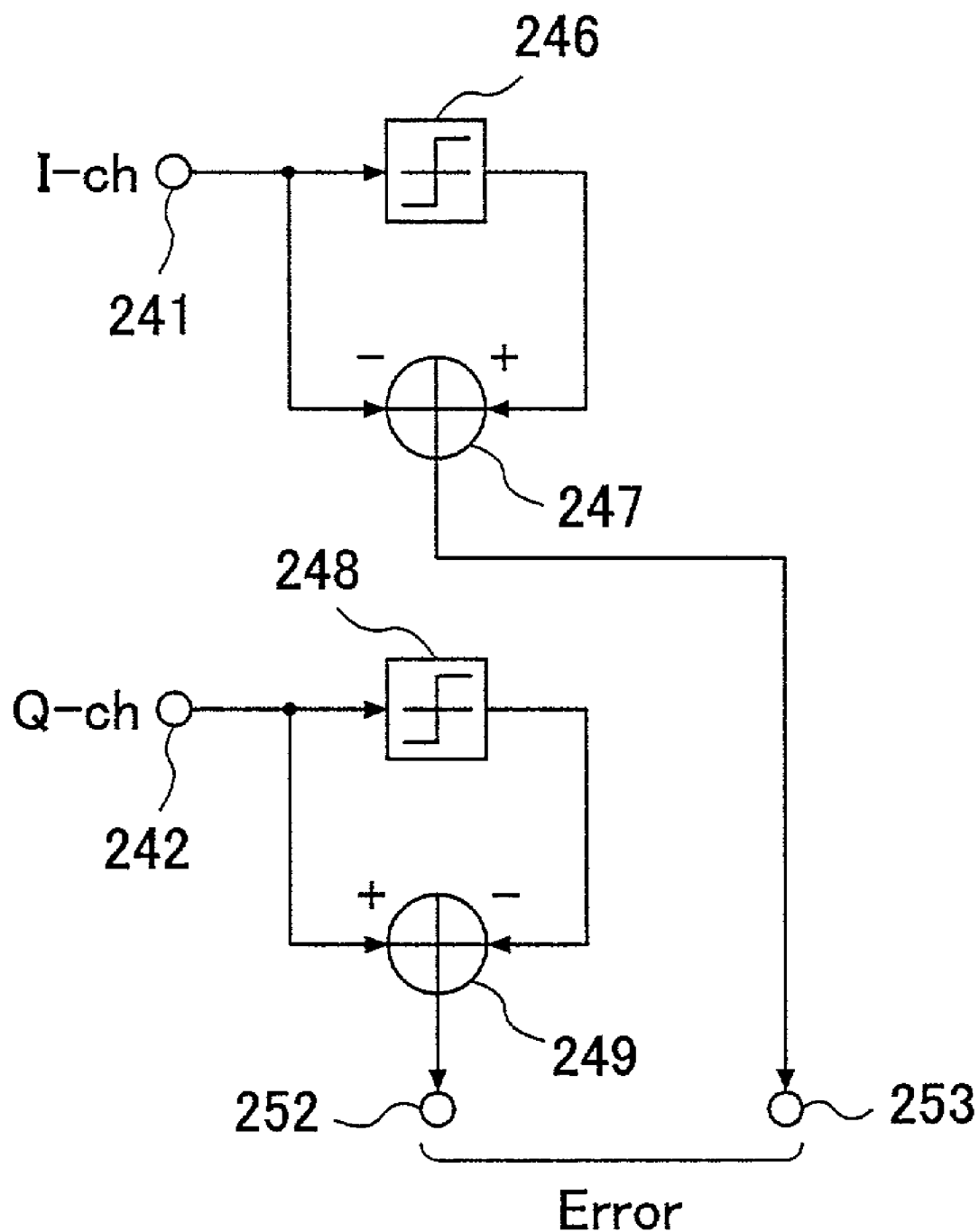
FIG. 13 shows a configuration of an error detector of the embodiment 1-3 (2)

FIGS. 12 and 13 shows configurations of the error detector 240 of the third embodiment. The error detector shown in FIG. 12 includes an I channel input terminal 241, a Q channel input terminal 242, square circuits 243, 244, an adder 245 and an error output terminal 251. The error detector shown in this figure detects power of analytic signal which has been converted to baseband and outputs difference between the power and a predetermined power as an error signal. This error detector can be used mainly for a system which uses a constant envelope modulation method. When using this type of error detector, it is possible that the receiver operates independently of a synchronization circuit such as a carrier synchronization circuit and the like.

The error detector shown in FIG. 13 includes the I channel input terminal 241, the Q channel input terminal 242, function parts 246, 248, adders 247, 249 and error output terminals 252, 253.

The error detector shown in this figure is an example in which the error signal is a difference between analytic signal converted to baseband and a predetermined analytic signal. When using this error detector, the orthogonality error and gain imbalance compensator provided in IF band also functions as a carrier synchronization circuit. Therefore, it is necessary to form a secondary loop in the algorithm when large frequency offset exists.

Comparing with the embodiment 1-2, the receiver of this embodiment does not requires complex processing such as that by the phase/amplitude/signal estimation circuit of the embodiment 1-2.

In addition, by using the error detector shown in FIG. 12, a known signal such as a predetermined signal (desired signal) is not necessary. In addition, there is an advantage in that it becomes unnecessary to synchronize with a sent known signal.

The analog orthogonal quasi-coherent detector is formed by the branch circuits 202, 203, 207, the analog multipliers 204, 205, the π/2 phase shifter 206 and the oscillator 208. An output $Y_k = [y_I(k), y_Q(k)]^T$ of the orthogonal quasi-coherent detector can be represented by the following equations, $$\begin{bmatrix} y_I(K) \\ y_Q(K) \end{bmatrix} = \sum A^{(m)} \begin{bmatrix} g_I\cos((-1)^m 2\pi f_{IF}kT + \phi + a_k^{(m)}) \\ g_Q\sin((-1)^m 2\pi f_{IF}kT + a_k^{(m)}) \end{bmatrix} \quad (7.1)$$

$$= G \sum_{m=0}^{1} F_k^{(m)} X_k^{(m)}$$

where $$G = \begin{bmatrix} g_I\cos(\phi) & -g_I\sin(\phi) \\ 0 & g_Q \end{bmatrix}$$

$$F^{(m)} = \begin{bmatrix} \cos((-1)^{(m)} 2\pi f_{IF}kT) & -\sin((-1)^{(m)} 2\pi f_{IF}kT) \\ \sin((-1)^{(m)} 2\pi f_{IF}kT) & \cos((-1)^{(m)} 2\pi f_{IF}kT) \end{bmatrix}$$

$$X_k^{(m)} = [x_I^{(m)}(k) \quad x_Q^{(m)}(k)]^T = A^{(m)} \begin{bmatrix} \cos(a_k^{(m)}) \\ \sin(a_k^{(m)}) \end{bmatrix}$$

wherein the subscript T indicates a transpose of a vector, $y_I$ (k) and $y_Q$ (k) indicate outputs of the analog orthogonal quasi-coherent detector, I channel signal and Q channel signal. Phase modulation is assumed to be used as the modulation method. In addition, $A^{(m)}$ and $a_k^{(m)}$ (m=0,1) indicate receive level and information signal for desired frequency band and interference frequency band signals respectively, $f_{IF}$ is the IF frequency, and T means symbol period. In addition, $g_I^{(m)}$ and $g_Q^{(m)}$ (m=0,1) indicate gains of the I channel and the Q channel of the orthogonal quasi-coherent detector. It can be judged that the orthogonality error occurs when the matrix G can not be orthogonally transformed. This is the reason why matrix representation, not complex representation, is necessary. The configuration of the orthogonality error compensator 220 is shown in FIG. 11.

According to the configuration shown in FIG. 10, the outputs of the orthogonality error compensator 220 are frequency-converted by the complex frequency converter 230 and pass through the low-pass filters 215 and 216. The outputs of the low-pass filters 215 and 216 can be represented by the following equation, in which thermal noise is not considered.

$$Z_k = [z_I(k) z_Q(k)] = LPF[F_k^{(l)} W_k Y_k] \quad (8.1)$$

$$= LPF\left[F_k^{(1)} W_k G \sum_{m=0}^{1} F_k^{(m)} X_k^{(m)}\right]$$

An error correction matrix $W_k$ is represented by the following equation.

$$W_k = \begin{bmatrix} w_1(k) & w_2(k) \\ 0 & w_3(k) \end{bmatrix} \quad (8.2)$$

In the equation (8.1), LPF[·] is a function for extracting a signal of baseband, that is a function for removing high frequency band signal. As mentioned before, when using the phase modulation as the modulation method, if there is no interference wave, envelope becomes constant. Therefore, a method of minimization of envelope deviation can be used, this method is used in CMA (Constant Modulus Algorithm: J. R. Treichler and B. G. Agee, "A New Approach to Multipath Correction of Constant Modulus Signals," IEEE Trans. Acoust., Speech, Signal Processing, vol. ASSP-31, No. 2, pp. 459–472, 1983).

That is, the following equation can be used.

$$\epsilon_k = |e_k|^q = |\sigma^p - |Z_k|^p|^q \rightarrow \text{minimize} \quad (9)$$

This equation represents desired demodulation level, in which p and q indicate multiplying numbers in the CMA. An updating equation for estimating $W_k$ can be represented as the following equation (10).

$$w_i(k) = w_i(k) + \mu |e_k|^{q-2} e_k |Z_k|^{p-2} \left[\frac{\partial Z_k^T}{\partial w_i} Z_k + Z_k^T \frac{\partial Z_k}{\partial w_i}\right] \quad (10)$$

$$i = 1, 2, 3$$

In this equation, $\mu$ is a constant ($0<\mu<1$) called step size parameter. The partial differentiation terms in the equation (10) can be obtained analytically if function form of the low-pass filter is known. However, in this example, perturbation method is used such that the above-mentioned algorithm can be applied to more general function. That is, the partial differentiation term of the equation (10) is obtained in the following way, $$\frac{\partial Z_k}{\partial w_i} = Z_k(w_i(k) + \Delta w) - Z_k(w_i(k) + \Delta w) \quad (11)$$

wherein $Z_k(W_i(k)+\Delta w)$ represents output signal $Z_k$ of the low-pass filters 215, 216 when i-th element of the error correction matrix $W_k$ at time k is increased by $\Delta w$ (which will be called perturbation coefficient hereinafter).

Therefore, optimal $W_k$ is estimated by calculating the equations (8.1)~(11) repeatedly. Since the algorithm is based on the blind algorithm CMA basically, it is robust to a carrier frequency error and a sampling timing error in addition that training signal is not necessary. Therefore, there is an advantage in that the receiver can operate before establishing carrier frequency synchronization and sampling timing synchronization. That is, in an environment where CIR is minus several tens dB, it is difficult to perform such synchronization. Therefore, a system which uses the training signal can not estimate training timing so that the system can not perform communication. On the other hand, by using the above-mentioned algorithm, convergence can be completed before establishing synchronization. Therefore, when a signal is used in which CIR (Carrier to Interference Ratio) after convergence is improved, it becomes easy to establish synchronization so that communication can be performed.

Next, normalization of the perturbation item will be described.

The before mentioned algorithm should operate under intense interference. For example, it needs to operate stably under an environment in which CIR is minus several tens dB. That is, in such environment, too large interference wave with respect to desired signal is input. In such environment, large partial differentiation term appears for even a small $\Delta w$ change in the equation (11). At this time, danger of divergence increases in the equation (10). In addition, large estimation error always occurs even when it does not diverge. Thus, to avoid this problem, $\Delta w$ is normalized by input power. That is, the following equation is used, $$\Delta w = \Delta w_0 \frac{\sigma^2}{E[Z^T Z]} \quad (12)$$

wherein $\Delta w_0$ is a perturbation coefficient when a power same as desired input power $\sigma^2$ is input. Accordingly, it should be noted that convergence becomes slow when signal power larger than the desired power is input regardless of whether it is desired signal or interference signal.

$W_k G$ in the equation (8.1) is expanded in the following way by using matrix $I, \bar{I}, J, \bar{J}$, $$W_k G = c_0(k) I + c_1(k) \bar{I} + c_2(k) J + c_3(k) \bar{J} \quad (13)$$

wherein $c_0(k) \sim c_3(k)$ are scalars and the matrices used for the expansion are defined as follows.

$$I = \begin{pmatrix} 1 & 0 \\ 0 & 1 \end{pmatrix}, \bar{I} = \begin{pmatrix} 1 & 0 \\ 0 & -1 \end{pmatrix}, J = \begin{pmatrix} 0 & 1 \\ 1 & 0 \end{pmatrix}, \bar{J} = \begin{pmatrix} 0 & 1 \\ -1 & 0 \end{pmatrix} \quad (14)$$

There is a following relationship between these matrices.

$$LPF[F_k^{(1)} I F_k^{(0)}] = I, \ LPF[F_k^{(1)} I F_k^{(1)}] = O \quad (15.1)$$

$$LPF[F_k^{(1)} \bar{I} F_k^{(0)}] = 0, \ LPF[F_k^{(1)} \bar{I} F_k^{(1)}] = \bar{I} \quad (15.2)$$

$$LPF[F_k^{(1)} J F_k^{(0)}] = 0, \ LPF[F_k^{(1)} J F_k^{(1)}] = J \quad (15.3)$$

$$LPF[F_k^{(1)} \bar{J} F_k^{(0)}] = \bar{J}, \ LPF[F_k^{(1)} \bar{J} F_k^{(1)}] = O \quad (15.4)$$

In (15.1)~(15.4), O represents a null matrix, that is, a matrix where every element is 0. By using the relationship (15.1)~(15.4), the equation (8.1) can be rewritten as follows wherein a relationship $c_2(k)=c_3(k)$ is used according to the definition equations of $W_k$ and $G$.

$$E\left[\frac{\partial e_k}{\partial w_i}\right] = E\left[e_k\left(\frac{\partial Z_k^T}{\partial w_i}Z_k + Z_k^T\frac{\partial Z_k}{\partial w_i}\right)\right] \quad (16)$$

$$= \sigma^2\left(\frac{\partial \alpha(k)}{\partial w_i}|X_k^{(0)}|^2 + \frac{\partial \beta(k)}{\partial w_i}|X_k^{(1)}|^2\right)$$

$$-\{(\alpha(k)|X_k^{(0)}|^2 + \beta(k)|X_k^{(1)}|^2) \cdot$$

$$\left(\frac{\partial \alpha(k)}{\partial w_i}|X_k^{(0)}|^2 + \frac{\partial \beta(k)}{\partial w_i}|X_k^{(1)}|^2\right) +$$

$$2(X_k^{(1)})^T(x(k)\bar{I} + \gamma(k)J)X_k^{(0)}(X_k^{(0)})^T \cdot$$

$$\left(\frac{\partial x(k)}{\partial w_i}\bar{I} + \frac{\partial \gamma(k)}{\partial w_i}J\right)X_k^{(1)} +$$

$$2(X_k^{(0)})^T(x(k)\bar{I} + \gamma(k)J)X_k^{(1)}(X_k^{(1)})^T \cdot$$

$$\left(\frac{\partial x(k)}{\partial w_i}\bar{I} + \frac{\partial \gamma(k)}{\partial w_i}J\right)X_k^{(0)}\} = 0$$

In the equation (16), $\alpha(k)$, $\beta(k)$, $\chi(k)$, $\gamma(k)$ can be defined as follows.

$$\alpha(k)=(c_0(k))^2+(c_2(k))^2 \quad (17.1)$$

$$\beta(k)=(c_1(k))^2+(c_2(k))^2 \quad (17.2)$$

$$\chi(k)=c_0(k)c_1(k)-(c_2(k))^2 \quad (17.3)$$

$$\gamma(k)=c_0(k)c_2(k)+c_1(k)c_2(k) \quad (17.4)$$

In addition, $|Z|^2=Z^TZ$. For derivation of the equation (16), uncorrelativeness between interference signals is used. In addition, statistically there is no correlation between the I channel signal and the Q channel signal even between the same channel, by using this, it can be understood that a sufficient condition is to satisfy the following simultaneous equations in order to satisfy the equation (16) for all $i=1\sim3$.

$$\sigma-\alpha(k)|X_k^{(0)}|^2-\beta(k)|X_k^{(1)}|^2=0 \quad (18.1)$$

$$\chi(k)=0 \quad (18.2)$$

$$\gamma(k)=0 \quad (18.3)$$

There exists a trivial solution $c_0(k)=c_1(k)=c_2(k)=0$. This corresponds to a case in which the low-pass filters 215, 216 do not output anything. Therefore, this solution corresponds to the maximum value. Another solution is $c_2(k)=0$, $c_0(k)c_1(k)=0$. As is understood from the equation (18.1), this solution corresponds that only either one of the interference wave or the desired wave is output. That is, according to the algorithm of the present invention, only desired wave can be extracted from the interference wave.

On the other hand, from the definition of $W_k$ and $G$ and the equation (13), $c_0(k)\sim c_2(k)$ can be represented as the following equation using coefficients of the orthogonality error matrix $G$ and the error correction matrix $W_k$.

$$c_0(k) = \frac{1}{2}(w_1(k)g_I\cos(\phi) + w_3(k)g_Q) \quad (19.1)$$

$$c_1(k) = \frac{1}{2}(w_1(k)g_I\cos(\phi) - w_3(k)g_Q) \quad (19.2)$$

$$c_2(k) = \frac{1}{2}(-w_1(k)g_I\cos(\phi) + w_2(k)g_I) \quad (19.3)$$

Therefore, when the solution is $c_1(k)=c_2(k)=0$ which is most useful, the error correction matrix $W_k$ can be represented as follows.

$$w_1(k) = \pm\frac{\sigma}{A^{(0)}}\frac{1}{g_I\cos(\phi)} \quad (20.1)$$

$$w_2(k) = \pm\frac{\sigma}{A^{(0)}}\frac{\tan(\phi)}{g_I} \quad (20.2)$$

$$w_3(k) = \pm\frac{\sigma}{A^{(0)}}\frac{1}{g_Q} \quad (20.3)$$

It can be easily checked by the equation (21) that the equations (20.1)~(20.3) have desired values.

$$W_kG = \pm\frac{\sigma}{A^{(0)}}I \quad (21)$$

Next, a computer simulation for verifying characteristics of the above algorithm will be shown. In this simulation, QPSK is used as the modulation method, and AWGN (Additive White Gaussian Channel) is used for transmission line. In addition, it is assumed that the interference signal and the desired signal are of the same system. For demodulation, a synchronous detector is used. In addition, in order to avoid effects from other synchronization systems, it is assumed that the carrier frequency and the clock synchronization are complete.

Figure 14:
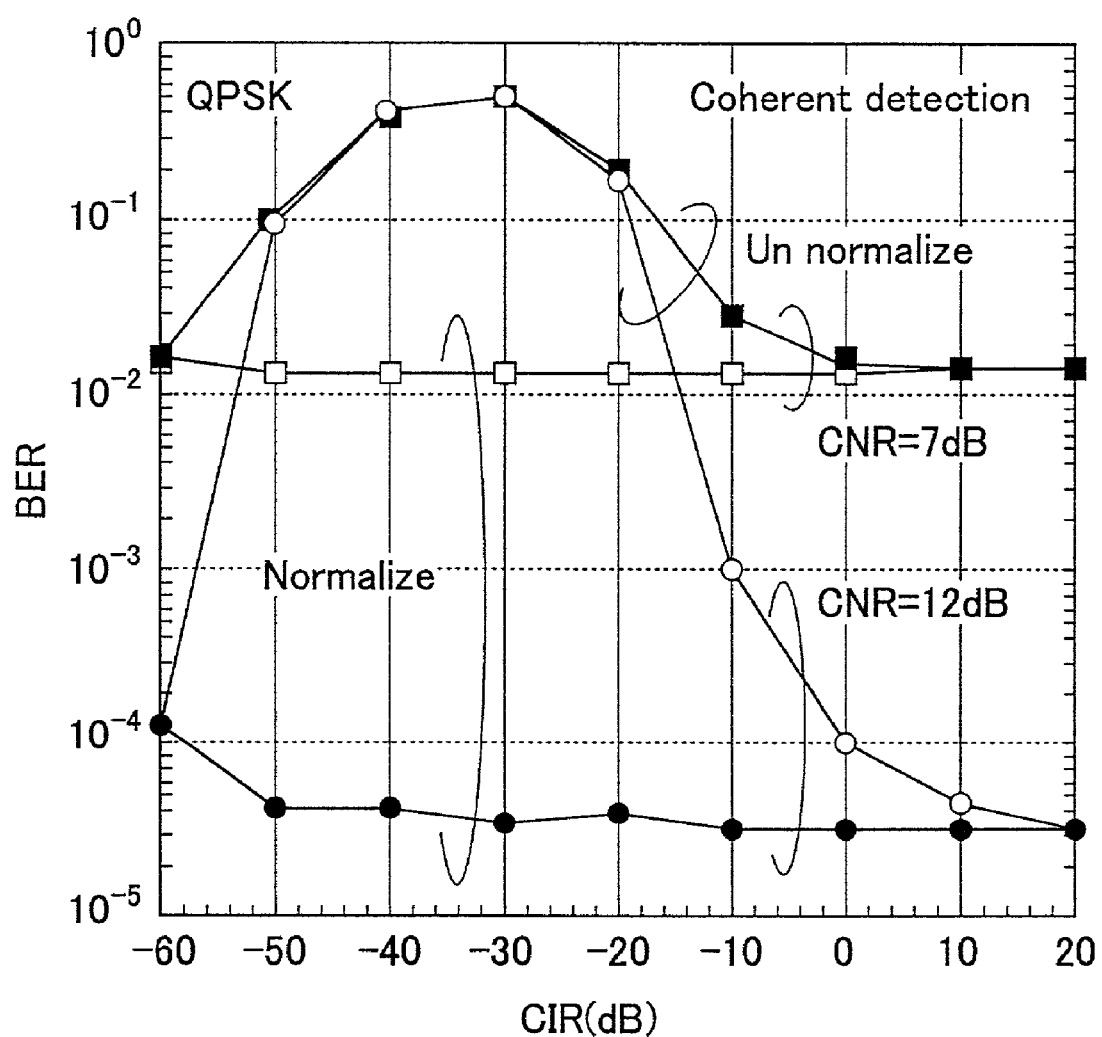
FIG. 14 shows result of comparison of characteristics between performing normalization and not performing normalization.

FIG. 14 shows comparison of characteristics between performing normalization and not performing normalization when there is 10° orthogonality error in the quasi-coherent detector in RF band in the receiver.

In this example shown in FIG. 14, it is assumed that CNR=7 dB, 12 dB and a quadrature modulator in the send side is ideal. In addition, the perturbation coefficient is decided such that convergence occurs stably even when CIR=−60 dB for unnormalized algorithm in order to avoid divergence.

When CIR is large, significant difference is not observed between the two cases. However, when CIR becomes smaller than −10 dB, interference can not be suppressed for the unnormalized case. When CIR=−30 dB, error rate comes closer to 0.5 for the unnormalized case. After that, error rate is improved gradually. On the other hand, as for normalized algorithm, almost flat characteristic over CIR=20 dB~−60 dB is observed. Therefore, the characteristic will be verified by using the algorithm in which normalization is performed hereinafter.

First, effects of orthogonality error in the send side will be described.

Figure 15:
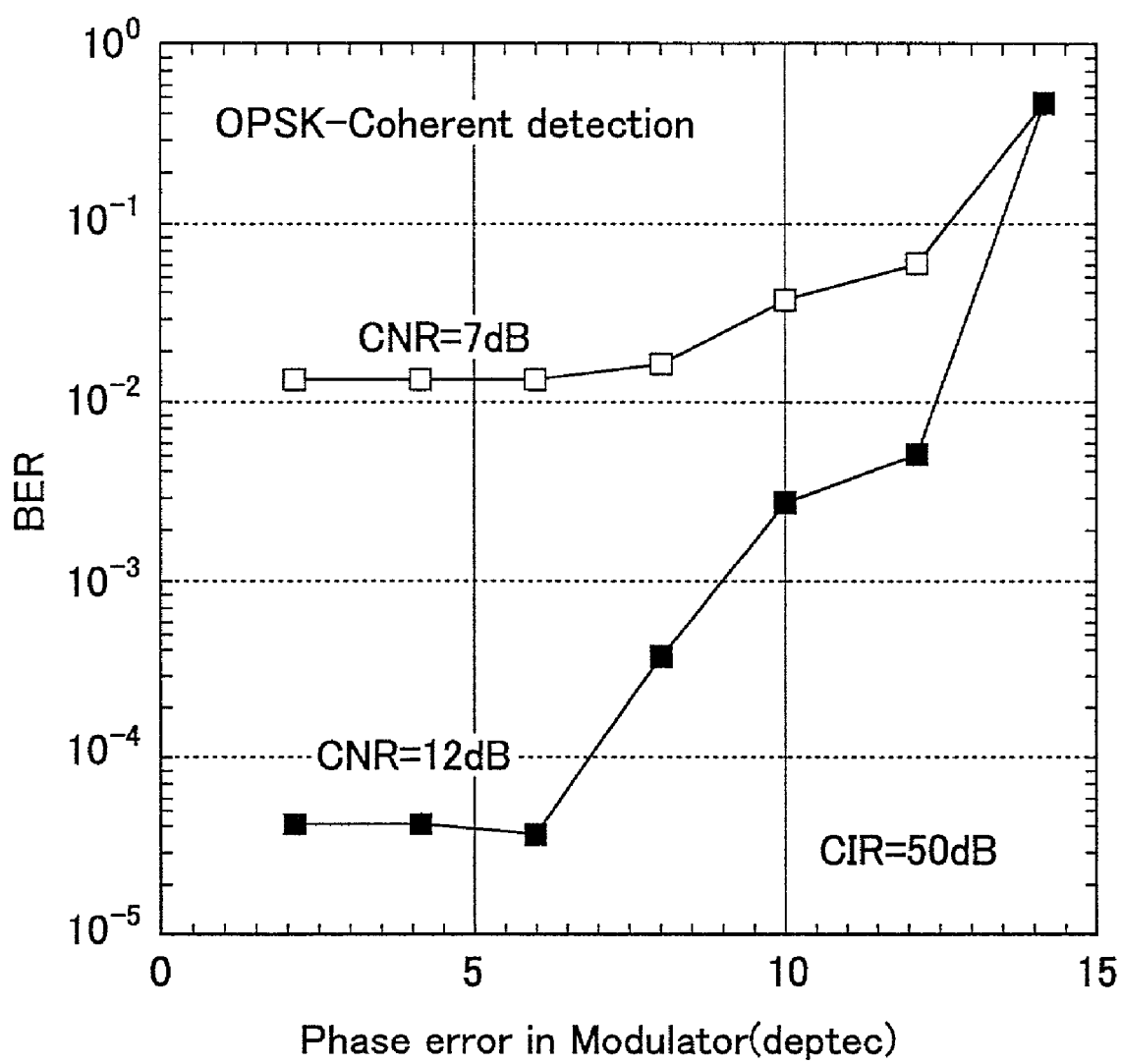
FIG. 15 shows effect of orthogonality error in the modulator in the send side.

Characteristic of the orthogonality error of the modulator in the send side is shown in FIG. 15. In this simulation, it is assumed that CIR=−50 dB, CNR=7 dB, 12 dB and also the orthogonal quasi-coherent detector of the receiver side has 10° orthogonality error. As shown in the figure, the characteristic is not changed before about 6° of the send side orthogonality error. However, when the orthogonality error becomes more than that, the characteristic is worsened suddenly. Considering that CIR=−50 dB, the degradation of the characteristic is considered to be degradation due to the orthogonality error of send side modulator. That is, it can be understood that interference is removed almost completely even if there is the orthogonality error of send side modulator.

Next, BER characteristic will be described.

Figure 16:
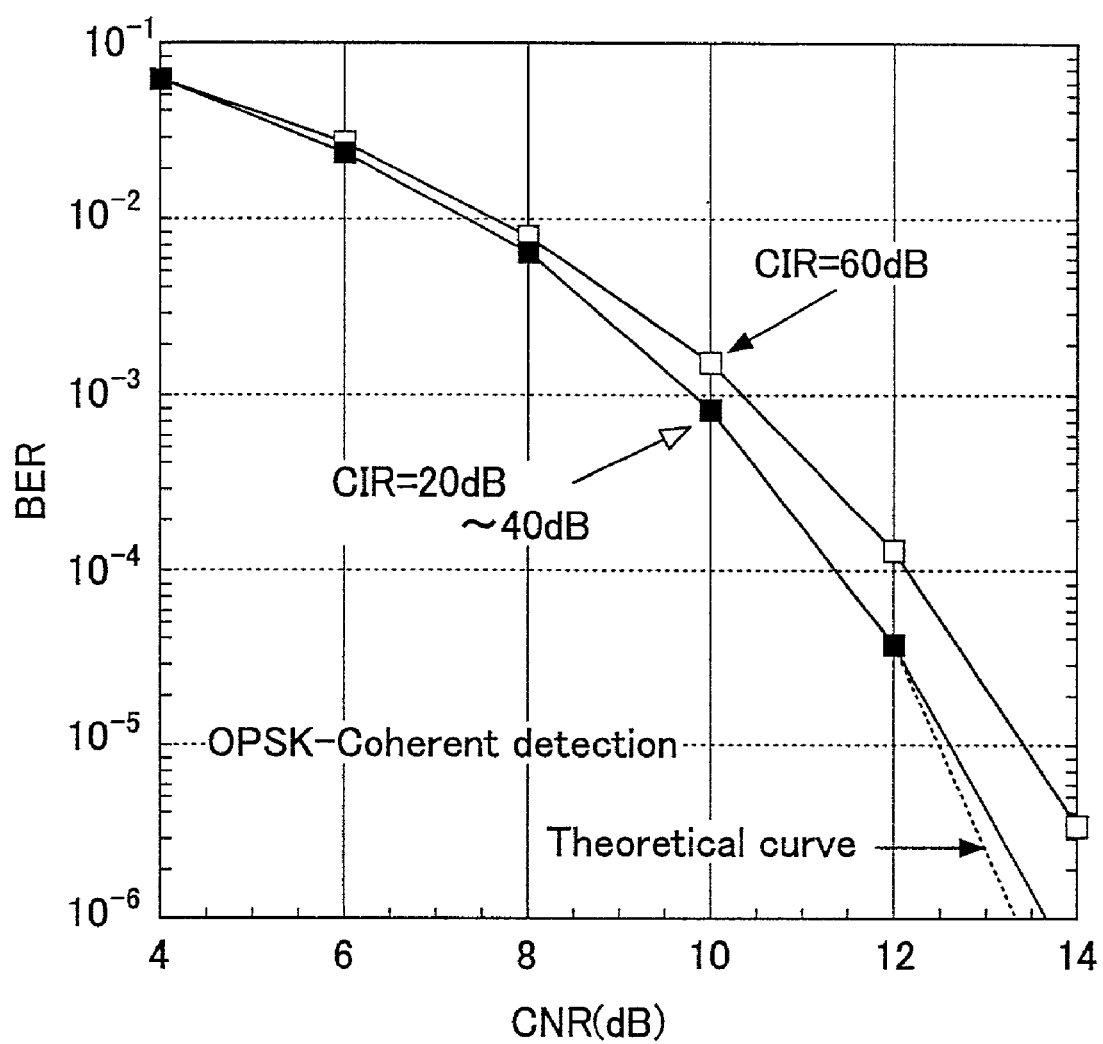
FIG. 16 shows BER characteristic according to embodiment 1-3.

FIG. 16 shows the BER characteristic when 10° of the orthogonality error of orthogonal quasi-coherent detector in RF band in the receiver side exists and CIR=20 dB~−60 dB. In the figure, it is assumed that the quadrature modulator of the send side is ideal. As shown in the figure, BER is almost the same as BER of synchronous detection theory when CIR=20 dB~40 dB. When CIR=−60 dB, degradation by a little more than 0.5 dB is observed at the point of BER=$10^{-4}$. This degradation is common to SGD (Stochastic Gradient Decent) algorithms. The value can be brought to near the theoretical value by setting the step size parameter and $\Delta w_0$ to be small.

[Embodiment 1-4]

As for the above-mentioned embodiments, since it is assumed that control is performed by symbol space, there is a problem in that characteristics are degraded by the sampling timing. This is because symbol space sampling does not satisfy the sampling theorem. In this embodiment, a configuration for solving this problem will be described.

Figure 17:
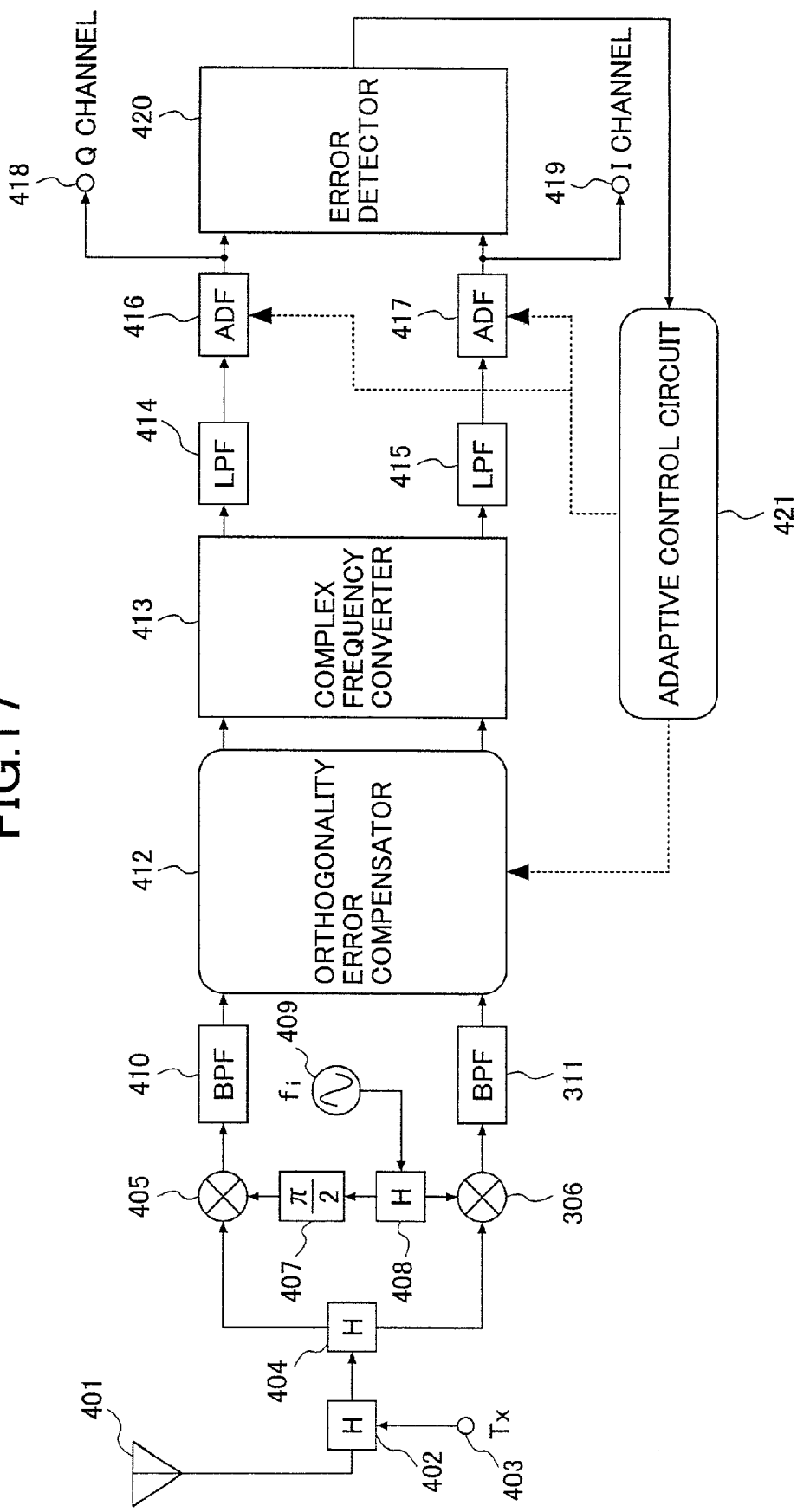
FIG. 17 shows a configuration of a receiver according to an embodiment 1-4 of the present invention.

FIG. 17 shows a configuration of a receiver according to the embodiment 1-4 of the present invention.

The receiver shown in the figure includes a receive antenna 401, an antenna sharing part 402, a send signal input terminal 403, branch circuits 404, 408, multipliers 405, 406, a π/2 phase shifter 407, a synthesizer 409, band-pass filters (BPF) 410, 411, orthogonality error compensator 412, complex frequency converter 413, adaptive digital filters 416, 417, modulated signal output terminals 418, 419, an error detector 420 and an adaptive control circuit 421.

According to this configuration, until the adaptive digital filters 416, 417, processing is performed in a rate more than two times of the Nyquist rate, or, analog signal processing is performed. Then, the outputs are sampled by the symbol rate and information symbols are demodulated. Then, modulated signals are output from the modulated signal output terminals 418, 419.

On the other hand, the error detector 420 detects difference between the sampled signal and a predetermined value. Then, it outputs the detected value to the adaptive control circuit 421. The adaptive control circuit 421 controls not only the orthogonality error compensator 412 but also adaptive digital filters 416, 417 such that the signals sampled at the output of the adaptive digital filters 416, 417 become a predetermined sampling phase.

Figure 18:
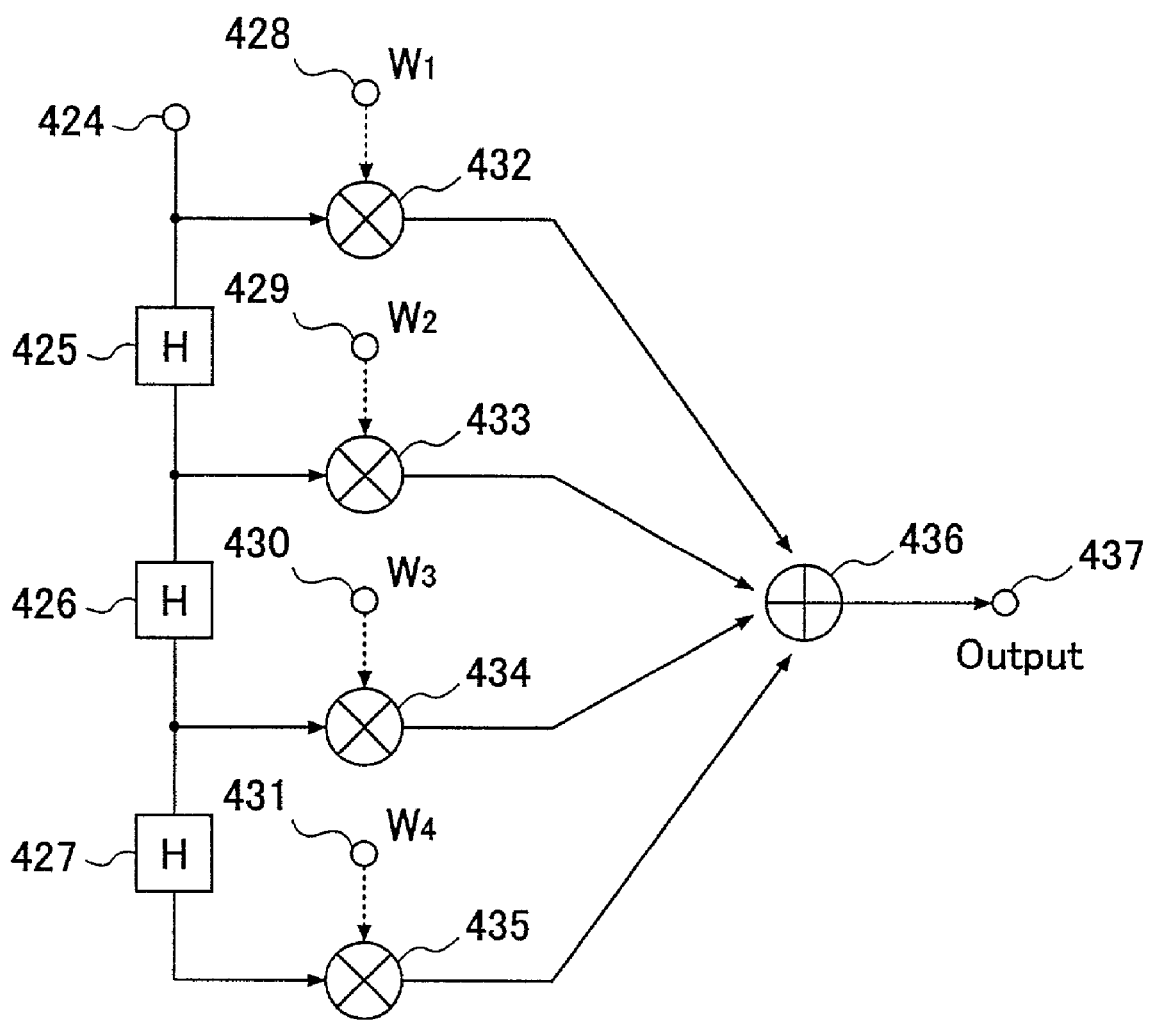
FIG. 18 shows an adaptive digital filter according to the embodiment 1-4 of the present invention.

FIG. 18 shows the adaptive digital filter according to the embodiment 1-4 of the present invention.

The adaptive digital filter shown in the figure includes a signal input terminal 424, delay elements 425~427, multipliers 432~435, coefficient input terminals 428~431, an adder 436 and an output terminal 437.

When using the adaptive digital filter shown in the figure, the adaptive control circuit 421 performs control as follows wherein multiplying coefficients (tap coefficients) of the adaptive digital filters 416, 417 are assumed to be Hk= [hk,0, hk,1, . . . , hk,L−1]$^T$.

$$Hk=Hk-1+\mu_h|ek|^{q-2}ek|vk|^{p-2}vk \cdot Uk \quad (22)$$

In this equation, Uk=[zk , zk,1, . . . , zk-L+1]$^T$ is a vector having outputs of the low-pass filters 414, 415 as its elements, $\mu_h$ is a step size parameter for the tap coefficients. In addition, vk is output of the adaptive digital filters 416, 417 which can be represented as the following equation $$vk=Hk^H Uk \quad (23).$$

At this time, the coefficients of the orthogonality error compensator 412 are updated by the following equation, $$wi(k)=wi(k)+\mu|ek|^{q-2}ek|vk|^{p-2}\Delta i\, vk \quad (24)$$

where $$\Delta i\, vk=vk(wi(k)+\Delta w)-vk(wi(k)) \quad (25).$$

At this time, following equation should be satisfied for step size $\mu h$ for tap coefficients and step size $\mu$ for orthogonality error and gain imbalance compensation.

$$\mu=\mu h \Delta w\, m \quad (26)$$

Figure 19:
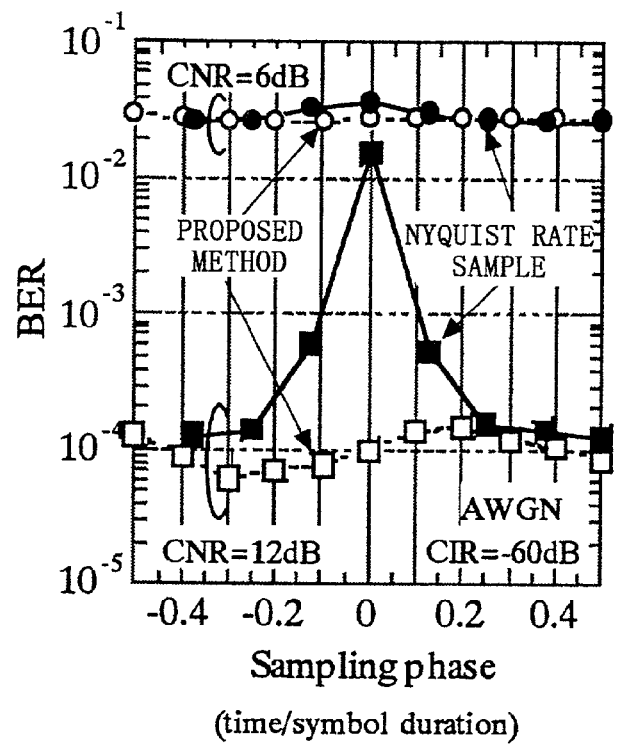
FIG. 19 shows error characteristic with respect to sampling phase error in the configuration shown in FIG. 17.

It becomes possible to more stabilize the algorithm by normalizing the step size parameter as shown in the following equation, $$\mu = \mu_0 \frac{\sigma^2}{E[Y^H Y]} \quad \mu_h = \mu_0 \frac{\sigma^2 \Delta w}{E[Y^H Y]} \quad (27)$$

wherein $\mu_0$ indicates the step size parameter, in the true sense, which is not normalized. FIG. 19 shows error characteristic with respect to sampling phase error in the configuration shown in FIG. 17. FIG. 19 shows characteristic in AWGN channel in CIR=−60 dB. In addition, normalized algorithm is used for controlling in CNR=6 dB, 12 dB. And, in the figure, characteristics of symbol interval sampling are shown for comparison.

As shown in the figure, BER is largely degraded near the error 0 for the Nyquist rate sampling. On the other hand, according to this embodiment, it is understood that good transmission characteristics can be obtained irrespective of sampling phase.

Figure 20:
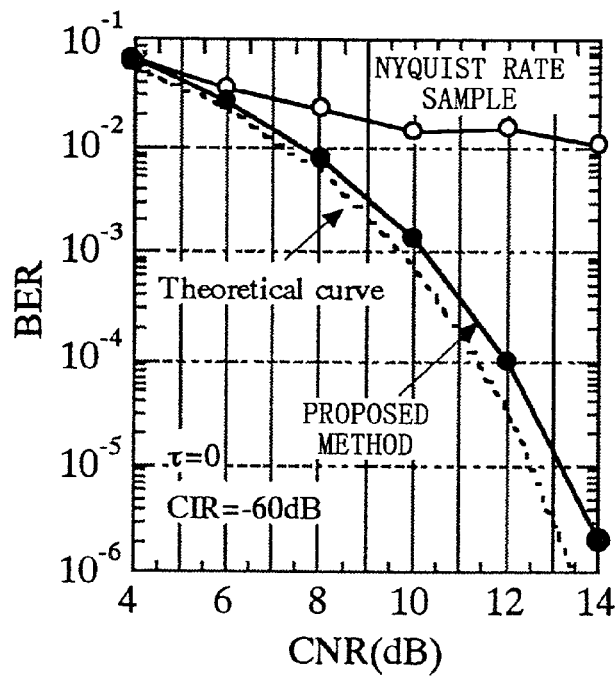
FIG. 20 shows CNR to BER characteristic at error 0 shown in FIG. 19.

FIG. 20 shows CNR to BER characteristic at error 0 shown in FIG. 19. In FIG. 20, same parameters as those of FIG. 19 except for CNR and sampling phase are used. In addition, theoretical characteristic when there is no interference wave is shown.

As shown in the figure, floor error occurs in about BER=$10^{-2}$ for the Nyquist rate sampling. On the other hand, according to the present invention, it can be recognized that good transmission characteristic having degradation within 1 dB from the theoretical characteristic is achieved.

A conventional image frequency interference compensator can perform interference compensation even under bad CIR condition by blind operation. However, there is a problem in that the characteristic degrades according to the sampling timing. On the other hand, by applying the present invention, stable demodulation characteristic can be obtained under the bad CIR condition irrespective of sampling phase error. Since the algorithms of 1—1 to 1-3 embodiments have low sensitivity also to frequency offset and phase error of the demodulated signal, stable demodulation characteristic can be obtained by complete blind operation by applying the configuration of the embodiment 1-4.

As mentioned above, according to the present invention, orthogonality error and gain imbalance of the analog quasi-coherent detector can be adaptively compensated over a wide frequency band by placing the orthogonality error and gain imbalance compensator after the analog/digital converter. Therefore, signals from the image frequency band can be removed accurately over a wide band. Thus, communication can be possible without SNR degradation even when the band of the band-pass filter of carrier band is widened. Accordingly, since one receiver can receive signals from various systems in high quality, it becomes possible to obtain advanced terminals and base stations. Therefore, there are immeasurable advantages in that a kind of terminal can use various services and a kind of base station can provide various services. Accordingly, development cost decreases and large value can be added to the terminal.

Generally, it is difficult for the π/2 phase shifter in the quasi-coherent detector to keep phase shift characteristics over a wide band. On the other hand, according to the present invention, since orthogonality error and gain imbalance are compensated adaptively, interference compensation can be performed accurately over the whole band. Therefore, the receiver of the present invention can support all signals which pass through the band-pass filter or different frequency signals flexibly. That is, the present invention provides the receiver with flexibility for utilizing various signals of various systems.

In addition, according to the present invention, interference from the image frequency band can be removed by complete blind operation when the receiver receives signals from different systems placed in different wireless frequency bands. Then, after that, the problems of degradation by the interference and difficulty of synchronization are solved on the whole by performing normal demodulation operation. That is, by applying the present invention, since one receiver can receive signals of different wireless systems, the hardware size can be decreased and variety of services can be remarkably increased.

[Second Embodiment]

The objective of the present invention can be also achieved by the following second embodiment.

Figure 21:
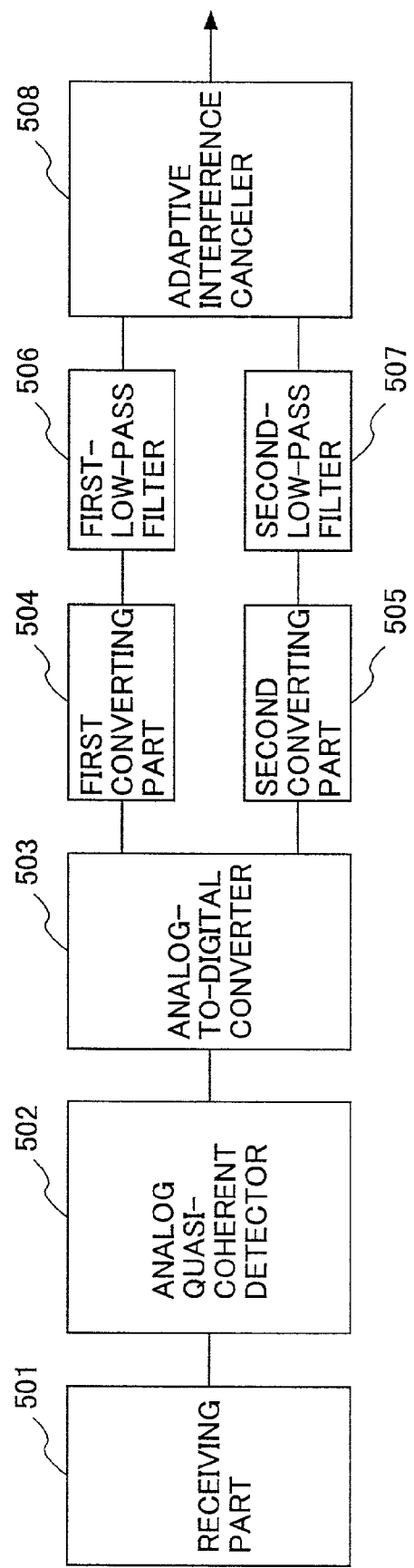
FIG. 21 shows a principle configuration of a second embodiment of the present invention.

FIG. 21 shows a principle configuration of a receiver of the second embodiment of the present invention.

The receiver includes a receiving part 501 which receives a receive signal converted into a carrier band, an analog quasi-coherent detector 502 which performs analog quasi-coherent detection on the receive signal and outputting in-phase and quadrature signals, an analog-to-digital converter 503 which performs analog-to-digital conversion on the in-phase and quadrature signals, a first converting part 504 which converts the first in-phase and quadrature signal into a complex baseband signal by a first analytic signal, a second converting part 505 which converts the second in-phase and quadrature signal into a complex baseband signal by a second analytic signal, a first low-pass filter 506 which removes high frequency band components from the first in-phase and quadrature signal, a second low-pass filter 507 which removes high frequency band components from the second in-phase and quadrature signal, an adaptive interference canceler 508 which receives the first in-phase and quadrature signal-passed through the first low-pass filter and the second in-phase and quadrature signal passed through the second low-pass filter, and removes interference components included in the first in-phase and quadrature signal and the second in-phase and quadrature signal.

Figure 22:
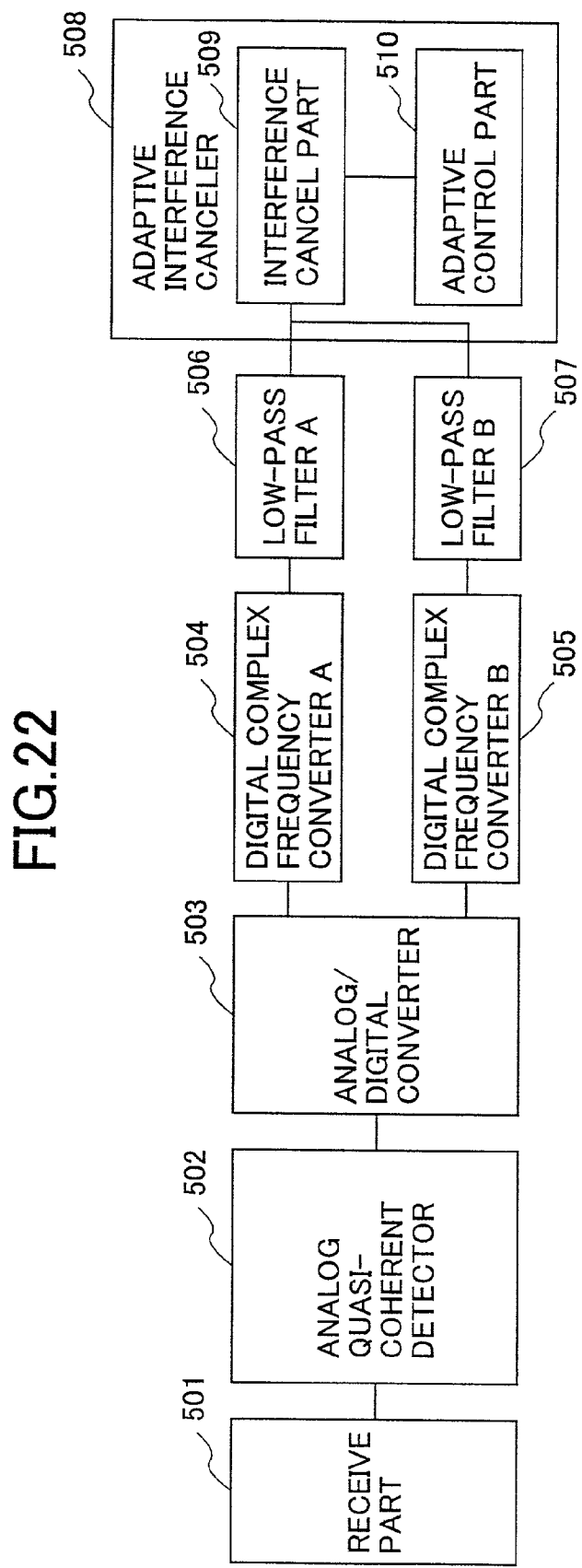
FIG. 22 shows a schematic diagram of a receiver of the second embodiment.

FIG. 22 shows a schematic diagram of a receiver of this embodiment. The configuration shown in this figure is almost the same as that of FIG. 22, however, the configuration of FIG. 22 is described more concretely. The receiver includes a receive part 501, an analog quasi-coherent detector 502, an analog/digital converter 503, digital complex frequency converter A504, B504, low-pass filters A506, B507, an adaptive interference canceler 508.

In this receiver, a wireless signal in the carrier band is frequency-converted to IF band Δf which is capable of analog/digital conversion by the analog quasi-coherent detector 502. The quadrature/in-phase signals which are output from the analog quasi-coherent detector 502 are converted to digital signals by the analog/digital converter 503. Then, the converted signals are divided. One of the divided signals is multiplied by analytic sine wave having −Δf frequency band by the digital complex frequency converter A504 and passes through the low-pass filter A506. Another divided signal is multiplied by analytic sine wave having Δf frequency band by the digital complex frequency converter B505 and passes through the low-pass filter B507. Then, outputs from the low-pass filters are input to the adaptive interference canceler 508 so that interference components are removed and a high quality signal is obtained.

The adaptive interference canceler 508 includes an interference cancel part 509 and an adaptive control part 510 for controlling coefficients used in the interference cancel part 509. The interference cancel part 509 receives output signals from the low-pass filters A506, B507, and separates desired frequency band components and interference signal components which are included in the signals. Then, the interference cancel part 509 outputs necessary signal hereinafter. That is, the interference cancel part 509 separates the desired frequency band components and the interference signal components by performing orthogonalization. The separated signal set is output as signals which are not affected by interference.

The adaptive control part 510 estimates coefficients used for the orthogonalization in the interference cancel part 509 according to fluctuations of orthogonality due to variations of carrier frequency. Any control algorithm can be used for the estimation as long as the control algorithm can be applied to an adaptive equalizer or an adaptive array. For example, an LMS (Least Mean Square) algorithm having relatively low complexity, an RLS (Recursive Least Squares) algorithm, a blind algorithm and a CMA (Constant Modulus Algorithm) can be used.

When band of the band-pass filter of the carrier band is widened, as shown in the equation (1), a signal of f−Δf band is mixed to signal band when frequency conversion is performed in a local oscillator of oscillation frequency f for receiving f+Δf band signal. In order to avoid this problem, the signal of the carrier band is converted to IF frequency band by orthogonal quasi-coherent detection. As for the signal which is converted to an analytic form, minus frequency band signal and plus frequency band signal can be identified in principle. That is, frequency band components of f− Δf band and frequency band components of f+Δf band can be identified. Therefore, only the components of f+Δf band are converted to baseband by multiplying output of the orthogonal quasi-coherent detector by analytic sine wave having −Δf frequency band. Therefore, only a signal of f+Δf band can be obtained by outputting via the low-pass filter A.

In addition, only the components of f−Δf band are converted to baseband by multiplying output of the orthogonal quasi-coherent detector by analytic sine wave having −Δf frequency band. Therefore, only a signal of f−Δf band can be obtained by outputting via the low-pass filter B. In actuality, image frequency band components are output from the low-pass filter A in addition to the desired frequency band components due to incompleteness of the analog quasi-coherent detector. Likewise, the desired frequency band components are output from the low-pass filter B in addition to image frequency band components. The adaptive interference canceler 508 which is provided after the low-pass filters A506 and B507 separates the desired signal and the interference wave signal so that signals of f+Δf band and f−Δf band can be obtained.

The adaptive interference canceler 508 receives the output of the low-pass filter A506 and the output of the low-pass filter B507, and performs processing such that the desired signal components and the interference components are orthogonalized. As a result, the desired signal and the interference signal which do not interfere with each other can be obtained. Or, the desired signal and the interference signal can be obtained by estimating and outputting two frequency band components included in the input signal. This estimation is performed by the adaptive control part 510.

Specifically speaking, an adaptation algorithm (S. Haykin: "Adaptive filter Theory, 3 $^{rd}$ed.,", Prentice-Hall International Edition, 1996) which can be applied to an adaptive equalizer and an adaptive algorithm is used.

[Embodiment 2-1]

Figure 23:
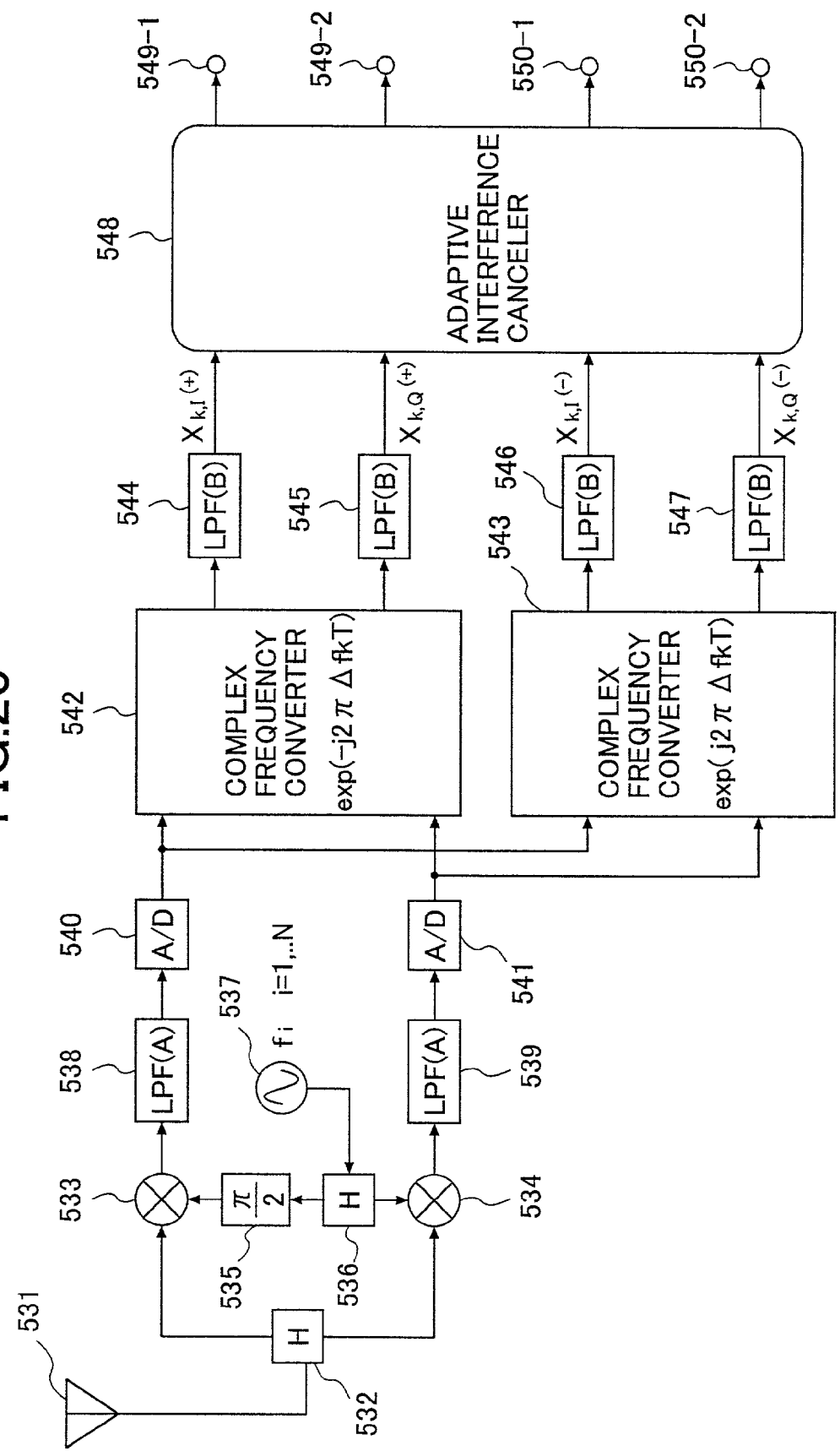
FIG. 23 shows a configuration of a receiver of an embodiment 2-1 of the present invention.

FIG. 23 shows a configuration of a receiver of the embodiment 2-1 of the present invention.

The receiver includes an antenna 531, analog multipliers 533, 534, branch circuits 532, 536, a π/2 phase shifter 535, an oscillator 537, low-pass filters 538, 539, 544~547, analog/digital converters 540, 541, complex frequency converters 542, 543, an adaptive interference canceler 548 and output terminals 549-1, 549-2, 550-1, 550-2.

In the following, the operation of the configuration will be described.

An signal received by the antenna 531 passes through an analog orthogonal quasi-coherent detector which includes the analog multipliers 533, 534, the branch circuits 532, 536, the π/2 phase shifter 535 and the oscillator 537. Then, higher harmonic components are removed from the signals by the low-pass filters 538, 539, and the signals are converted into digital signals by analog/digital converters 540, 541. The outputs from the analog/digital converters are input into the complex frequency converters 542, 543.

The complex frequency converter 542 multiplies the input signals by analytic sine wave having minus IF frequency band. Outputs of the complex frequency converter 542 are input to the adaptive interference canceler 548 via the low-pass filters 544, 545. Likewise, the complex frequency converter 543 multiplies the input signals by analytic sine wave having plus IF frequency band. Outputs of the complex frequency converter 543 are input to the adaptive interference canceler 548 via the low-pass filters 546, 547.

The adaptive interference canceler 548 orthogonalizes plus carrier components and minus carrier components so that they are separated. Then, the output terminals 549-1, 549-2 outputs the plus carrier components. In addition, the output terminals 550-1, 550-2 outputs the minus carrier components as necessary.

Figure 24:
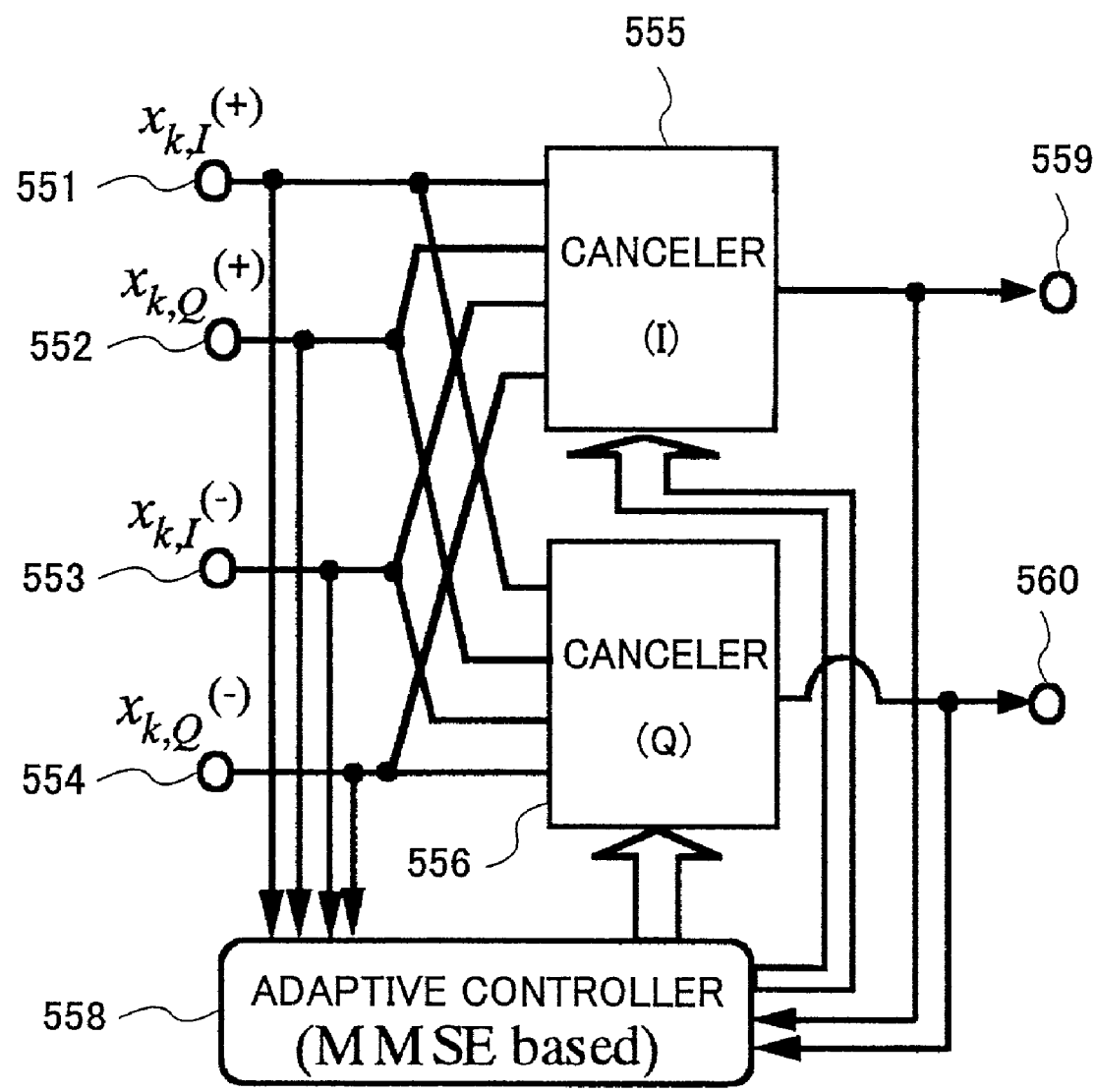
FIG. 24 shows a first-configuration of an adaptive interference canceler according to the embodiment 2-1.

FIG. 24 shows a first configuration of the adaptive interference canceler according to the embodiment 2-1. The adaptive interference canceler is configured to extract only the desired signal from f+Δf band signal and f−Δf band signal. Signal input terminals 551~554 shown in the figure receives outputs from the low-pass filters 544~547 shown in FIG. 23. The signal input terminal 553 is for I channel and the signal input terminal 554 is for Q channel. In addition, the adaptive interference canceler has an adaptive controller 558 and output terminals 559, 560.

In this configuration, input signals from the input terminals 551~554 are divided and the divided signals are input to an interference canceler 555 for the I channel and to an interference canceler 556 for the Q channel. The signals are output from output terminals 559, 560 after interference components are removed.

In the adaptive controller 558, coefficients necessary for the interference canceler are estimated adaptively by using LMS algorithm, RLS algorithm, CMA which is a blind type algorithm. By canceling interference components by using the estimated coefficients, good interference compensation can always be realized even if the carrier band changes.

Figure 25:
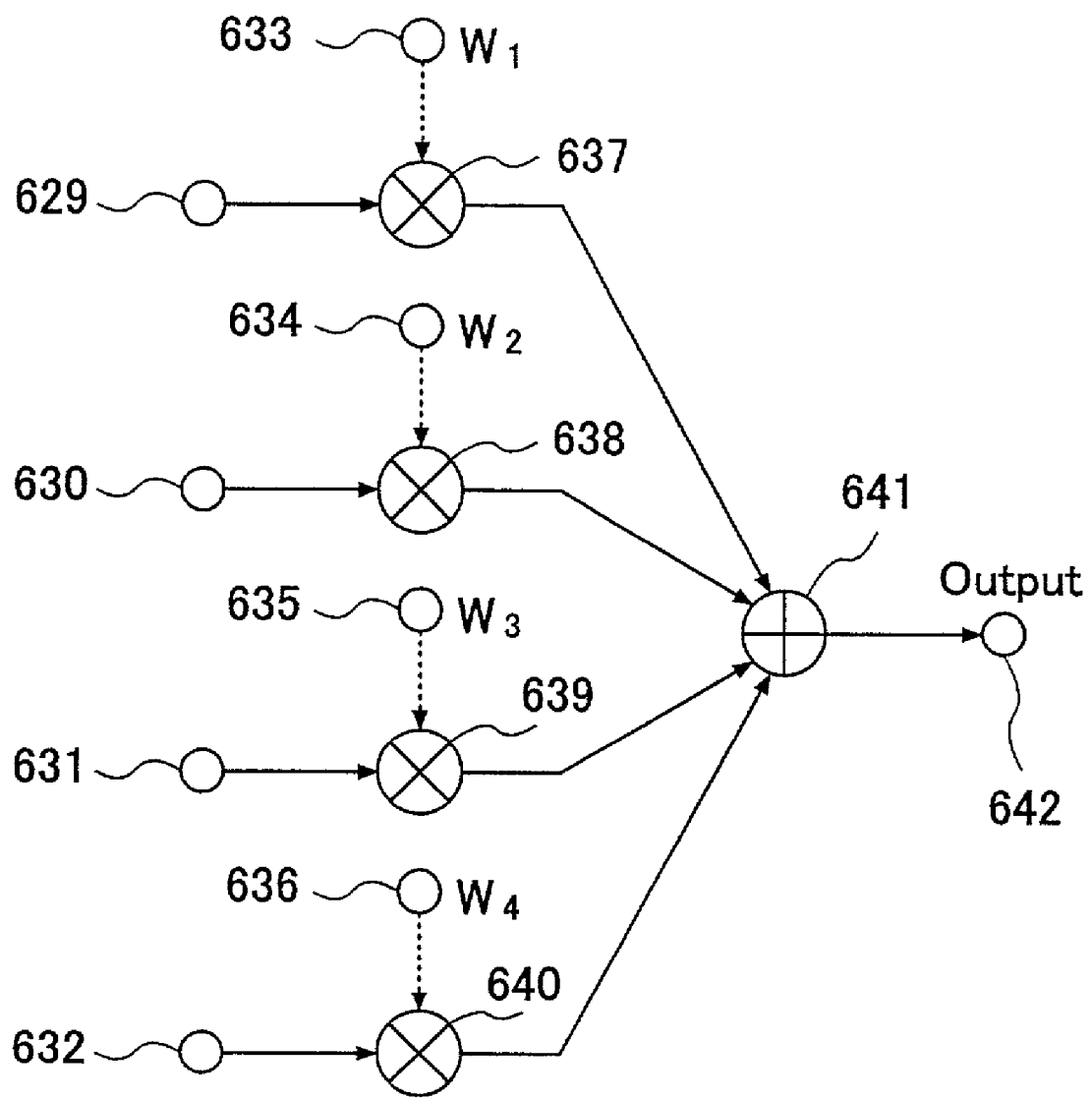
FIG. 25 shows a configuration of an interference canceler.

FIG. 25 shows the configuration of the interference cancelers 555, 556 for the I channel and the Q channel shown in FIG. 24.

The interference canceler includes input terminals 629~632, terminals 633~636 for inputting coefficients estimated in the adaptive controller 558, multipliers 637~640, an adder 641 and an output part 642.

Operations of the configuration of the interference canceler shown in FIG. 25 can be represented by the following equations.

When assuming that $x_{k,i}^{(+)}$ is the output of the low-pass filter 544, $x_{k,q}^{(+)}$ is the output of the low-pass filter 545, $x^{k,i(-)}$ is the output of the low-pass filter 546, $x_{k,q}^{(-)}$ is the output of the low-pass filter 547, output signal $Y_k=[y_{k,i}, y^{k,q}]^T$ of the interference canceler of FIG. 25 can be represented as follows, $$Y_k = \begin{bmatrix} y_{k,i} \\ y_{k,q} \end{bmatrix} = W_k^T X_k \quad (28)$$

wherein subscript k is time, subscript T represents transpose of a vector.

In the equation (28), $X_k=[x_{k,i}^{(+)}, x_{k,q}^{(+)}, x_{k,i}^{(-)}, x_{k,q}^{(-)}]^T$ is the input signal vector in which $W_k$ indicates the following coefficient matrix.

$$W_k = \begin{bmatrix} w_{k,i,i}^{(+)} & w_{k,i,q}^{(+)} & w_{k,i,i}^{(-)} & w_{k,i,q}^{(-)} \\ w_{k,q,i}^{(+)} & w_{k,q,q}^{(+)} & w_{k,q,i}^{(-)} & w_{k,q,i}^{(-)} \end{bmatrix}^T \quad (29)$$

In the equation (29), $w_{k,i,q}^{(-)}$ is weighting coefficient for a signal of I channel side of LPF which outputs f−Δf frequency band components in the interference canceler which outputs Q channel signal. Various algorithms which can be applied to an adaptive equalizer and an adaptive array can be used for the adaptive controller 558. For example, when using LMS algorithm, the adaptive controller 558 performs the following operation, in which $D_k=[d_{k,i}, d_{k,q}]^T$ is send signal of desired band.

$$e_k = D_k - Y_k \quad (30.1)$$

$$W_k = W_{k-1} + \mu Y_k e_k^T \quad (30.2)$$

In the above equation, μ is a coefficient called the step size parameter and $0 \leq \mu \leq 1$. When using the RLS algorithm capable of rapid convergence, the following equations are applied.

$$e_k = D_k - Y_k \tag{31.1}$$

$$K_k = \frac{P_{k-1} X_k}{\lambda + X_k^T P_{k-1} X_k} \tag{31.2}$$

$$W_k = W_{k-1} + K_k e_k^T \tag{31.3}$$

$$P_k = \lambda^{-1}(P_{k-1} - K_k X_k^T P_{k-1}) \tag{31.4}$$

λ in the equations (31.2) and (31.4) is a coefficient called forgetting factor and $0 \leq \lambda \leq 1$. In addition, when using the CMA which is the blind type algorithm, the following equations are applied.

$$e_k = \sigma^p - |Y_k|^p \tag{32.1}$$

$$W_k = W_{k-1} + \mu |e_k|^{q-2} |Y_k|^{p-2} X_k e_k^T \tag{32.2}$$

σ in the equation (32.1) indicates desired signal amplitude and |·| indicates norm of vector.

In addition, p and q are multiplication numbers used in the CMA, normally natural numbers. As for the LMS algorithm of the equations (30.1)~(30.2) and the RLS algorithms of the equations (31.1)~(31.4), desired signal vector becomes necessary. Thus, training series is used or it needs to be obtained by judging the output signal vector $Y_k$. For example, in the case of QPSK modulation, the following equation is used.

$$d_{k,a} = \begin{cases} 1 & sgn(y_{k,a}) > 0 \\ -1 & sgn(y_{k,a}) \leq 0 \end{cases} \quad a = i \text{ or } q \tag{33}$$

As for the blind algorithm like the CMA, the processing as equation (33) is not necessary.

Figure 26A:
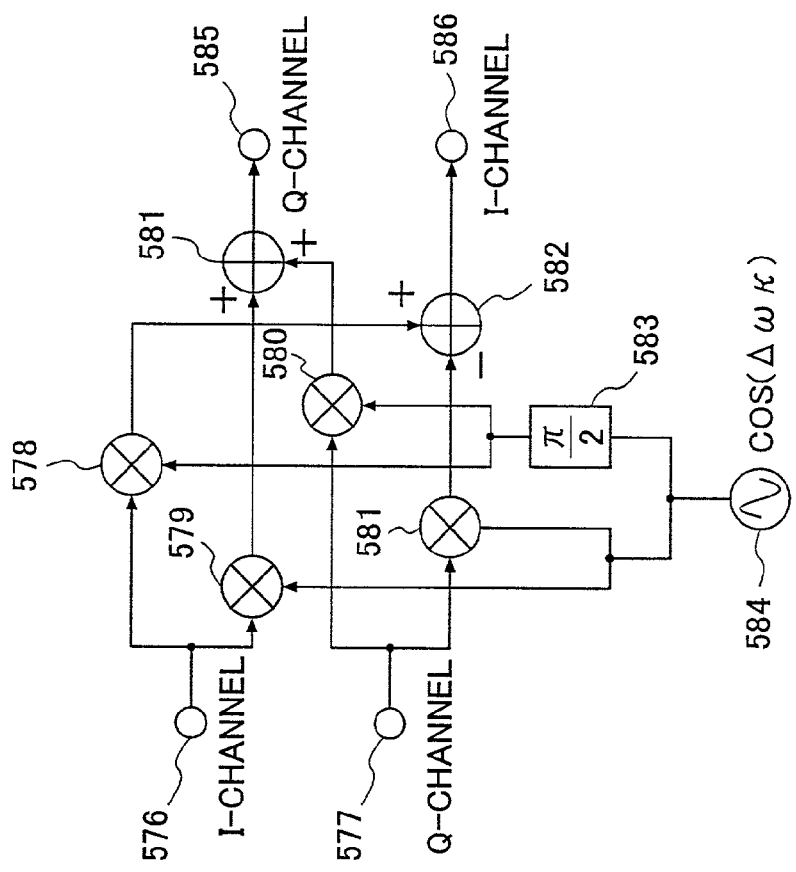
FIG. 26A shows a configuration of a complex frequency converter which multiplies by analytic carrier wave having minus IF frequency.
Figure 26B:
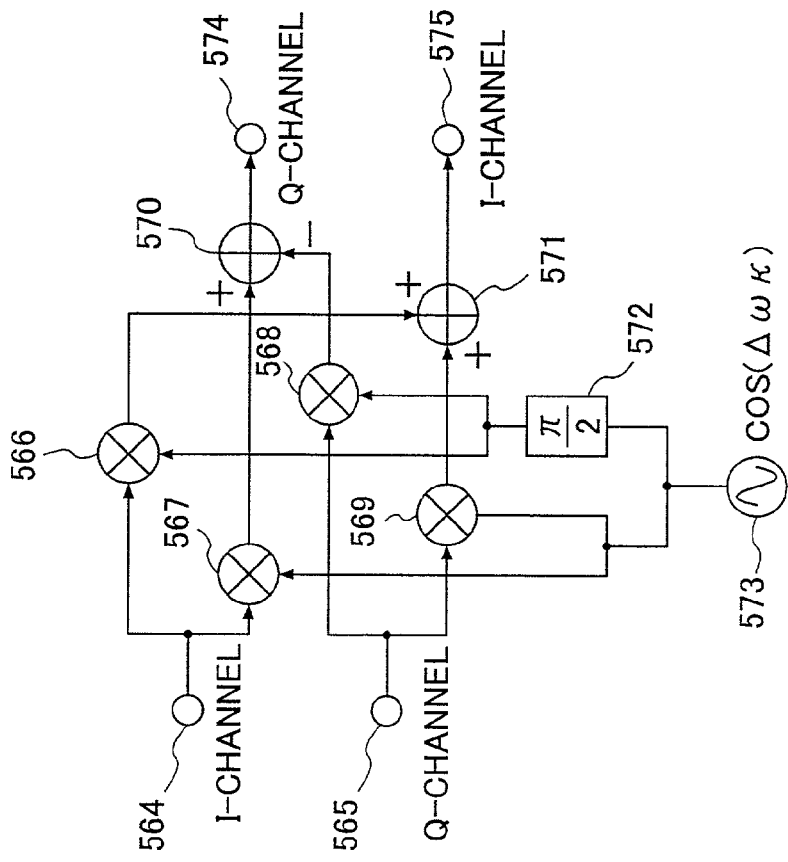
FIG. 26B shows a configuration of the complex frequency converter which multiplies by analytic carrier wave having plus IF frequency.

FIGS. 26A and 26B shows configurations of the complex frequency converter 543 of the embodiment 2-1.

The complex frequency converter 543 includes NCO (Numerically Controlled Oscillator) and a digital π/2 phase shifter in addition to the digital complex multiplier. FIG. 26A shows a configuration of the complex frequency converter which multiplies by analytic carrier wave having minus IF frequency band, and FIG. 26B shows a configuration of the complex frequency converter which multiplies by analytic carrier wave having plus IF frequency band. The complex frequency converter includes input terminals 564, 565, 576, 577, multipliers 566~569, 578~581, adders 571, 581, subtracters 570, 582, digital π/2 phase shifters 572, 583, NCOs 573, 584 and output terminals 574, 575, 585, 586.

Figure 27:
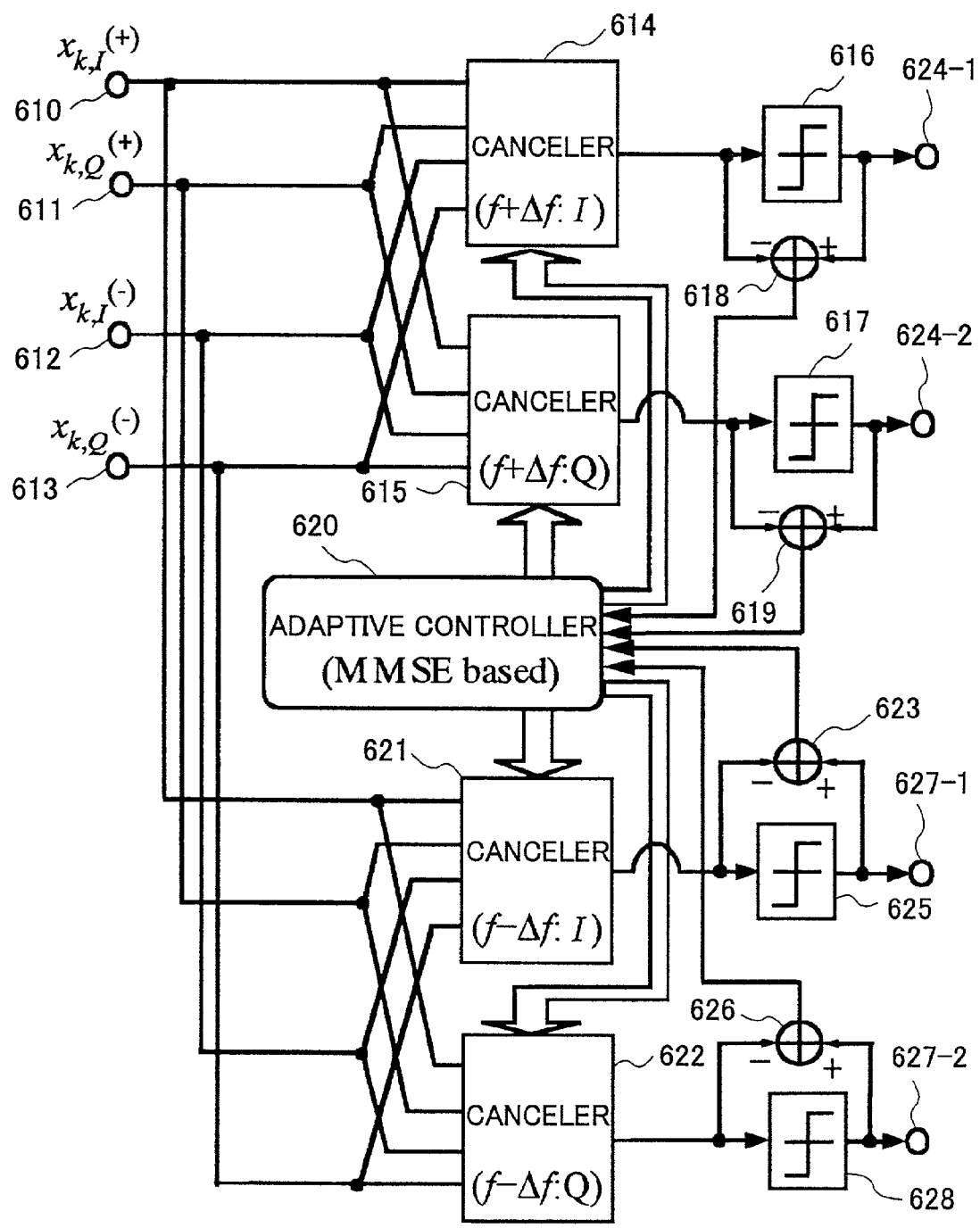
FIG. 27 shows a second configuration of the adaptive interference canceler according to the embodiment 2-1.

FIG. 27 shows a second configuration of the adaptive interference canceler according to the embodiment 2-1. The adaptive interference canceler of FIG. 27 includes slicers 616, 617, 623, 626, subtracters 618, 619, 613, 626, an adaptive controller 620, output terminals 624-1, 624-2, 627-1, 627-2.

The adaptive interference canceler outputs both signals of f+Δf band and f−Δf band. In order to perform this separation more reliably, slicers defined by equation (33) are included. Basically, four interference cancelers shown in FIG. 25 are provided. In this adaptive interference canceler, input signals are divided and input to the interference cancelers. Then, the signals are output via the slicers 616, 617, 623, 626. Differences between input and output for each slicer are obtained by the subtracter 618, 619, 613, 626. After that, coefficients necessary for the interference cancelers are estimated from the difference signals and input signals of the interference canceler by the adaptive controller 620.

In the configuration shown in FIG. 27, when assuming that $D_k = [d_{k,i}^{(+)}, d_{k,q}^{(+)}, d_{k,i}^{(-)}, d_{k,q}^{(-)}]^T$ is the output vector of the slicers 616, 617, 625, 628, and $Y_k = [y_{k,i}^{(+)}, y_{k,q}^{(+)}, y_{k,i}^{(-)}, y_{i,q}^{(-)}]^T$ is the output signal of the interference cancelers, control coefficients for each interference canceler represented as the following equation can be obtained by the algorithm of the equations (30.1)~(31.4).

$$W_k = \begin{bmatrix} w_{k,i,i(+)}^{(+)} & w_{k,i,q(+)}^{(+)} & w_{k,i,i(+)}^{(-)} & w_{k,i,q(+)}^{(-)} \\ w_{k,q,i(+)}^{(+)} & w_{k,q,q(+)}^{(+)} & w_{k,q,i(+)}^{(-)} & w_{k,q,i(+)}^{(-)} \\ w_{k,i,i(-)}^{(+)} & w_{k,i,q(-)}^{(+)} & w_{k,q,i(-)}^{(-)} & w_{k,i,q(-)}^{(-)} \\ w_{k,q,i(-)}^{(+)} & w_{k,q,q(-)}^{(+)} & w_{k,q,i(-)}^{(-)} & w_{k,q,i(-)}^{(-)} \end{bmatrix}^T \tag{34}$$

In the equation (34), $w^{(-)}_{k,i,q(+)}$ represents weighing coefficient for LPF which outputs I channel side signal of f−Δf band signal in the interference canceler which outputs Q channel signal in f+Δf band components. Therefore, the adaptive controller 620 calculates coefficients for each of the interference cancelers 614, 615, 621, 622 by using the algorithm of the equations (30.1)~(32.2) wherein the order of the input and output vectors is 4 and the coefficient matrix is expanded to 4×4.

Figure 28:
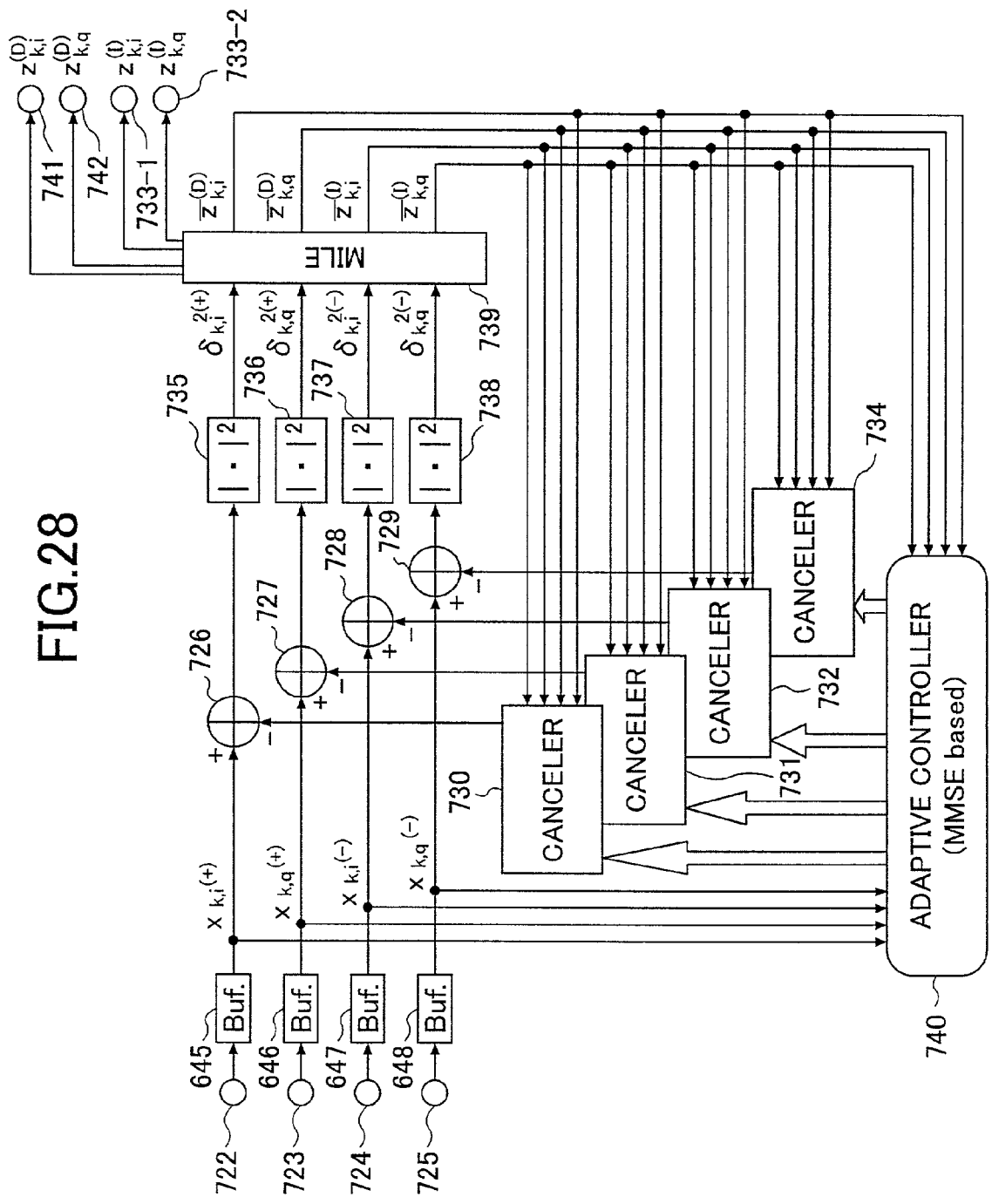
FIG. 28 shows a third configuration of the adaptive interference canceler according to the embodiment 2-1.

FIG. 28 shows a third configuration of the adaptive interference canceler according to the embodiment 2-1 of the present invention. The adaptive interference canceler includes input terminals 722~725, buffer memories 645~648, subtracters 726~729, the interference cancelers 730~732, 734 shown in FIG. 25, square circuits 735~738, a maximum likelihood sequence estimator 739, an adaptive controller 740 which estimates coefficients of the interference cancelers and terminals 741, 742, 733-1, 733-2 which output most likely judgement values, wherein the maximum likelihood sequence estimator 739 outputs every tentative decision value which has possibility of being sent by f+Δf carrier frequency band and f−Δf carrier frequency band and outputs most likely tentative decision value in the tentative decision values.

According to the above configuration, all signals which have possibility of being sent in a system supporting carrier frequency band f+Δf and carrier frequency band f−Δf are generated, and characteristics of the transmission line and the receiver are multiplied so that replica of the input signal is generated. Then, difference power between the generated replica and the received signal is calculated by the square circuits 735~738. Finally, the judgment value which minimizes the difference is output as the most likely signal.

Figure 29:
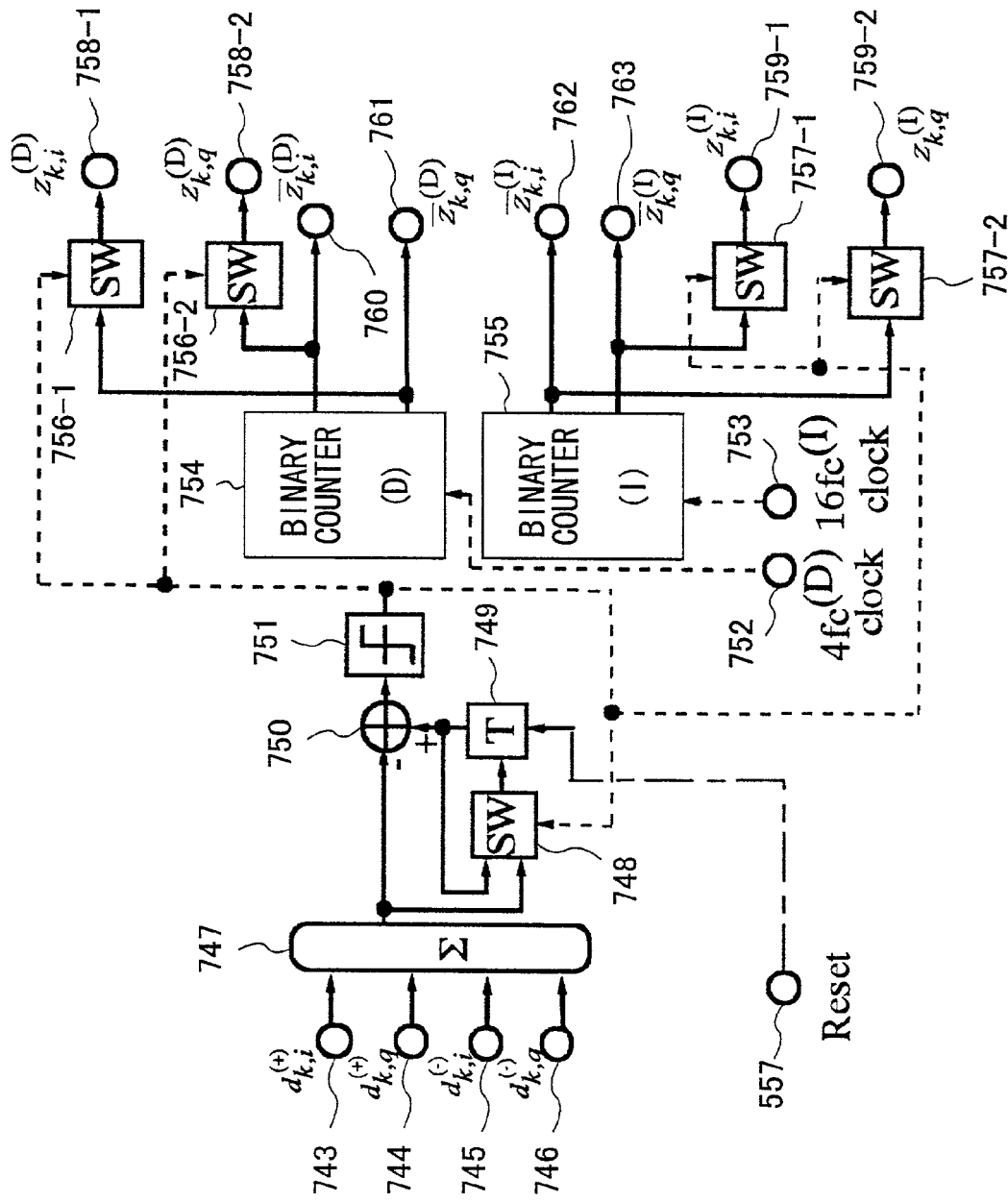
FIG. 29 shows an MLE circuit which is the maximum likelihood sequence estimator according to the embodiment 2-1.

FIG. 29 shows the MLE circuit which is the maximum likelihood sequence estimator 739 shown in FIG. 28. The MLE circuit shown in FIG. 29 is an example where channels of the same transmission rate are provided for the carrier frequency band f+Δf and the carrier frequency band f−Δf and the same QPSK modulation is applied.

The MLE circuit includes input terminals 743~746, a four input adder 747, switches 748, 756-1, 756-2, 757-1, 757-2, a delay element 749, a subtracter 750, a slicer 751, a reset signal input terminal 557, terminals 752, 753 which input clocks of four times and 16 times of the symbol rate, binary counters 754, 755, terminals 758-1, 758-2, 759-1, 759-2 which output most likely signal set, terminals 760~763 which output tentative decision value.

When a signal is input to the adaptive interference canceler, the MLE circuit shown in FIG. 29 generates, by the binary counters 754 and 755, every signal pattern which can be sent by the channels of the carrier frequency band f+Δf and the carrier frequency band f−Δf until next signal is input, and the patterns are output from the terminals 760~763 as the tentative decision values.

The adaptive interference canceler shown in FIG. 28 generates the replicas corresponding to each tentative decision value, then, detects difference power between each replica and the receive signal. This difference power is input from the terminals 743~746. According to the switch 748, the delay element 749, the subtracter 750 and the slicer 751, when the input difference power is smaller than previously input difference power, the input difference power is held. However, the difference power value is reset every time when signals are input to the adaptive interference canceler and a maximum value is set. Every time a value smaller than the held value is input, the provisional judgement value at the time is selected by the switch 748 and stored. After every tentative decision value is output, a tentative decision value corresponding to the smallest difference power is kept as the output of the switch and the value is output as the most likely signal.

In the adaptive interference canceler shown in FIG. 28, following output vector can be obtained from each canceler.

$$\overline{X}_k \equiv \begin{bmatrix} \overline{x}_{k,i}^{(+)} \\ \overline{x}_{k,q}^{(+)} \\ \overline{x}_{k,i}^{(-)} \\ \overline{x}_{k,q}^{(-)} \end{bmatrix} = W_k^T \overline{Z}_k \qquad (35)$$

wherein $$\overline{Z}_k = [\overline{z}_{k,i}^{(D)} \overline{z}_{k,q}^{(D)} \overline{z}_{k,i}^{(I)} \overline{z}_{k,q}^{(I)}]^T$$

is the tentative decision value output from the maximum likelihood sequence estimator 739, the coefficient $W_k$ can be defined as follows in the same way as the equation (34).

$$W_k = \begin{bmatrix} w_{k,i,i(+)}^{(D)} & w_{k,i,q(+)}^{(D)} & w_{k,i,i(+)}^{(I)} & w_{k,i,q(+)}^{(I)} \\ w_{k,q,i(+)}^{(D)} & w_{k,q,q(+)}^{(D)} & w_{k,q,i(+)}^{(I)} & w_{k,q,i(+)}^{(I)} \\ w_{k,i,i(-)}^{(D)} & w_{k,i,q(-)}^{(D)} & w_{k,q,i(-)}^{(I)} & w_{k,i,q(-)}^{(I)} \\ w_{k,q,i(-)}^{(D)} & w_{k,q,q(-)}^{(D)} & w_{k,q,i(-)}^{(I)} & w_{k,q,i(-)}^{(I)} \end{bmatrix}^T \qquad (36)$$

In the equation, $w^{(I)}_{k,i,q(+)}$ indicates weighing coefficient for the tentative decision value of the I channel in the send signal of the carrier frequency band f−Δf in the interference canceler which outputs estimation value of Q channel signal in the signal of carrier frequency band f+Δf.

The adaptive controller 740 performs following operation for obtaining difference vector Δk for output signal of the equation (35).

$$\Delta_k = \begin{bmatrix} \delta_{k,i}^{(+)} \\ \delta_{k,q}^{(+)} \\ \delta_{k,i}^{(-)} \\ \delta_{k,q}^{(-)} \end{bmatrix} = X_k - \overline{X}_k = X_k - W_k^T \overline{Z}_k \qquad (37)$$

The adaptive control part 740 performs operation such that norm of the difference vector of (37) is minimized. As for the algorithm for adaptive control, almost all algorithms used for adaptive equalizers and adaptive arrays can be used. When using the LMS algorithm, the adaptive controller calculates the following coefficient updating equation in addition to the equation (37).

$$W_k = W_{k-1} + \mu \overline{Z}_k \Delta_k^T \qquad (38)$$

In addition, when using the RLS algorithm which is famous like the LMS, the adaptive controller calculates the following coefficient updating equations in addition to the equation (37).

$$K_k = \frac{P_{k-1} \overline{Z}_k}{\lambda + \overline{Z}_k^T P_{k-1} \overline{Z}_k} \qquad (39.1)$$

$$W_k = W_{k-1} + K_k \Delta_k^T \qquad (39.2)$$

$$P_k = \lambda^{-1}(P_{k-1} - K_k \overline{Z}_k^T P_{k-1}) \qquad (39.3)$$

Figure 30:
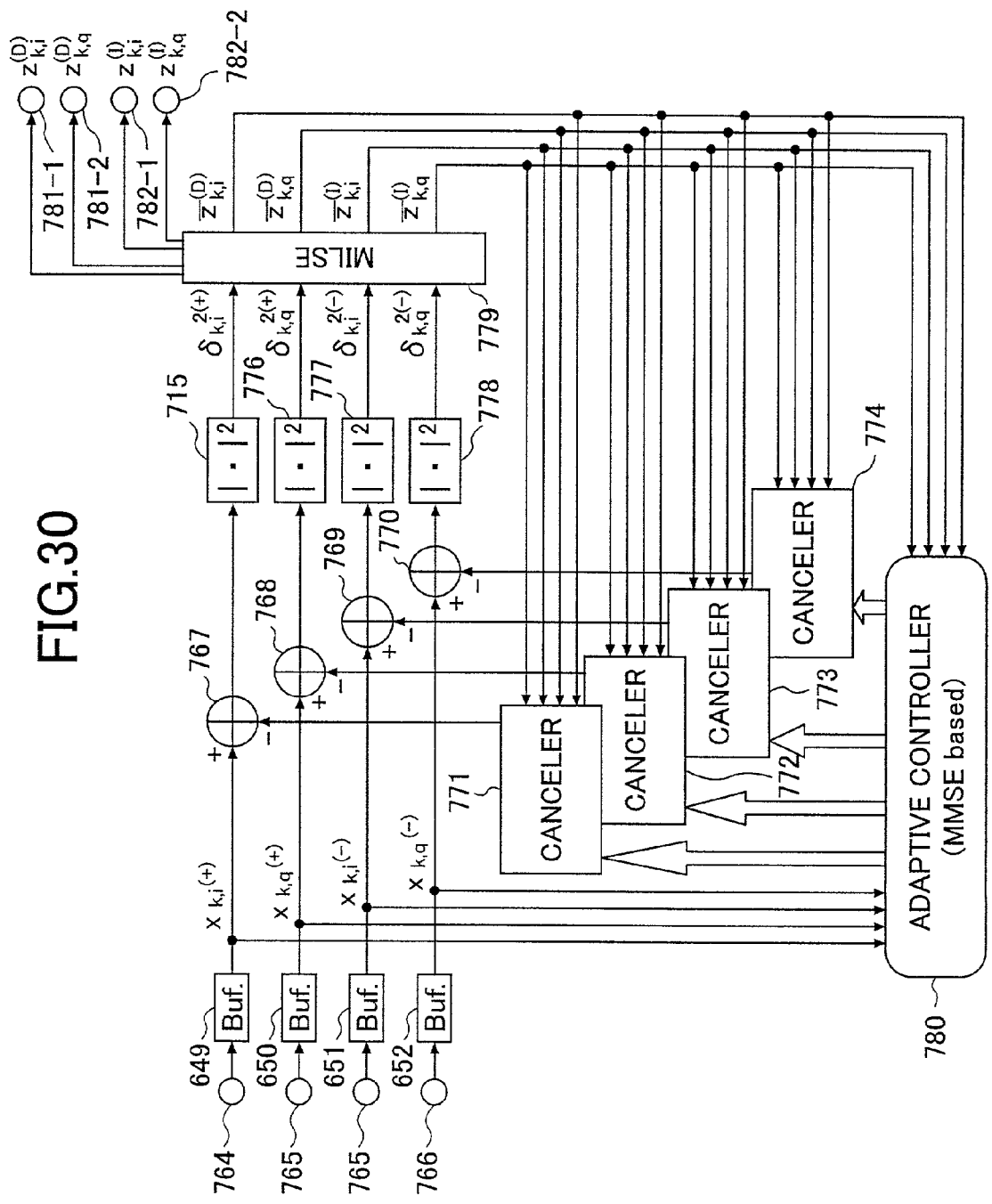
FIG. 30 shows a fourth configuration of the adaptive interference canceler according to the embodiment 2-1.

FIG. 30 shows a fourth configuration of the adaptive interference canceler according to the embodiment 2-1 of the present invention. The adaptive interference canceler shown in the figure is different from that shown in FIG. 28 in that signal rate of the carrier frequency band f+Δf is different from that of the carrier frequency band f−Δf.

The adaptive interference canceler includes input terminals 764~766, buffer memories 649~652, subtracters 767~770, the interference cancelers 771~774 shown in FIG. 25, square circuits 775~778, a maximum likelihood sequence estimator 779, an adaptive controller 780 which estimates coefficients of the interference cancelers and terminals 781-1, 781-2, 782-1, 782-2 which output most likely judgement series, wherein the maximum likelihood sequence estimator 779 outputs every tentative decision series which has possibility of being sent by f+Δf carrier frequency band and f−Δf carrier frequency band and outputs most likely tentative decision series in the tentative decision values.

According to the above configuration, all signal series in f+Δf band and f−Δf band which have possibility of being sent in a period are generated, and most likely series among the all series which is most likely sent is output from the output terminals 781-1, 781-2, 782-1, 782-2.

Figure 31:
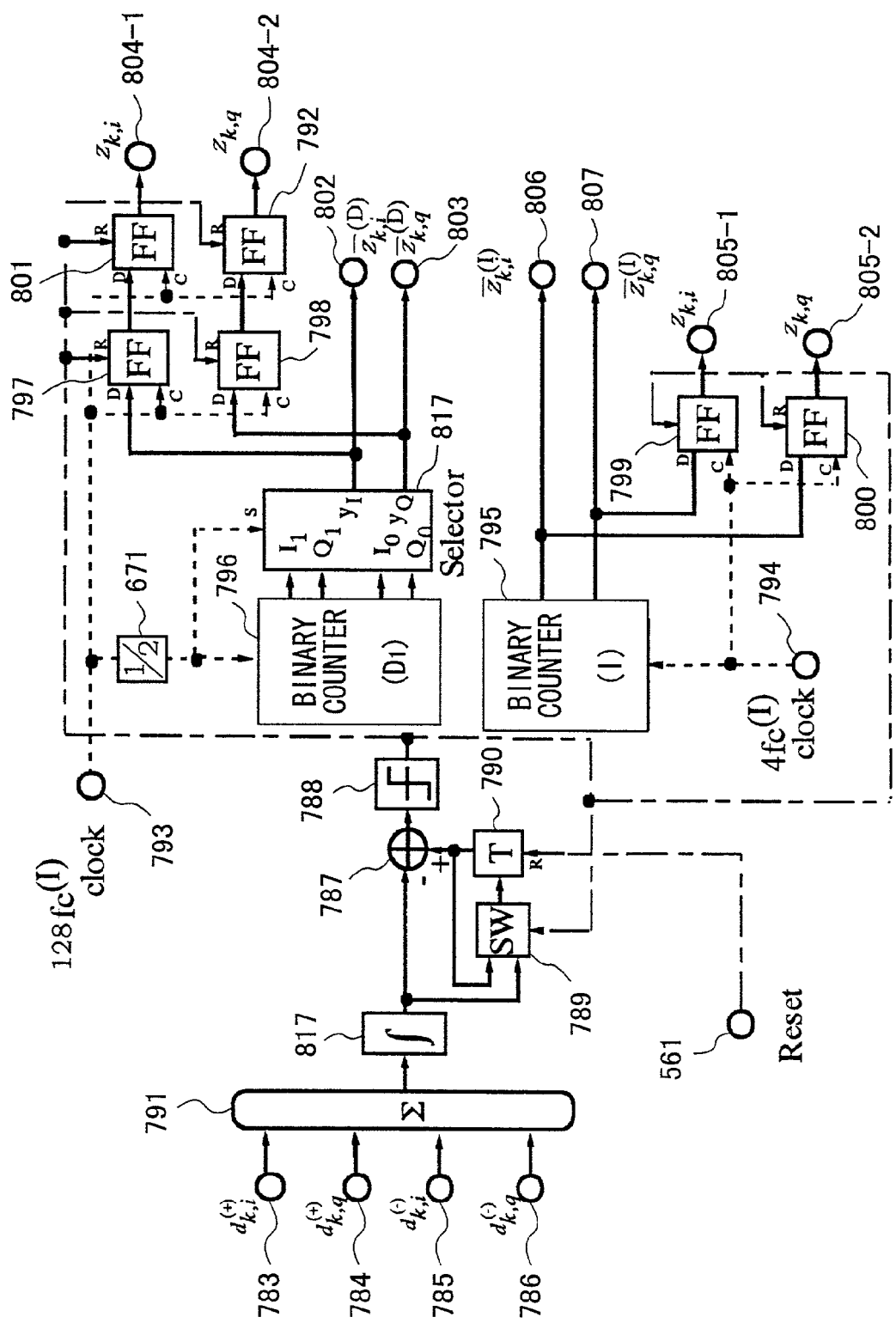
FIG. 31 shows a first configuration of the MLSE circuit according to the embodiment 2-1.

FIG. 31 shows a first configuration of the MLSE circuit according to the embodiment 2-1. This is an example of the maximum likelihood sequence estimator 779 shown in FIG. 30. In this example, the same QPSK modulation method is used by f+Δf band and f−Δf band signals, and the signal transmission rate of the f+Δf band is twice as fast as that of the f−Δf band.

The MLSE circuit shown in FIG. 31 includes input terminals 783~786, a four input adder 791, an integrator 817, a subtracter 787, a switch 789, 1 delay element 790, a slicer 788, a clock input terminal 794 having clock rate four times faster than that of the symbol rate $fc^{(I)}$ of the f−Δf band signal, a clock input terminal 793 having clock rate 128 times faster than that of the symbol rate $fc^{(I)}$ of the f−Δf band signal, binary counters 795, 796, a selector 817, D type flip-flops 792, 797~801, tentative decision value output terminals 802, 803, 806, 807, output terminals 804-1, 804-2, 805-1, 805-2 which output maximum likely series, a delay circuit 790 which synchronizes with symbol clock of the f−Δf band signal, an ½ frequency divider 671, a signal input terminal 561 which resets the delay element 790.

According to this configuration the binary counters 796, 795 generate tentative decision values of the f+Δf band signal and f−Δf band signal respectively. The binary counter 795 outputs two bit data. The binary counter 796 outputs four bit data in which each of higher two bits and lower two bits is multiplexed. Then, terminals 806, 807, 802, 803 outputs the counter data.

In the same way as shown in FIG. 28, difference power values are generated and input into the input terminals 783~786. The input difference power values are integrated for a time $64/fc^{(f)}$ by the integrator 818, and the integrated value is input to a minimum value selection circuit which includes the subtracter 787, the slicer 788, the switch 789, the delay circuit 790. Then, the D type flip-flop holds tentative decision values corresponding to the minimum value and the tentative decision values are output from the terminals 804-1, 804-2, 805-1, 805-2.

The adaptive controller 780 in the configuration of FIG. 30 performs operation of the equations (35)~(39.3) by using signal set output from the maximum likelihood sequence estimator. The symbol rate output from the f+Δf band signal is twice as that of the f−Δf band signal. Thus, coefficients are controlled by selecting a symbol of the f+Δf band signal which is closer to sampling timing of the f−Δf band signal.

Figure 32:
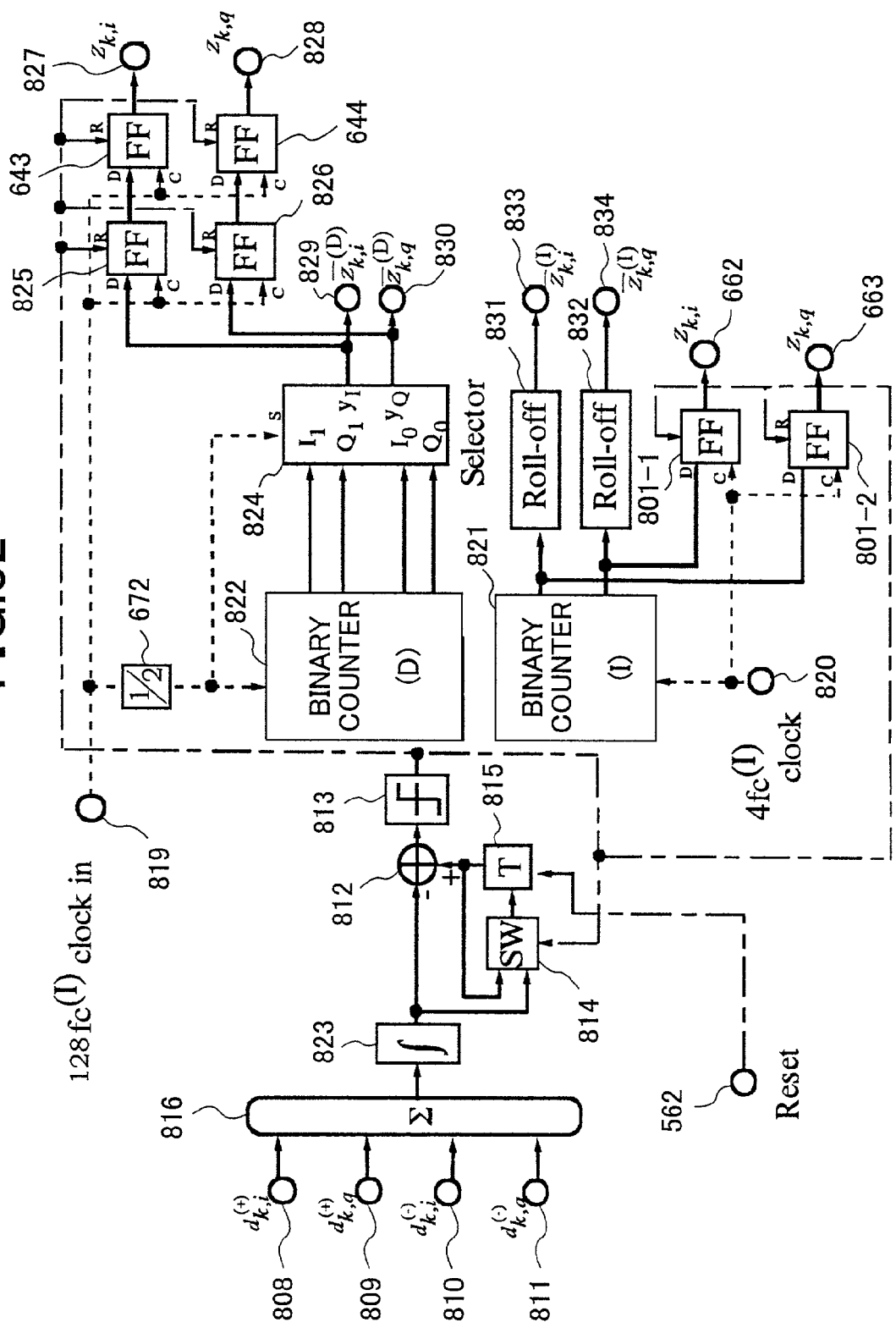
FIG. 32 shows a second configuration of the MLSE circuit of the embodiment 2-1.

FIG. 32 shows the second configuration of the MLSE circuit of the embodiment 2-1. Same as the configuration shown in FIG. 31, the same QPSK modulation method is used by f+Δf band and f−Δf band signals, and the signal transmission rate of the f+Δf band is twice as fast as that of the f−Δf band.

The MLSE circuit shown in FIG. 32 includes input terminals 808~811, a four input adder 816, an integrator 823, a subtracter 812, a switch 814, a delay element 815, a slicer 813, a clock input terminal 820 having clock rate four times faster than that of the symbol rate $fc^{(f)}$ of the f−Δf band signal, a clock input terminal 819 having clock rate 128 times faster than that of the symbol rate $fc^{(f)}$ of the f−Δf band signal, binary counters 821, 822, a selector 824, D type flip-flops 825, 826, 643, a ½ frequency divider 672, tentative decision value output terminals 829, 830, 833, 834, output terminals 827, 828, 662, 663 which output maximum likely series, an input terminal 562 which inputs a signal which rests the delay circuit 815 while synchronizing with symbol clock $fc^{(f)}$ of the f−Δf band signal, low-pass filters 831, 832.

According to the MLSE circuit of FIG. 32, in addition to the operations of the circuit shown in FIG. 31, output of the f−Δf band signal from the binary counter is sampled by the output rate of the selector 824, and is output from the terminals 833, 834 via the low-pass filters 833, 834. In this configuration, since the replica is generated by using the band-pass filters for receiving and transmitting, estimation can be performed accurately.

When using the MLSE circuit shown in FIG. 32, the above-mentioned adaptive controller can also be used.

Figure 33:
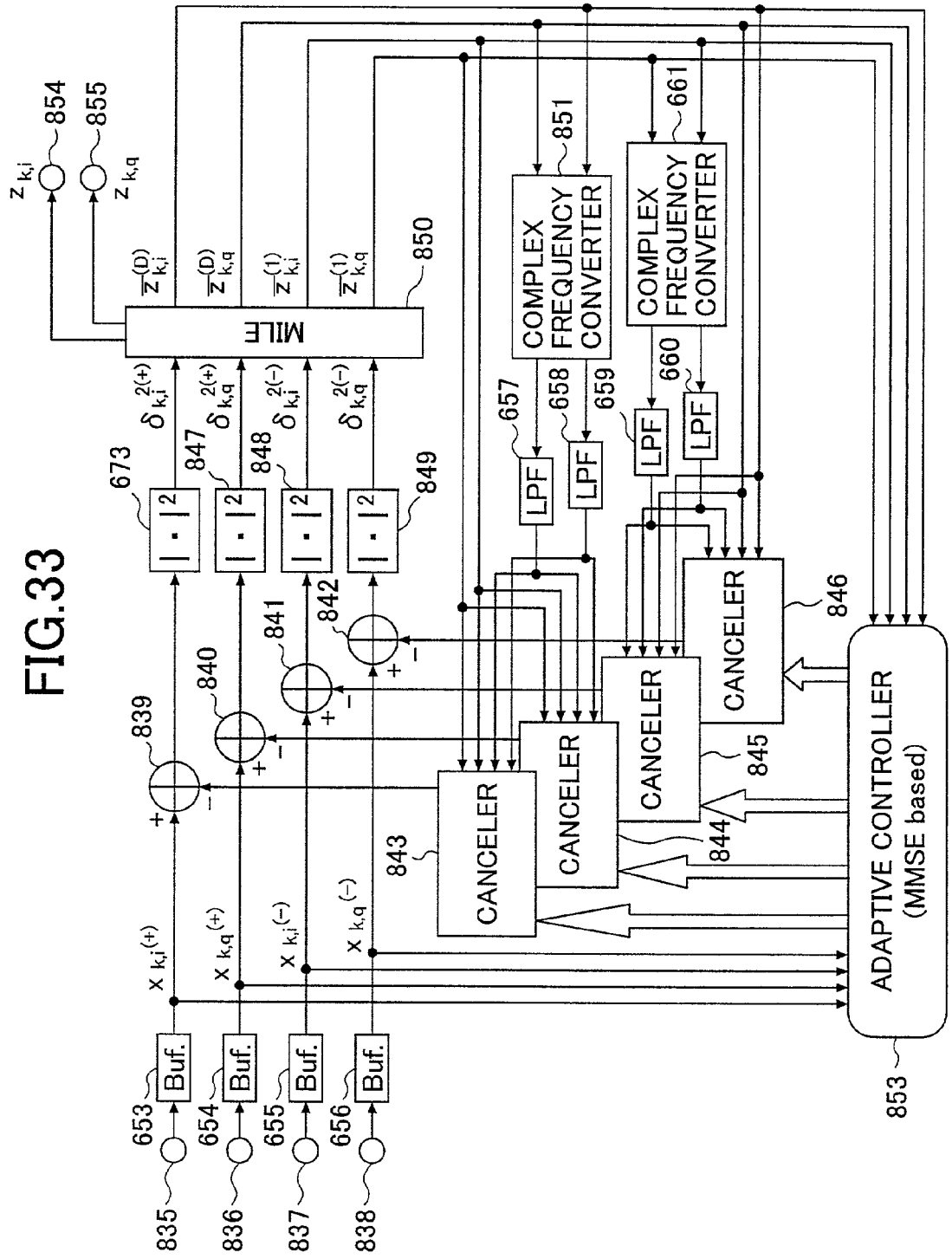
FIG. 33 shows a fifth configuration of the adaptive interference canceler of the embodiment 2-1.

FIG. 33 shows a fifth configuration of the adaptive interference canceler of the embodiment 2-1. This configuration is suitable when f+Δf1 band signal and f−Δf2 band signal are not symmetric with respect to the local oscillation frequency f.

The adaptive interference canceler includes input terminals 835~838, buffer memories 653~656 which temporarily stores input signal, subtracters 839~842, the interference cancelers 843~846 shown in FIG. 25, square circuits 673, 847~849, a maximum likelihood sequence estimator 850, complex frequency converters 851, 661 shown in FIG. 26, an adaptive controller 853 which estimates coefficients of the interference cancelers and terminals 854, 855, which output maximum likely judgement values, wherein the maximum likelihood sequence estimator 850 outputs every tentative decision series which has possibility of being sent by f+Δf1 carrier frequency band and f−Δf2 carrier frequency band and outputs most likely tentative decision series in the tentative decision values.

In this configuration, it is assumed that oscillation frequencies of the complex frequency converters shown in FIG. 23 are −Δf1 and +Δf2 respectively. At this time, the low-pass filters 657~660 are the same as those shown in FIG. 23. In addition, the complex frequency converter 851 converts frequency band of the input signal as Δf2−Δf1, and the complex frequency converter 661 converts frequency band of the input signal as Δf1−Δf2.

According to the configuration shown in FIG. 33, adaptive control and maximum likely series estimation are performed, like the configuration shown in FIG. 30. However, in this case, the f+Δf1 band signal and the f−Δf2 band signal are converted into different IF frequency bands by the analog quasi-coherent detector. Therefore, carriers of the IF frequency differences are generated in the complex frequency converters 851, 661. Then, the part, which corresponds to overlapped part, is extracted by the low-pass filters 657~660. The extracted signal is input to the cancelers as the interference components. In the interference canceler, input signal is estimated on the basis of the overlapped interference components and the estimation value of the main signal.

In the adaptive control part, LMS or RLS algorithm described by the equations (37)~(39.3) can be applied by using the overlapped interference signal components and the main signal components. In addition, in the adaptive interference canceler shown in FIG. 33, since the transmission rates of the signals of the bands are the same, the maximum likely signal estimation circuit shown in FIG. 29 can be used. When the transmission rates are not the same, the maximum likely series estimation circuit shown in FIG. 31 or 32 can be used.

Figure 34:
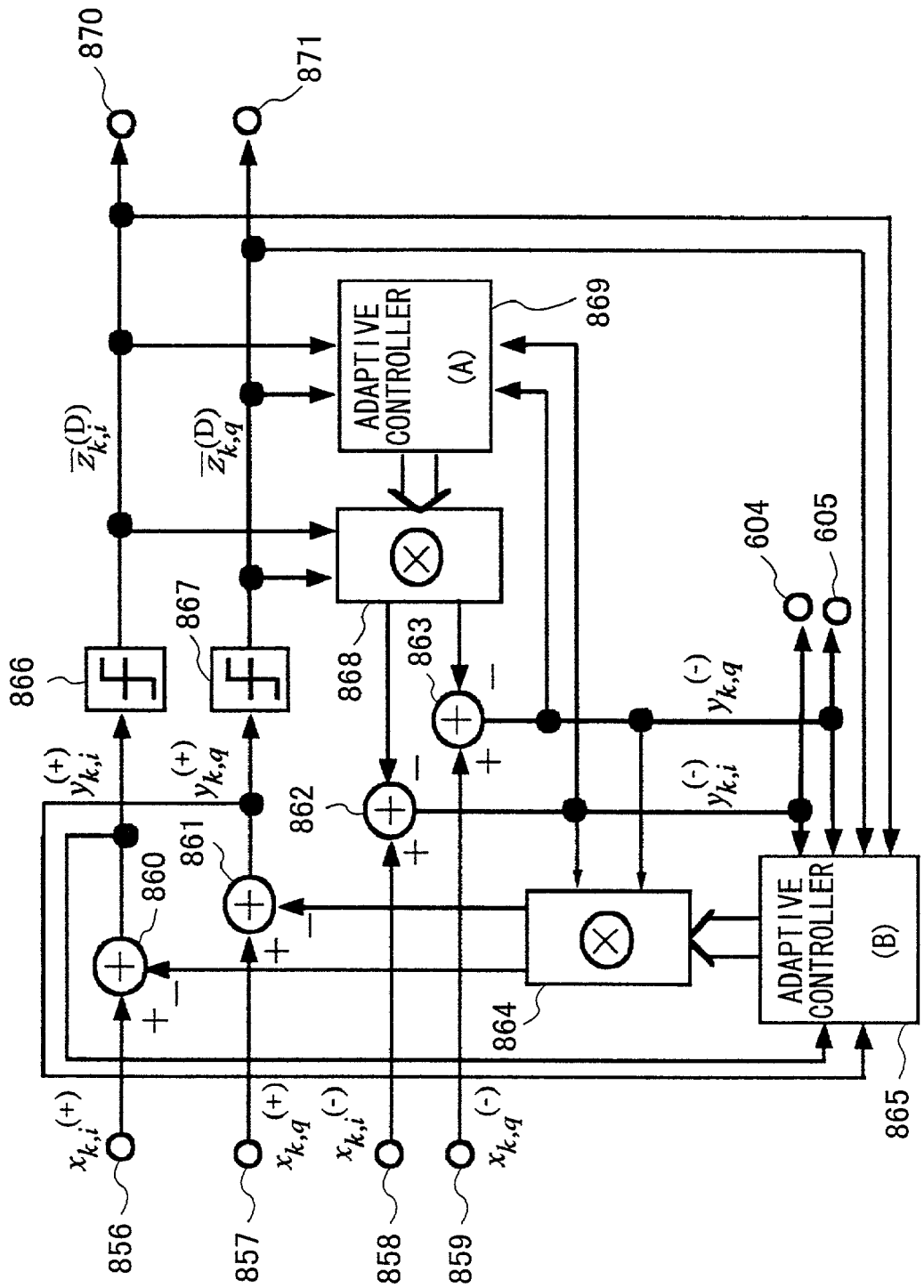
FIG. 34 shows a sixth configuration of the adaptive interference canceler of the embodiment 2-1.

FIG. 34 shows a sixth configuration of the adaptive interference canceler of the embodiment 2-1. The adaptive interference canceler includes input terminals 856~859, subtracters 860~863, slicers 866, 867, matrix multiplier 864, 868, adaptive controller 865, 869, signal output terminals 870, 871, 604, 605.

In this configuration, interference components included in signals from terminals for f+Δf band desired signal are removed in the subtracters 860, 861. As a result, only f+Δf band signal components input to the slicers 866, 867. Then, the slicers output judgment results as the f+Δf band signals. The adaptive controller 869 estimates components of the f+Δf band signal included in signals from the terminals for desired signal of f−Δf band. The f+Δf band components are removed by the subtracters 862, 863 so that f−Δf band signal which does not include interference components can be obtained. The adaptive controller 865 estimates components of the f−Δf band signal included in signals from the terminals for desired signal of f+Δf band. The components are generated by the matrix multiplier 864 and output to the subtracters 860, 861. In addition, the f−Δf band signals which do not include interference components are output from the output terminals 604, 605.

That is, when the output of the subtracters is represented by a vector as $y_k^{(+)}=[y_{k,i}^{(+)}, y_{k,q}^{(+)}]^T$, it can be rewritten as follows $$y_k = x_k^{(+)} - \epsilon_k^{(+)} \tag{40}$$

In the equation, $\epsilon_k^{(+)}=[\epsilon_{k,i}^{(+)}, \epsilon_{k,q}^{(+)}]^T$, which is the output of the matrix multiplexer 864, represents f−Δf band signal components included in $x_k^{(+)}$. When $y_k$ is input to the slicers 866, 867, the output can be represented by $\bar{z}_k^{(D)}=[\bar{z}_{k,i}^{(D)}\ \bar{z}_{k,q}^{(D)}]^T$. Then, the output $y_k^{(+)}=[y_{k,i}^{(+)},y_{k,q}^{(+)}]^T$ of the subtracters 862, 863 can be represented as follows.

$$y_k^{(-)}=x_k^{(-)}-W_k^{(1)}\bar{z}_k^{(D)} \quad (41)$$

In the equation, matrix $W_k^{(1)}=\{w_{k,i,j}^{(+)}; i,j=1,2\}$ can be estimated by the adaptive controller 864. By the same matrix operation, $\epsilon_k^{(+)}$ can be represented as $$\epsilon_k^{(+)}=W_k^{(2)}\bar{y}_k^{(-)} \quad (42).$$

In the equation, matrix $W_k^{(1)}=\{w_{k,i,j}^{(+)}; i,j=1,2\}$ can be estimated by the adaptive controller 864.

The coefficient $W_k^{(1)}$ in the adaptive controller 869 can be obtained by (α) correlational operation or (β) least-squares operation. In the case of (α), the coefficient can be represented as follows.

$$W_k^{(1)} = E\left[(x_{k,i}^{(-)} x_{k,q}^{(-)})\begin{pmatrix} z_{k,i}^{(D)} \\ z_{k,q}^{(D)} \end{pmatrix}\right] = (1-\mu)W_{k-1}^{(1)} + \mu(x_{k,i}^{(-)} x_{k,q}^{(-)})\begin{pmatrix} z_{k,i}^{(D)} \\ z_{k,q}^{(D)} \end{pmatrix} \quad (43)$$

In the case of (β), the coefficient can be represented as follows.

$$W_k^{(1)} = W_{k-1}^{(1)} + \mu(y_{k,i}^{(-)} y_{k,q}^{(-)})\begin{pmatrix} z_{k,i}^{(D)} \\ z_{k,q}^{(D)} \end{pmatrix} \quad (44)$$

In the adaptive controller 864, the methods (α) and (β) can also be used. That is, in the case of (α), the following equation can be used.

$$W_k^{(2)} = (1-\mu)W_{k-1}^{(2)} + \mu\left(x_{k,i}^{(+)}\ x_{k,q}^{(+)}\right)\begin{pmatrix} y_{k,i}^{(-)} \\ y_{k,q}^{(-)} \end{pmatrix} \quad (45)$$

In the case of (β), the following updating equations can be used for estimation.

$$W_k^{(2)} = W_{k-1}^{(2)} + \mu\left(y_{k,i}^{(+)}\ y_{k,q}^{(+)}\right)\begin{pmatrix} y_{k,i}^{(-)} \\ y_{k,q}^{(-)} \end{pmatrix} \quad (46)$$

or $$W_k^{(2)} = W_{k-1}^{(2)} + \mu\left(y_{k,i}^{(+)} - \bar{z}_{k,i}^{(D)}\ y_{k,q}^{(+)} - \bar{z}_{k,q}^{(D)}\right)\begin{pmatrix} y_{k,i}^{(-)} \\ y_{k,q}^{(-)} \end{pmatrix} \quad (47)$$

In addition, if it is allowed that two more coefficients are included, accurate estimation can be realized by repeating the following operation.

$$W_k^{(2)} = W_{k-1}^{(2)} + \mu\left(y_{k,i}^{(+)} - g_{k,i}\bar{z}_{k,i}^{(D)}\ y_{k,q}^{(+)} - g_{k,q}\bar{z}_{k,q}^{(D)}\right)\begin{pmatrix} y_{k,i}^{(-)} \\ y_{k,q}^{(-)} \end{pmatrix} \quad (48.1)$$

$$\begin{pmatrix} g_{k,i} \\ g_{k,q} \end{pmatrix} = \begin{pmatrix} g_{k-1,i} \\ g_{k-1,q} \end{pmatrix} + \mu\left(y_{k,i}^{(+)} - g_{k,i}\bar{z}_{k,i}^{(D)}\ y_{k,q}^{(+)} - g_{k,q}\bar{z}_{k,q}^{(D)}\right)\begin{pmatrix} \bar{z}_{k,i}^{(D)} \\ \bar{z}_{k,q}^{(D)} \end{pmatrix} \quad (48.2)$$

Figure 35:
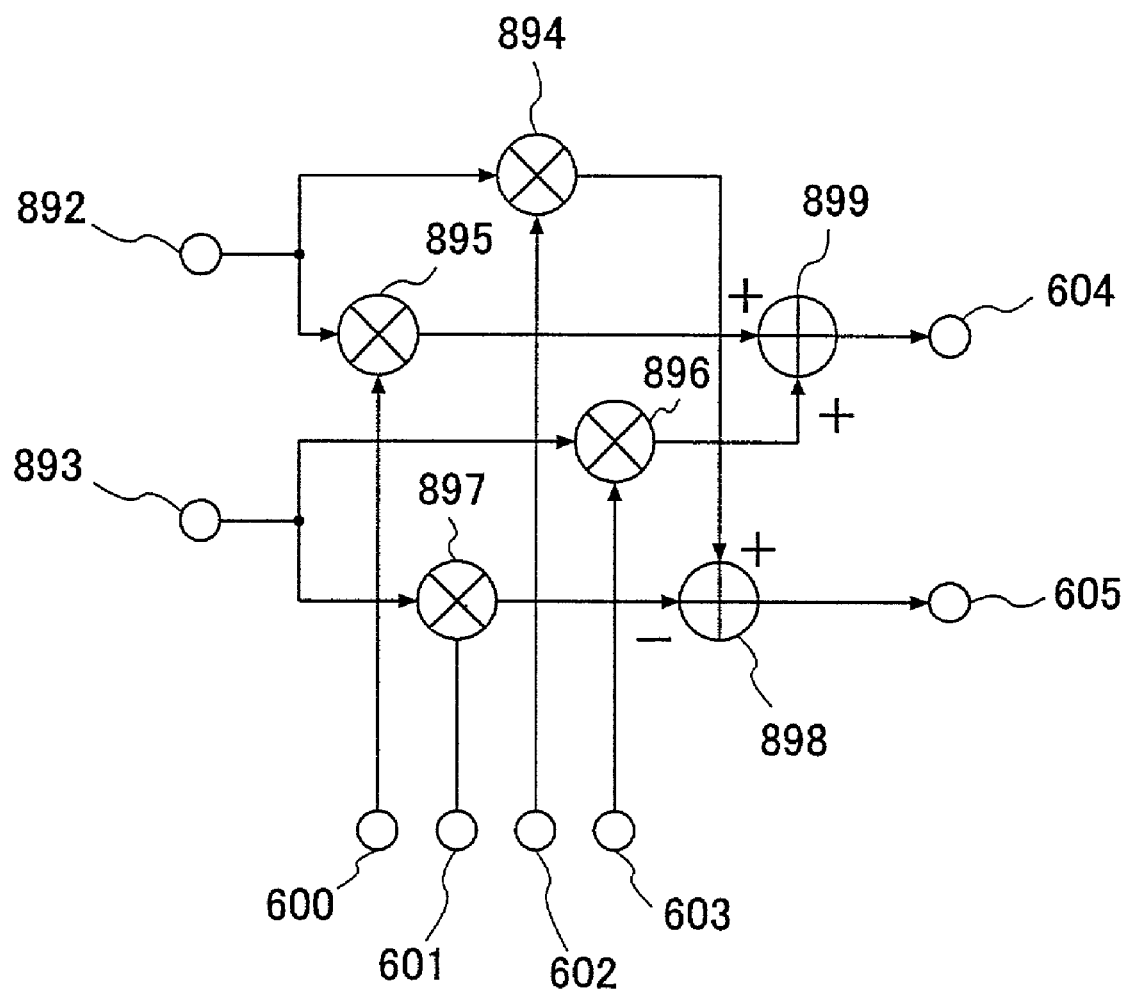
FIG. 35 shows a configuration of a matrix multiplier of the embodiment 2-1.

FIG. 35 shows a configuration of the matrix multiplier of the embodiment 2-1.

The matrix multiplier includes input terminals 892, 893, multipliers 894, 895, an adder 899, a subtracter 898, coefficient input terminals 600, 603, output terminals 604, 605.

Figure 36:
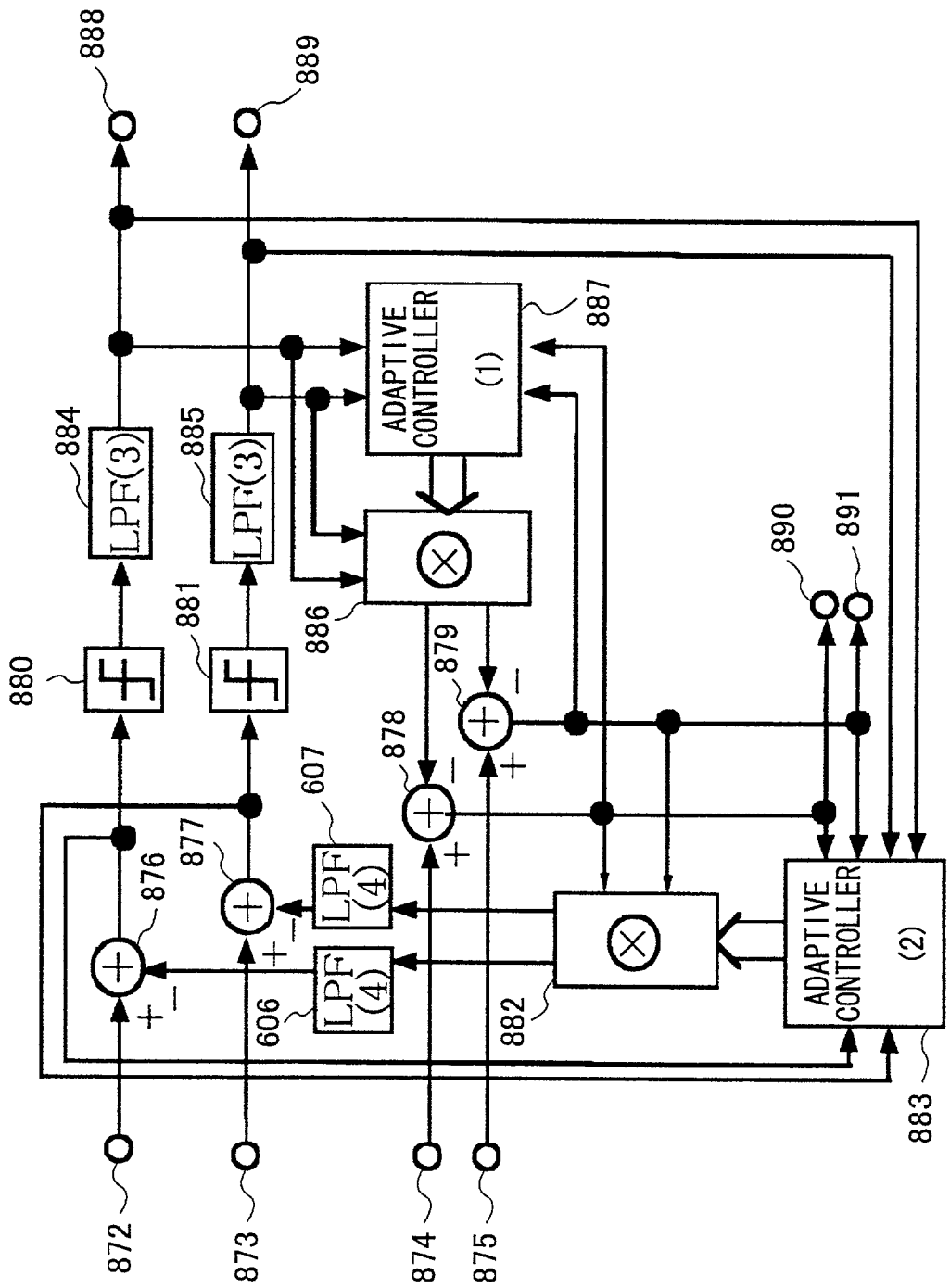
FIG. 36 shows a seventh configuration of the adaptive interference canceler of the embodiment 2-1.

FIG. 36 shows a seventh configuration of the adaptive interference canceler of the embodiment 2-1. The adaptive interference canceler includes input terminals 872, 875, subtracters 876~879, slicers 880, 881, matrix multipliers 886, 882, adaptive controller 887, 883, low-pass filters 884, 885, 606, 607, an f+Δf band signal output terminal 888 and f−Δf band signal output terminal 889.

This configuration is for the case when the signal bands of f+Δf band and f−Δf band are different and the low-pass filters 544~547 match with bands for each channel. When the band of the low-pass filters 544~547 are the same as f+Δf band for the purpose of outputting only f+Δf band signal as the desired signal, the low-pass filters 606, 607 become unnecessary. The updating equations used for the description of FIG. 34 can be used.

[Embodiment 2—2]

In this embodiment, in addition to the basic configuration, a detector is provided after the adaptive canceler.

Figure 37:
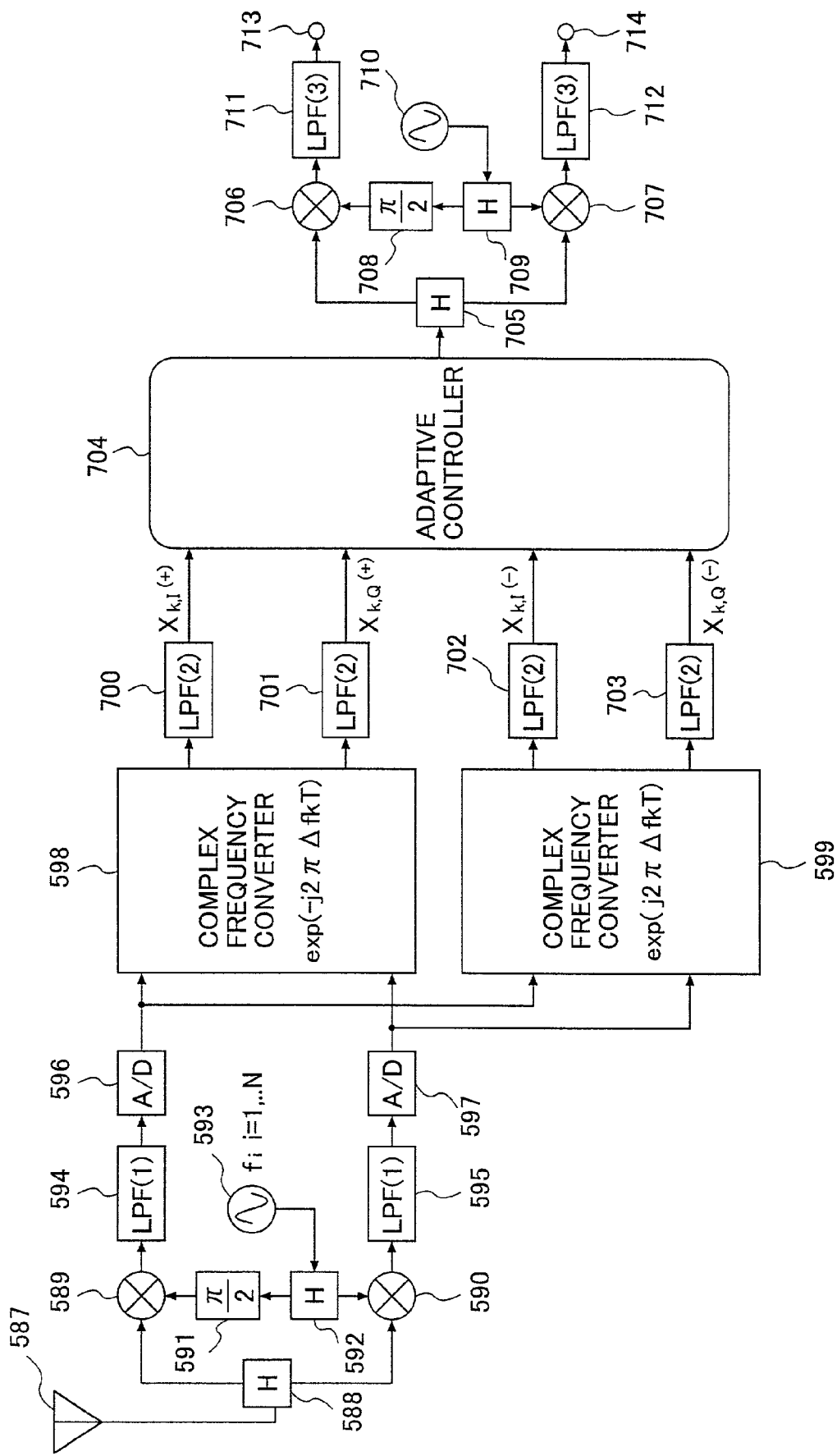
FIG. 37 shows a configuration of a receiver of an embodiment 2—2

FIG. 37 shows the configuration of the receiver of the embodiment 2—2.

The receiver includes an antenna 587, analog multipliers 589, 590, 706, 707, branch circuits 588, 592, 705, 709, π/2 phase shifters 591, 708, oscillators 593, 710, low-pass filters 594, 595, 700~703, 711, 712 analog/digital converters 596, 597, complex frequency converters 598, 599, an adaptive canceler 704 and output terminals 713, 714.

In the configuration, second IF of Δflow frequency band is provided under the IF stage of Δf. From the second IF, only desired wave is output. After that, the local oscillator performs quasi-coherent detection so that the desired signal can be obtained.

Figure 38:
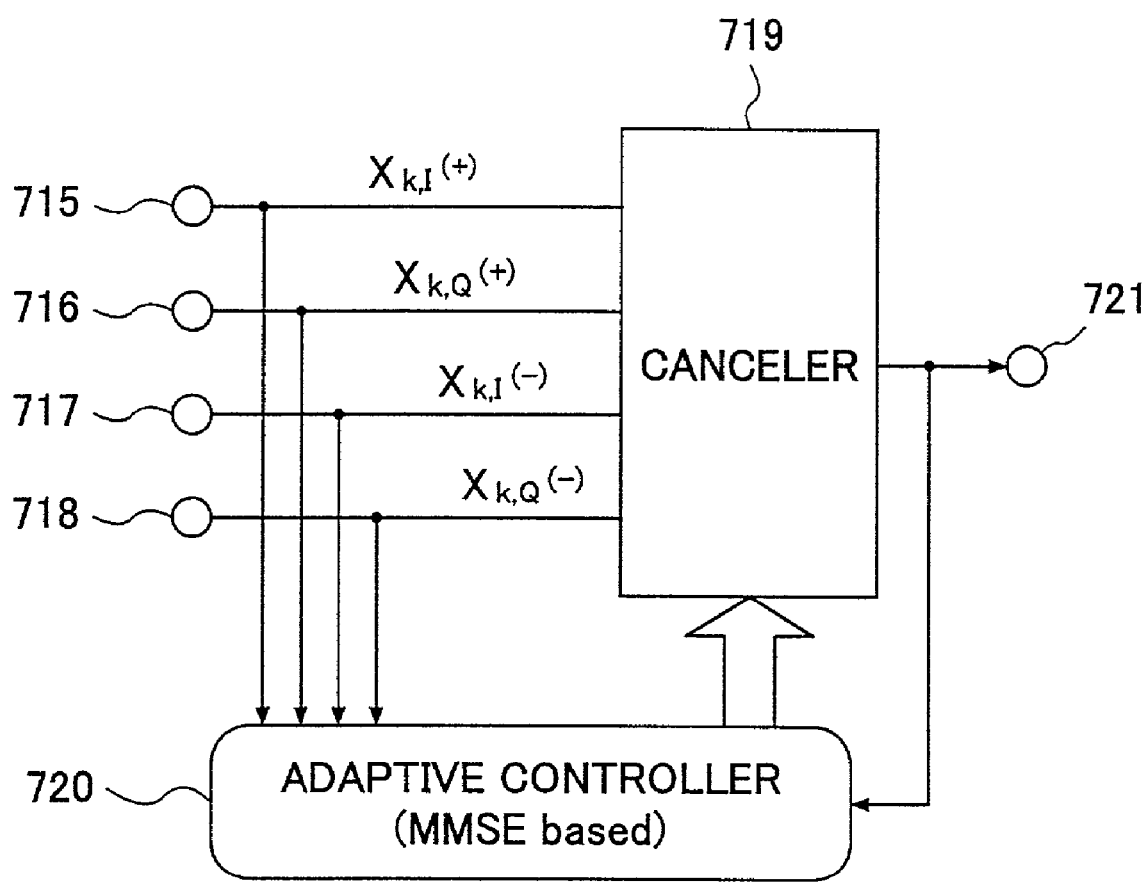
FIG. 38 shows a configuration of the adaptive interference canceler of the embodiment 2—2.

FIG. 38 shows the configuration of the adaptive interference canceler of the embodiment 2—2. The adaptive interference canceler includes input terminals 715~718, an interference canceler 719, an adaptive controller 720 and an output terminal 721. As the interference canceler, the circuit shown in FIG. 24 can be used. In addition, the interference canceler shown in FIG. 34 and FIG. 36 can be used. In the case of FIG. 34, one of the output terminals 604, 605 can be used. In the case of FIG. 36, one of the output terminals 890, 891 can be used.

As mentioned above, according to the present invention, interference between channels due to incompleteness of the analog quasi-coherent detector can be compensated by the adaptive interference canceler provided after the low-pass filter after complex frequency conversion by digital signal processing. Therefore, signals of various systems over a wide frequency band can be received in high quality.

In addition, on receiver can receive signals of a plurality of channels as necessary.

In addition, since the algorithm which realizes rapid convergence can be applied, there is an advantage in that signals sent intermittently like packets can be demodulated with high quality. Accordingly, since one receiver can receive signals of various systems simultaneously and with high quality, terminals and base stations can be highly advanced. Therefore, one kind of terminal and one kind of base station can deal with various services. Thus, immeasurable effect can be obtained in which product development can be decreased and a high-value-added terminal can be provided.

The present invention is not limited to the specifically disclosed embodiments, and variations and modifications may be made without departing from the scope of the invention.

What is claimed is:

1. A receive method in a communication system, comprising the steps of:
    receiving a signal of a carrier band;
    generating an in-phase signal and a quadrature signal from the signal received in the receiving step;
    compensating an orthogonality error and gain imbalance for said in-phase signal and said quadrature signal; and
    inputting said in-phase signal and said quadrature signal into a first complex frequency converter, and also inputting said in-phase signal and said quadrature signal into a second complex frequency converter, wherein the first complex frequency converter complex-multiplies said in-phase signal and said quadrature signal by a first analytic sine wave having a first frequency to generate a first complex frequency band signal, and the second complex frequency converter complex-multiplies said in-phase signal and said quadrature signal by a second analytic sine wave having a second frequency to generate a second complex frequency band signal.

2. The receive method as claimed in claim 1, said step of compensating an orthogonality error and gain imbalance comprising the steps of:
    dividing said quadrature signal into divided quadrature signals;
    assigning a weight to each of said divided quadrature signals;
    adding said in-phase signal to one of said divided quadrature signals.

3. The receive method as claimed in claim 1, said step of compensating an orthogonality error and gain imbalance comprising the steps of:
    assigning an weight to each of said quadrature signal and said in-phase signal; and
    adding said quadrature signal to said in-phase signal.

4. A receive method in a communication system, comprising the steps of:
    receiving a signal of a carrier band;
    generating a quadrature signal and an in-phase signal from said signal received in said receiving step;
    compensating an orthogonality error and gain imbalance for said in-phase signal and said quadrature signal; and
    converting said in-phase signal and said quadrature signal into a complex frequency band signal by an analytic sine wave, said analytic sine wave being a complex signal including a cosine wave as a real component and including a sine wave as an imaginary component,
    said step of compensating an orthogonality error and gain imbalance including the steps of
    dividing said quadrature signal into divided quadrature signals,
    assigning a weight to each of said divided quadrature signals,
    adding said in-phase signal to one of said divided quadrature signals, wherein
    the receiving step further including the steps of
    detecting a difference signal between said complex frequency band signal and a predetermined signal, and
    determining said weight according to said difference signal.

5. A receive method in a communication system, comprising the steps of:
    receiving a signal of a carrier band;
    generating a quadrature signal and an in-phase signal from said signal received in said receiving step;
    compensating an orthogonality error and gain imbalance for said in-phase signal and said quadrature signal; and
    converting said in-phase signal and said quadrature signal into a complex frequency band signal by an analytic sine wave, said analytic sine wave being a complex signal including a cosine wave as a real component and including a sine wave as an imaginary component,
    said step of compensating an orthogonality error and gain imbalance including the steps of,
    assigning a weight to each of said quadrature signal and said in-phase signal, and
    adding said quadrature signal to said in-phase signal, wherein
    the receiving step further including the steps of
    detecting a difference signal between said complex frequency band signal, and a predetermined signal;
    determining said weight according to said difference signal.

6. A receive method in a communication system, comprising the steps of:
    receiving a signal of a carrier band;
    generating a quadrature signal and an in-phase signal from said signal received in said receiving step;
    compensating an orthogonality error and gain imbalance for said in-phase signal and said quadrature signal; and
    converting said in-phase signal and said quadrature signal into a complex frequency band signal by an analytic sine wave, said analytic sine wave being a complex signal including a cosine wave as a real component and including a sine wave as an imaginary component,
    said step of compensating an orthogonality error and gain imbalance including the steps of
    dividing said quadrature signal into divided quadrature signals,
    assigning a weight to each of said divided quadrature signals,
    adding said in-phase signal to one of said divided quadrature signals, wherein
    the receiving step further comprising the steps of
    sampling said first complex frequency band signal at a symbol rate by using an adaptive digital filter to obtain a sampled signal,
    detecting a difference signal between a predetermined signal and said sampled signal, and
    determining said weight according to said difference signal, and controlling said adaptive digital filter such that said sampled signal becomes a predetermined sampling phase.

7. A receive method in a communication system, comprising the steps of:
receiving a signal of a carrier band;
generating a quadrature signal and an in-phase signal from said signal received in said receiving step;
compensating an orthogonality error and gain imbalance for said in-phase signal and said quadrature signal; and
converting said in-phase signal and said quadrature signal into a complex frequency band signal by an analytic sine wave, said analytic sine wave being a complex signal including a cosine wave as a real component and including a sine wave as an imaginary component,
said step of compensating an orthogonality error and gain imbalance including the steps of
assigning a weight to each of said quadrature signal and said in-phase signal, and
adding said quadrature phase signal to said in-phase signal,
the receiving step further including the steps of
sampling said first complex frequency band signal at an symbol rate by using an adaptive digital filter to obtain a sampled signal,
detecting a difference signal between a predetermined signal and said sampled signal, and
determining said weight according to said difference signal, and controlling said adaptive digital filter such that said sampled signal becomes a predetermined sampling phase.

8. A receive method in a communication system, comprising the steps of:
receiving a receive signal of a carrier band;
performing analog quasi-coherent detection on said signal receives in said receiving step and outputting in-phase and quadrature signals;
performing analog-to-digital conversion on said in-phase and quadrature signals;
inputting said in-phase signal and said quadrature signal into a first complex frequency converter, and also inputting said in-phase signal and said quadrature signal into a second complex frequency converter, wherein the first complex frequency converter complex-multiplies said in-phase signal and said quadrature signal by a first analytic sine wave having a first frequency to generate a first complex baseband signal, and the second complex frequency converter complex-multiplies said in-phase signal and said quadrature signal by a second analytic sine wave having a second frequency to generate a second complex baseband signal;
applying said first complex baseband signal to a first low-pass filter, and applying said second complex baseband signal to a second low-pass filter; and
applying said first complex baseband signal passed through said first low-pass filter and said second complex baseband signal passed through said second low-pass filter to an adaptive interference canceler so as to remove interference components included in said in-phase signal and said quadrature signal.

9. The receive method as claimed in claim 8, wherein said adaptive interference canceler separates desired frequency band components and interference signal components, by using orthogonalization coefficients, from an input signal in which said desired frequency band components and said interference signal components are mixed.

10. The receive method as claimed in claim 9, wherein said adaptive interference canceler estimates said orthogonalization coefficients according to changes of orthogonality in said analog quasi-coherent detection.

11. A receiver in a communication system, comprising:
a receiving part which receives a signal of a carrier band;
a generating part which generates an in-phase signal and a quadrature signal from said signal received by said receiving part;
a compensating part which compensates an orthogonality error and gain imbalance for said in-phase signal and said quadrature signal;
a first complex frequency converter which receives said in-phase signal and said quadrature signal; and
a second complex frequency converter which receives said in-phase signal and said quadrature signal,
wherein said first complex frequency converter complex-multiplies said in-phase signal and said quadrature signal by a first analytic sine wave having a first frequency to generate a first complex frequency band signal, and the second complex frequency converter complex-multiplies said in-phase signal and said quadrature signal by a second analytic sine wave having a second frequency to generate a second complex frequency band signal.

12. The receiver as claimed in claim 11, said compensating part comprising;
a dividing part which divides said quadrature signal into divided quadrature signals;
an assigning part which assigns a weight to each of said divided quadrature signals; and
an adding part which adds said in phase signal to one of said divided quadrature signals.

13. The receiver as claimed in claim 11, said compensating part comprising:
an assigning part which assigns a weight to each of said quadrature signal and said
in-phase signal; and
an adding part which adds said quadrature signal to said in-phase signal.

14. The receiver as claimed in claim 12, further comprising:
a detecting part which detects a difference signal between said first complex frequency band signal, and a predetermined signal; and
a determining part which determines said weight according to said difference signal.

15. The receiver as claimed in claim 13, further comprising:
a detecting part which detects a difference signal between said first complex frequency band signal and a predetermined signal; and
a determining part which determines said weight according to said difference signal.

16. The receiver as claimed in claim 12, further comprising:
a sampling part which produces a sampled signal by sampling said first complex frequency band signal at a symbol rate by using an adaptive digital filter to obtain a sampled signal;
a detecting part which detects a difference signal between a predetermined signal and the sampled signal; and
a determining part which determines said weight according to said difference signal, and controlling said adaptive digital filter such that said sampled signal becomes a predetermined sampling phase.

17. The receiver as claimed in claim 13, further comprising:
- a sampling part which produces a sampled signal by sampling said first complex frequency band signal at a symbol rate by using an adaptive digital filter to obtain a sampled signal;
- a detecting part which detects a difference signal between a predetermined signal and the sampled signal; and
- a determining part which determines said weight according to said difference signal, and controlling said adaptive digital filter such that said sampled signal becomes a predetermined sampling phase.

18. A receiver in a communication system, comprising:
- a receiving part which receives a signal of a carrier band;
- an analog quasi-coherent detector which performs analog quasi-coherent detection on said signal received by said receiving part and outputting in-phase and quadrature signals;
- an analog-to-digital converter which performs analog-to-digital conversion on said in-phase and quadrature signals;
- a first complex frequency converter which receives said in-phase signal and said quadrature signal; and
- a second complex frequency converter which receives said in-phase signal and said quadrature signal,
- wherein the first complex frequency converter complex-multiplies said in-phase signal and said quadrature signal by a first analytic sine wave having a first frequency to generate a first complex baseband signal, and the second complex frequency converter complex-multiplies said in-phase signal and said quadrature signal by a second analytic sine wave having a second frequency to generate a second complex baseband signal;
- a first low-pass filter which receives said first complex baseband signal;
- a second low-pass filter which receives said second complex baseband signal;
- an adaptive interference canceler which receives said first complex baseband signal passed through said first low-pass filter and said second complex baseband signal passed through said second low-pass filter so as to remove, interference components included in said in-phase signal and said quadrature signal.

19. The receiver as claimed in claim 18, said adaptive interference canceler including a part which separates predetermined frequency band components and interference signal components, by using orthogonalization coefficients, from an input signal in which said desired frequency band components and said interference signal components are mixed.

20. The receiver as claimed in claim 19, said adaptive interference canceler including an adaptive controller which estimates said orthogonalization coefficients according to changes of orthogonality in said analog quasi-coherent detector.

* * * * *